(12) United States Patent
Kalcher et al.

(10) Patent No.: US 11,323,102 B2
(45) Date of Patent: May 3, 2022

(54) MULTIPHASE SIGNAL GENERATORS, FREQUENCY MULTIPLIERS, MIXED SIGNAL CIRCUITS, AND METHODS FOR GENERATING PHASE SHIFTED SIGNALS

(71) Applicant: Intel IP Corporation, Santa Clara, CA (US)

(72) Inventors: Michael Kalcher, Graz (AT); Daniel Gruber, St. Andrä (AT); Francesco Conzatti, Villach (AT); Patrizia Greco, Villach (AT)

(73) Assignee: Intel IP Corporation, Santa Clara, CA (US)

( * ) Notice: Subject to any disclaimer, the term of this patent is extended or adjusted under 35 U.S.C. 154(b) by 311 days.

(21) Appl. No.: 16/474,564

(22) PCT Filed: Mar. 29, 2017

(86) PCT No.: PCT/US2017/024659
§ 371 (c)(1),
(2) Date: Jun. 28, 2019

(87) PCT Pub. No.: WO2018/182585
PCT Pub. Date: Oct. 4, 2018

(65) Prior Publication Data
US 2021/0281253 A1 Sep. 9, 2021

(51) Int. Cl.
*H03K 5/00* (2006.01)
(52) U.S. Cl.
CPC ............ *H03K 5/00006* (2013.01); *H03K 2005/00286* (2013.01)
(58) Field of Classification Search
CPC ..... H03K 5/00006; H03K 2005/00286; H03K 2005/00052; H03K 5/1504; H03B 27/00; H03B 19/14; H04L 7/0025
See application file for complete search history.

(56) References Cited

U.S. PATENT DOCUMENTS 6,380,783 B1   4/2002  Chao et al.
6,580,300 B2 *  6/2003  Tagami ................. H03B 27/00
                                                    327/254

(Continued)

FOREIGN PATENT DOCUMENTS

KR      1020120082627 A    7/2012

OTHER PUBLICATIONS

Michael Kalcher et al., "Self-Aligned Open-Loop Local Quadrature Phase Generator," ESSCIRC Conference 2016: 42nd European Solid-State Circuits Conference (Sep. 2016).

(Continued)

*Primary Examiner* — John W Poos
(74) *Attorney, Agent, or Firm* — 2SPL Patent Attorneys PartG mbB

(57) ABSTRACT

A multiphase signal generator includes an input port. Furthermore, the multiphase signal generator includes a plurality of phase shifters. Each phase shifter of the plurality of phase shifters is configured to provide an identical phase shift Δφ. At least one phase shifter is connected to the input port. Furthermore, the multiphase signal generator includes a first phase interpolator and at least a second phase interpolator. Each phase interpolator has a respective output terminal. Each phase interpolator is configured to weight a phase of a signal at a respective first input terminal of the phase interpolator with a respective first weighting factor $w_{i,1}$ and to weight a phase of another signal at a respective second input terminal of the phase interpolator with a respective second weighting factor $w_{i,2}$ to generate an interpolated phase signal at the respective output terminal of the phase interpolator. A first subset of the plurality of phase shifters includes n>1 serially connected phase shifters. The first subset of phase shifters is coupled between the first input terminal and the second input terminal of the first (Continued)

phase interpolator. A different second subset of the plurality of phase shifters includes n serially connected phase shifters. The second subset of phase shifters is coupled between the first input terminal and the second input terminal of the second phase interpolator.

24 Claims, 31 Drawing Sheets

(56) References Cited

U.S. PATENT DOCUMENTS

| | | | | |
|---|---|---|---|---|
| 8,169,247 | B2* | 5/2012 | Nedachi | H03L 7/091 |
| | | | | 327/170 |
| 8,803,583 | B2* | 8/2014 | Nedachi | H03K 5/135 |
| | | | | 327/251 |
| 2002/0079938 | A1 | 6/2002 | Saeki | |
| 2004/0066873 | A1 | 4/2004 | Cho et al. | |
| 2004/0169539 | A1 | 9/2004 | Gauthier et al. | |
| 2006/0008041 | A1* | 1/2006 | Kim | H03L 7/0812 |
| | | | | 375/371 |
| 2007/0018707 | A1 | 1/2007 | Rajagopal et al. | |
| 2017/0019112 | A1* | 1/2017 | Li | H04L 7/0012 |

OTHER PUBLICATIONS

Kalcher, Michael, "Fully Integrated Mixed-Signal RF-Domain Transmier-Induced Self-Interference Cancella on for Advanced Wireless Cellular Mobile Transceivers," Doctoral Thesis, Graz University of Technology, Jul. 1, 2019 Downloaded on Jan. 6, 2022 from https://www.google.com/url?sa=t&rct=j&q=&esrc=s&source=web&cd=&cad=rja&uact=8&ved=2ahUKEwjD9vDW7pz1AhUkSvEDHdmtDX4QFnoECA8QAQ&url=h ps%3A%2F%2Fdiglib.tugraz.at%2Fdownload.php%3Fid%3D5f9018e4acc88%26loca.

* cited by examiner

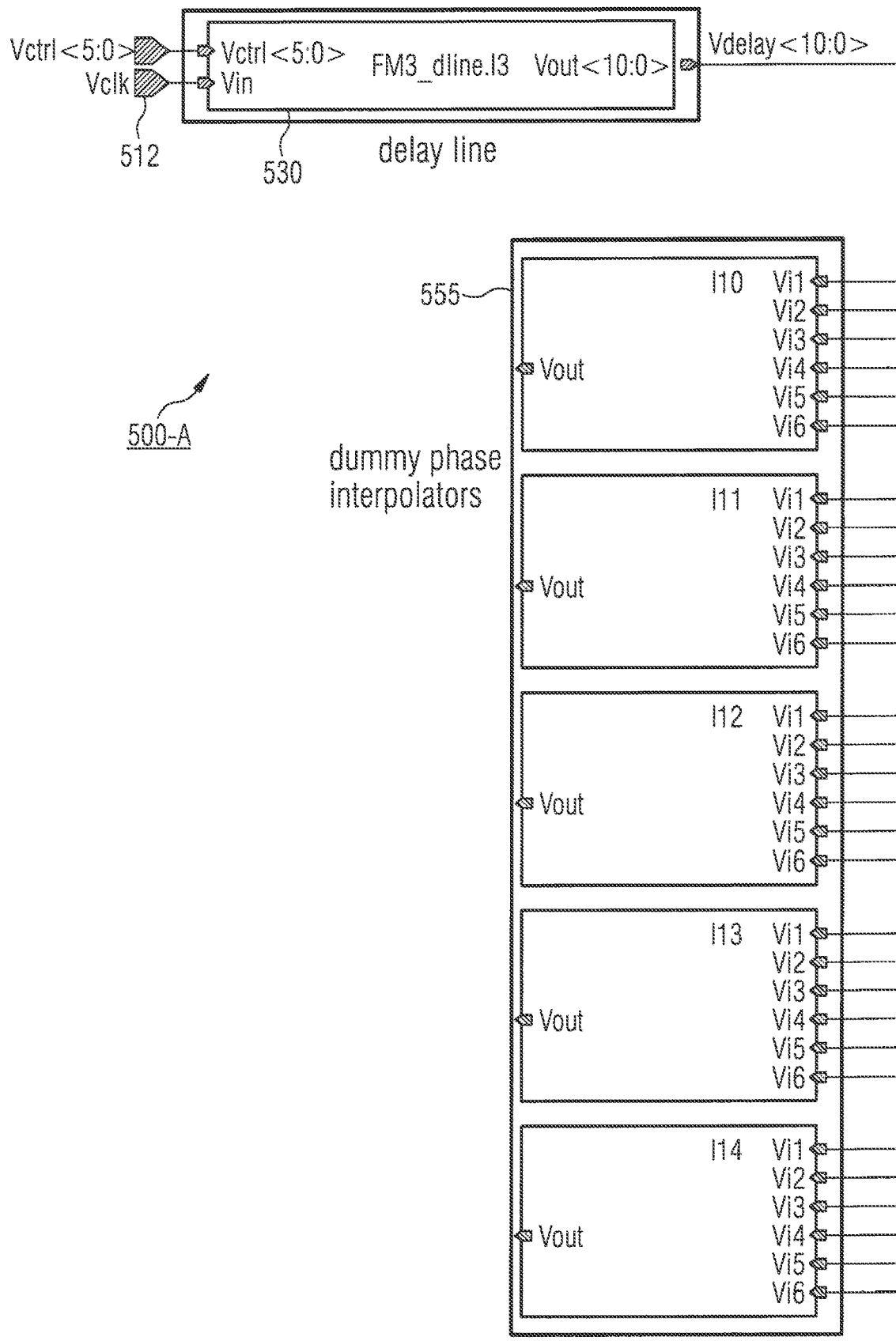
FIG. 5a Part 1

FIG. 5a Part 2
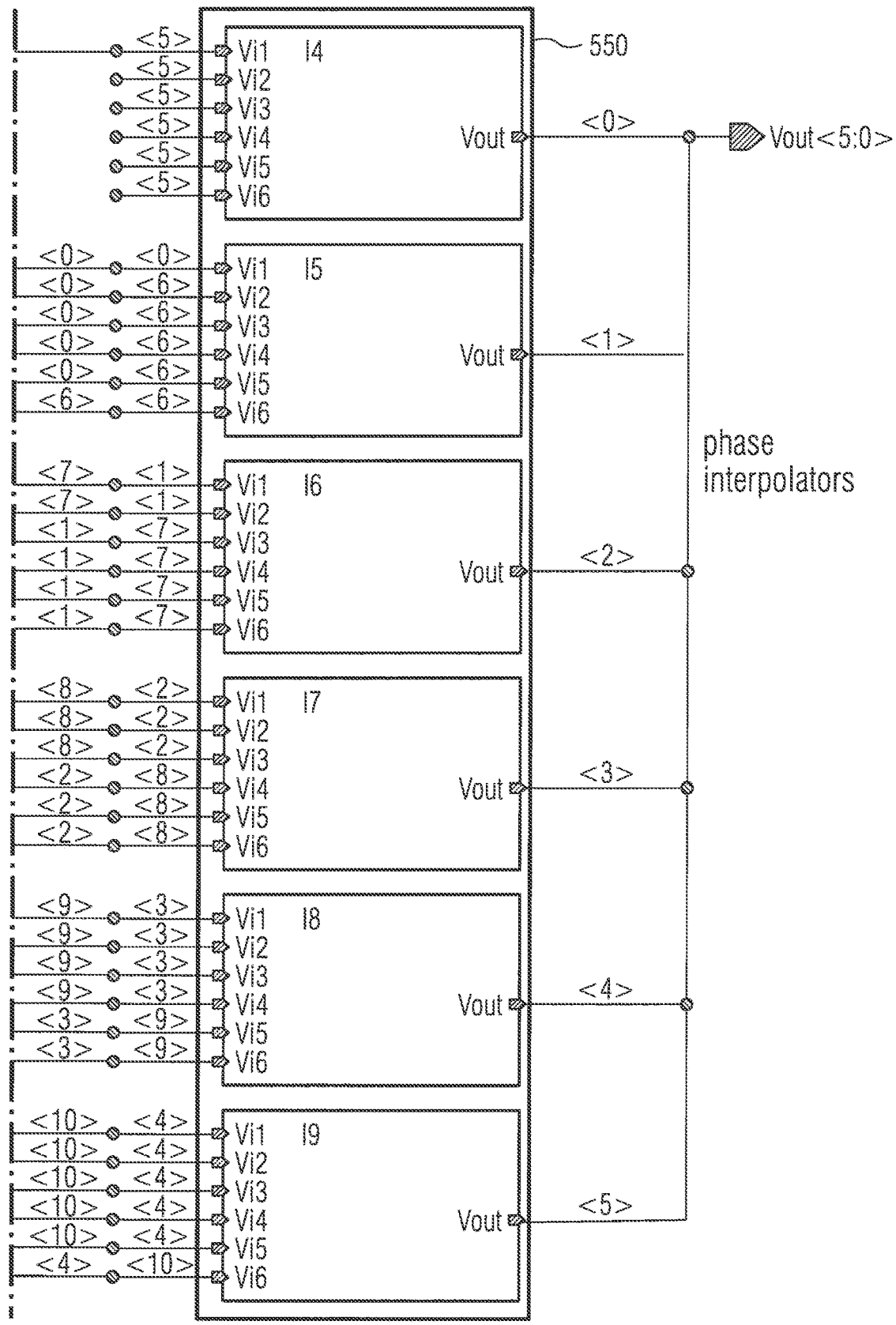

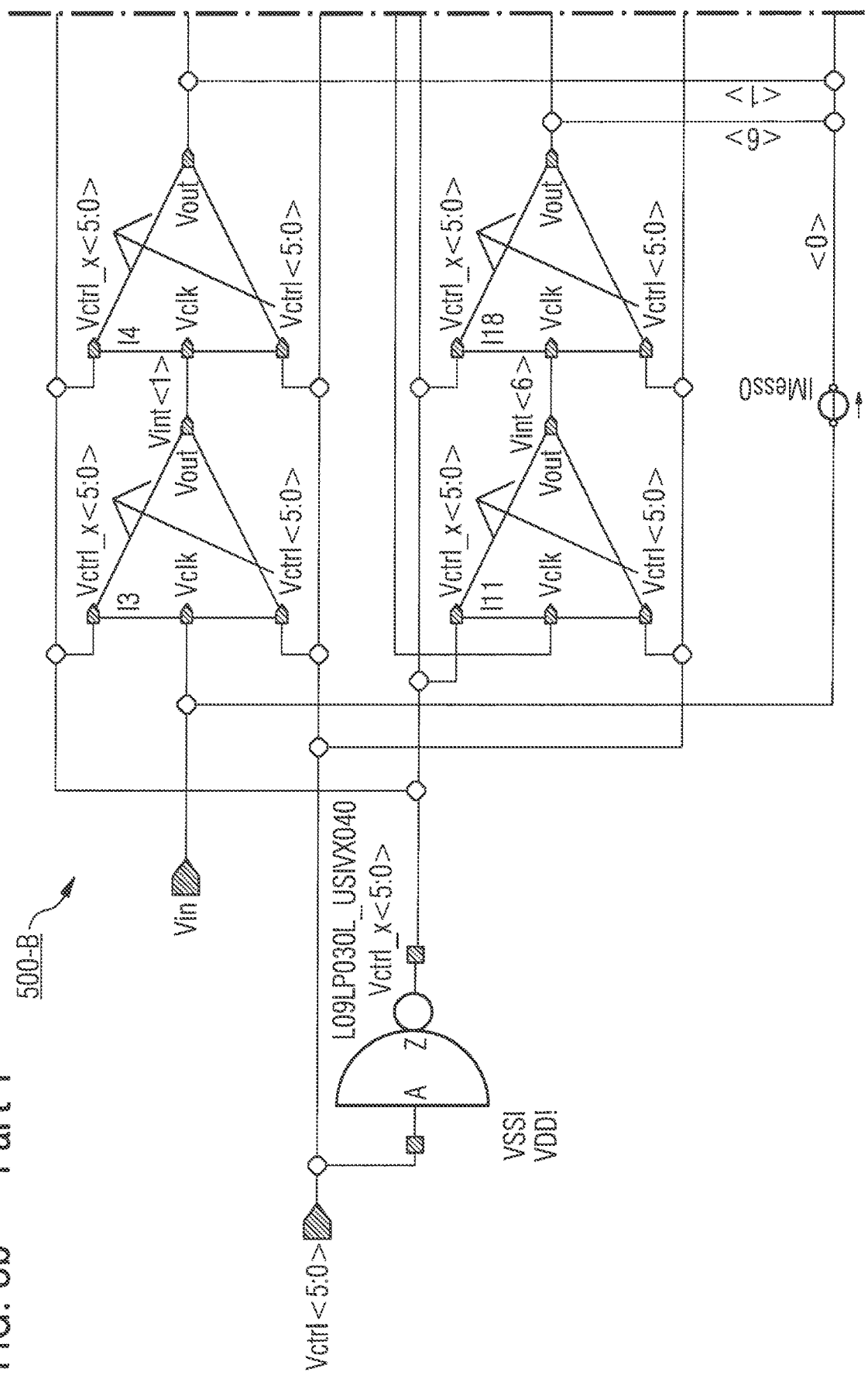
FIG. 5b Part 1

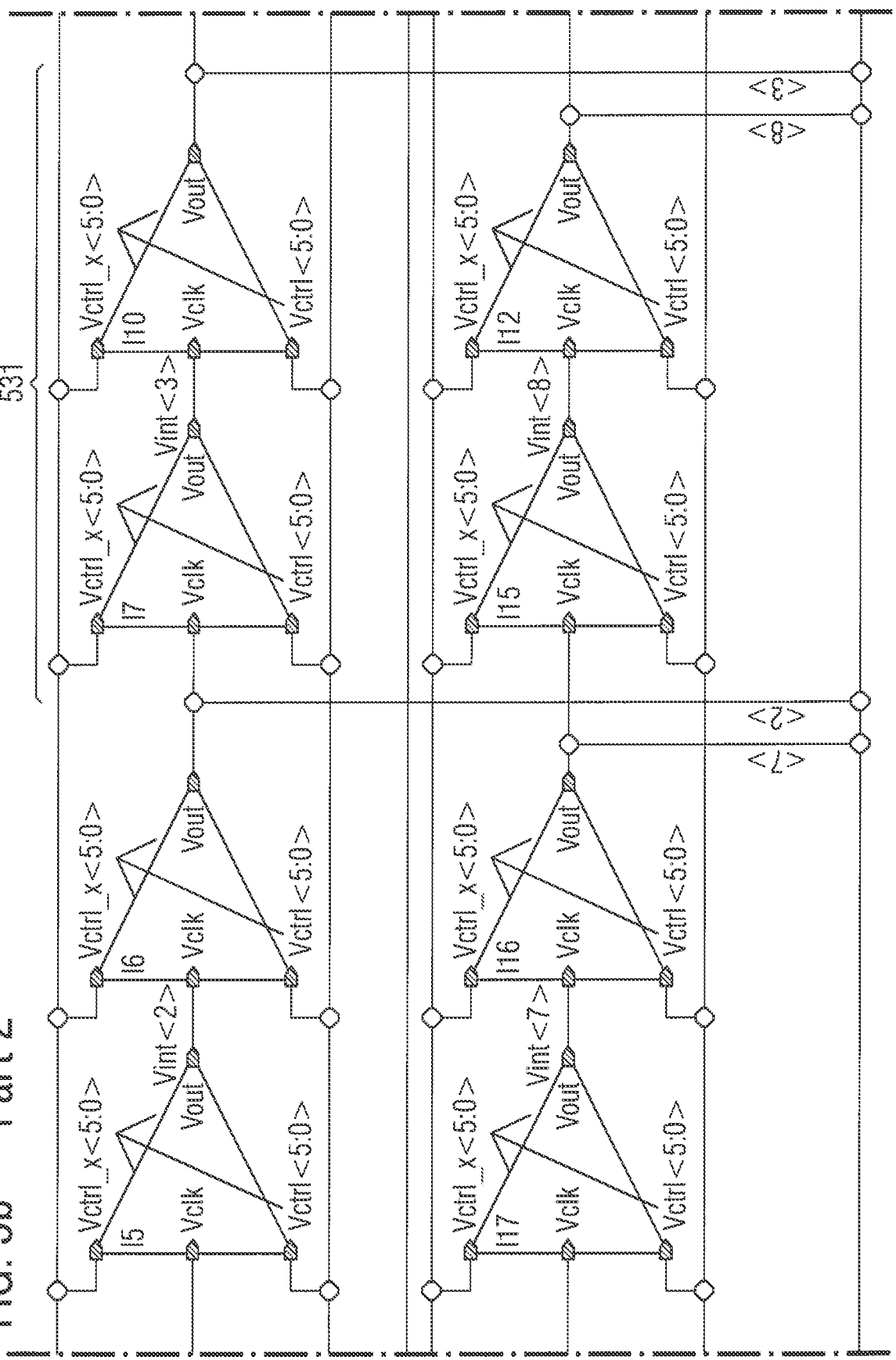
FIG. 5b  Part 2

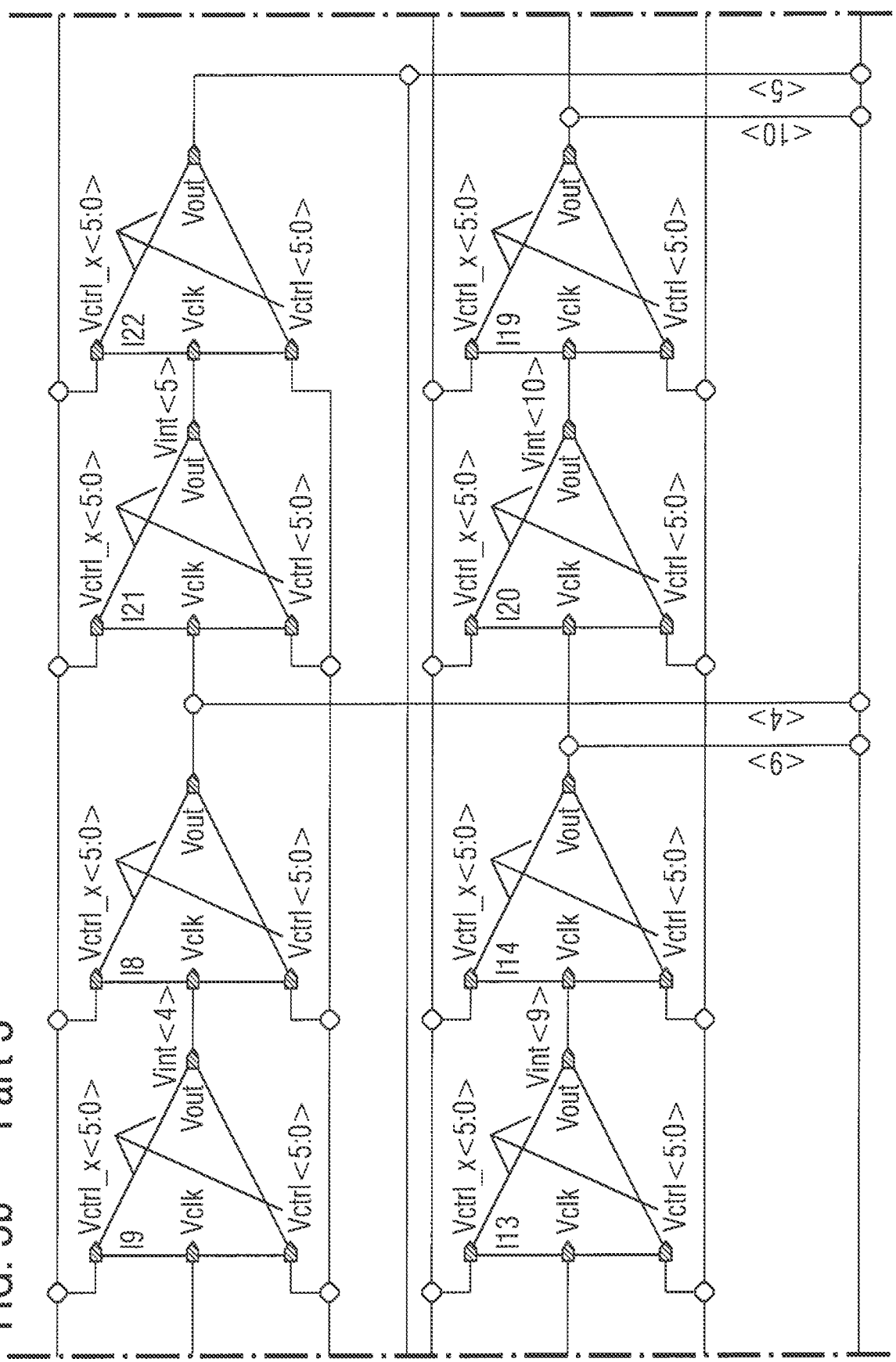
FIG. 5b  Part 3

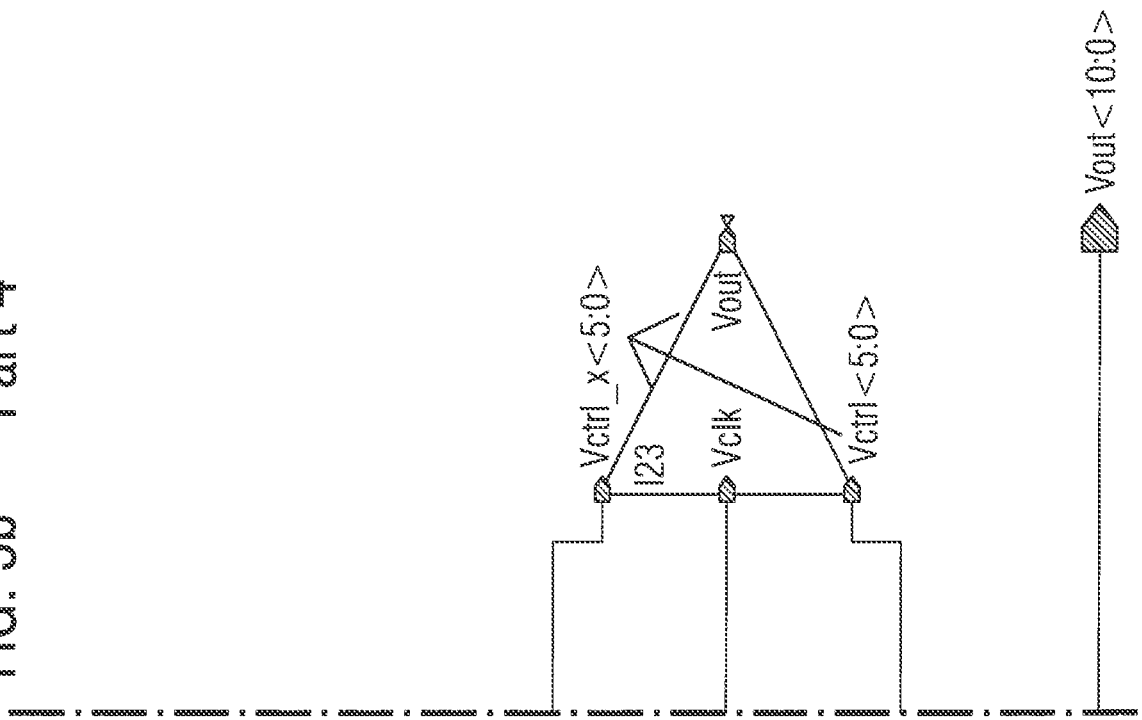
FIG. 5b Part 4

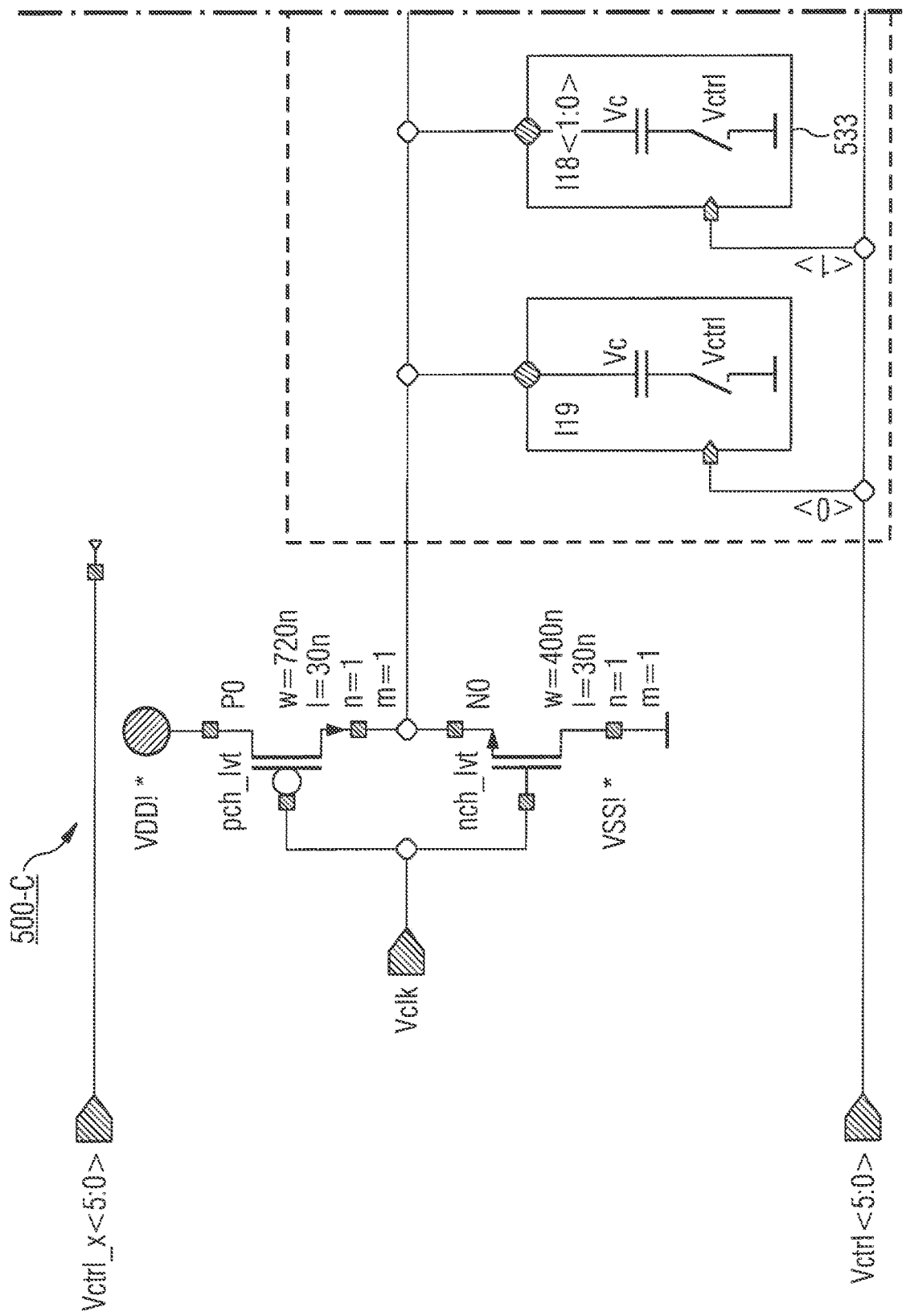
FIG. 5c Part 1

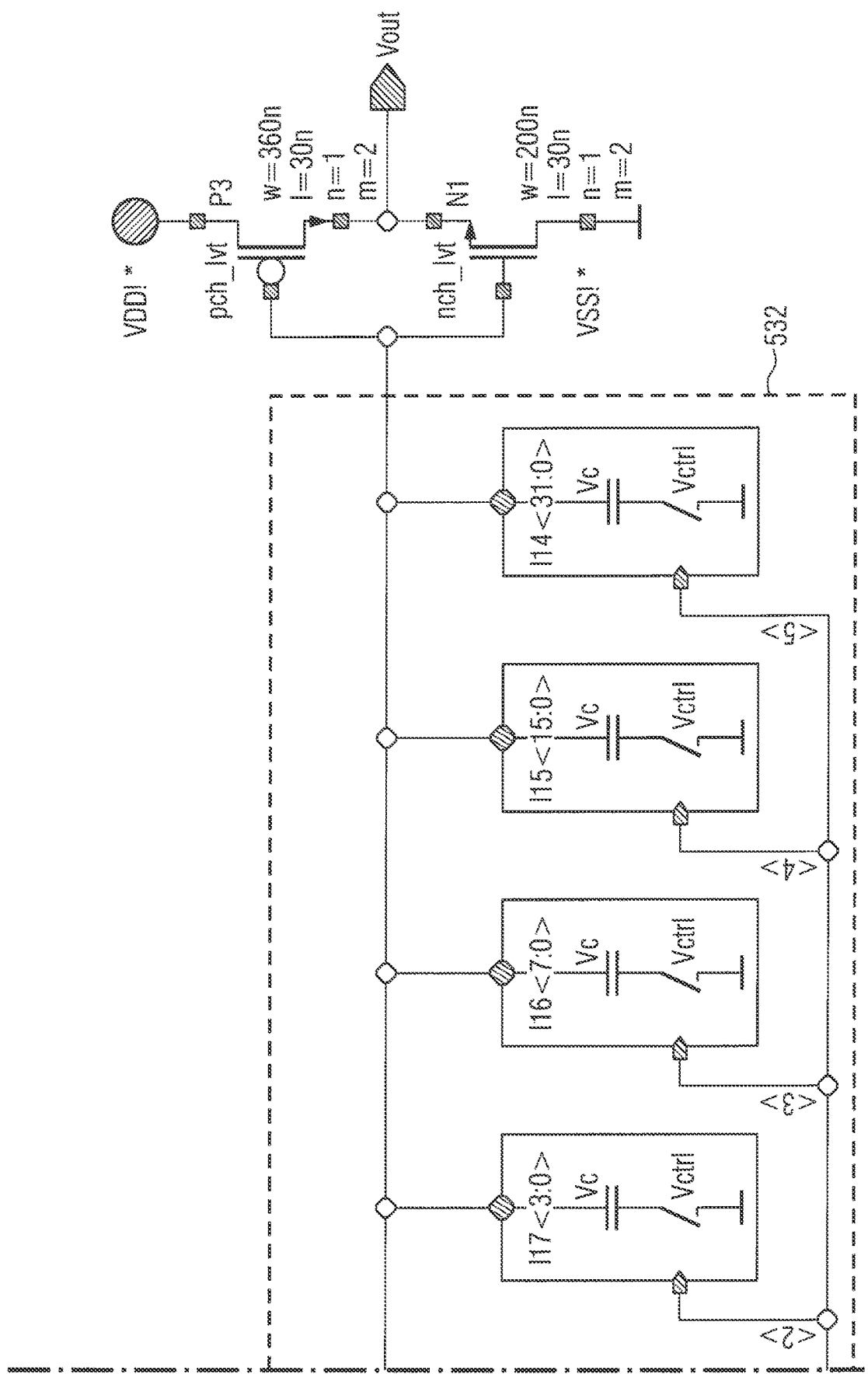
FIG. 5c Part 2

FIG. 5f Part 1
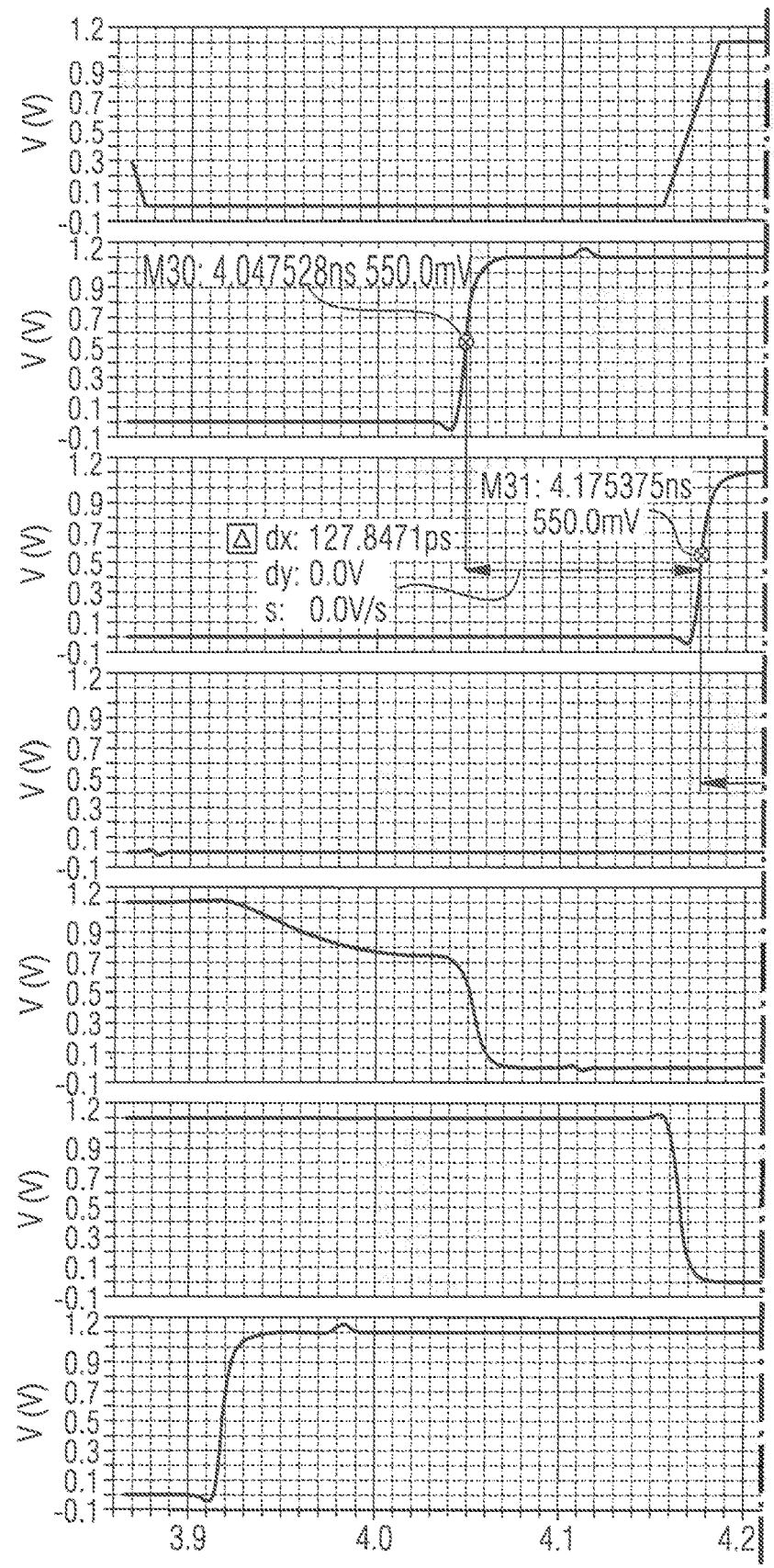

FIG. 5f  Part 2
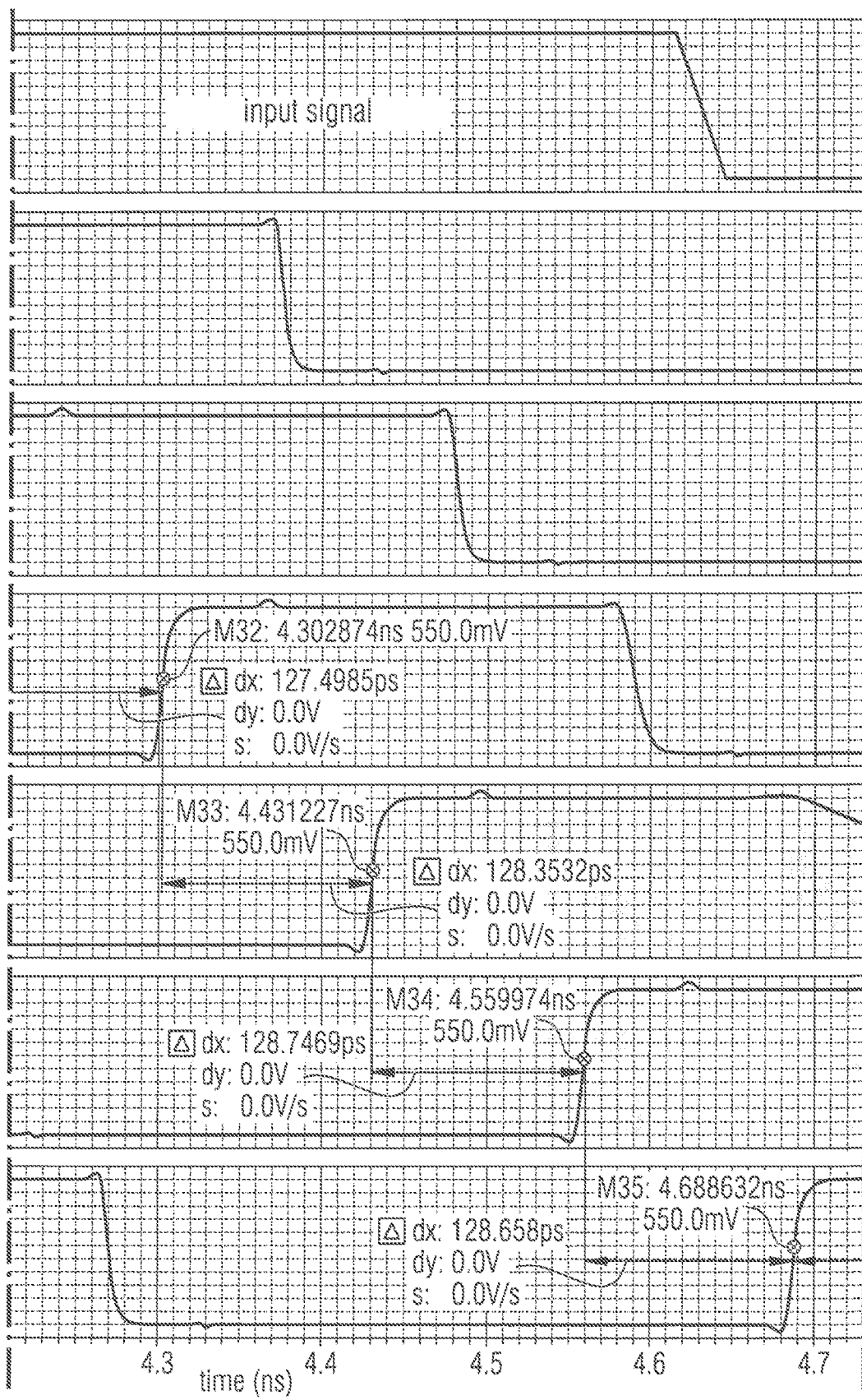

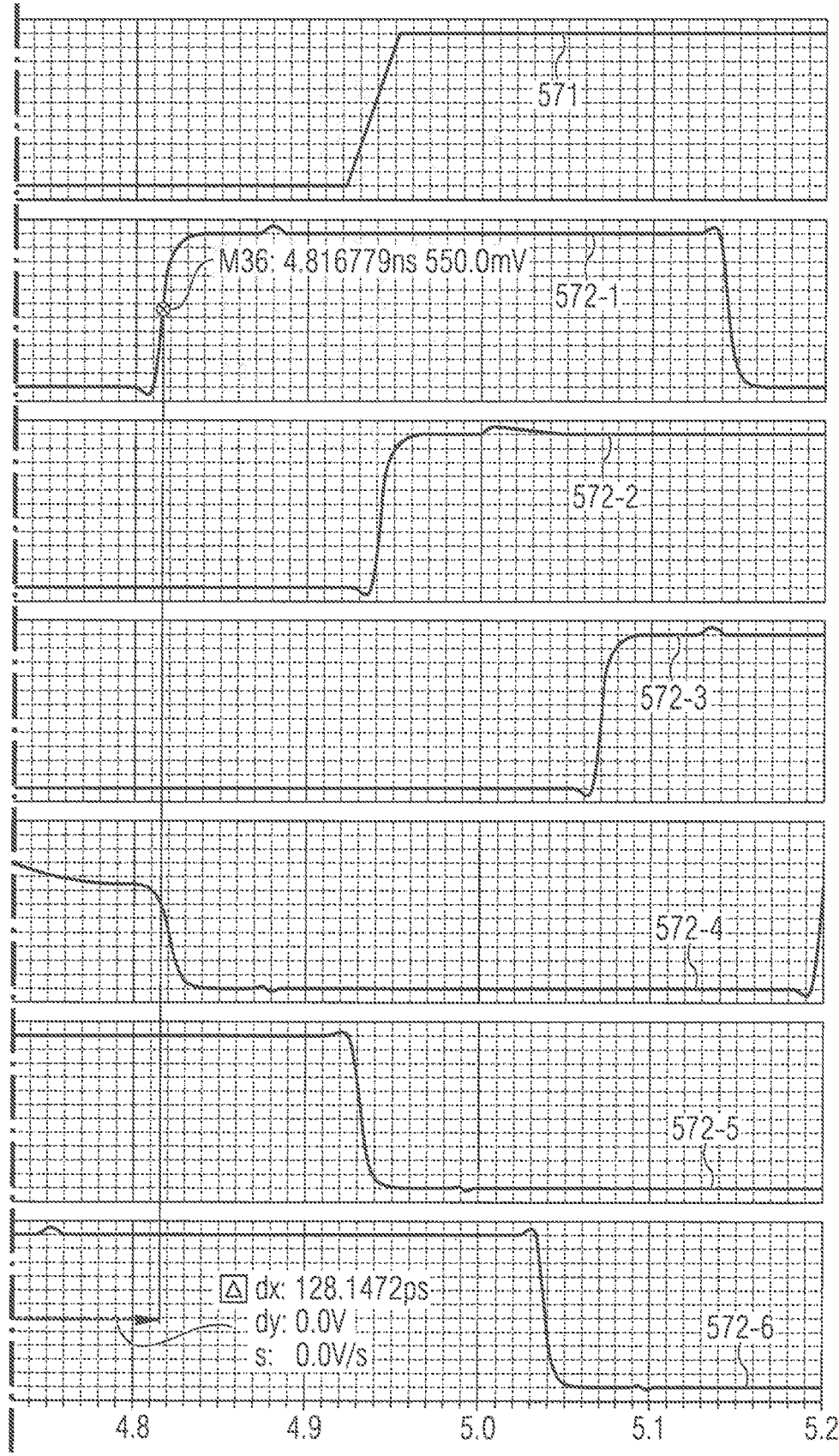
FIG. 5f Part 3

MULTIPHASE SIGNAL GENERATORS, FREQUENCY MULTIPLIERS, MIXED SIGNAL CIRCUITS, AND METHODS FOR GENERATING PHASE SHIFTED SIGNALS

FIELD

Examples relate to multiphase signal generators, frequency multipliers, mixed signal circuits, and methods for generating phase shifted signals.

BACKGROUND

Many electronic circuits, such as central processing units, application specific integrated circuits (ASICs), digital signal processors (DSPs), radio frequency (RF) circuits, and the like require signals with a fixed phase relationship that is accurately tuned to a desired value. For example, digital circuits that are interconnected with each other often require synchronized clock signals of fixed phase relationship. The ever increasing operational frequencies of electronic circuits pose new challenges for generating such signals. Some devices for signal generation try facing this challenge by employing analog tunable delay elements and complicated feedback structures. These devices are limited by the accuracy of the tuning of the delay elements and often come along with high trimming effort during production, increased circuit size, and thus increased manufacturing costs. Hence, new solutions for providing signals with accurately tuned phase relationship are sought. Such a demand may be satisfied by the subject matter of the present disclosure.

BRIEF DESCRIPTION OF THE FIGURES

Some examples of apparatuses and/or methods will be described in the following by way of example only, and with reference to the accompanying figures, in which

FIG. 5*a* shows a high level circuit schematic of a multiphase signal generator;

FIG. 5*b* shows a circuit schematic of a delay line;

FIG. 5*c* shows a circuit schematic of a delay stage;

FIG. 5*f* shows a timing diagram of an input signal and of output signals of the multiphase signal generator of FIG. 5*a*;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
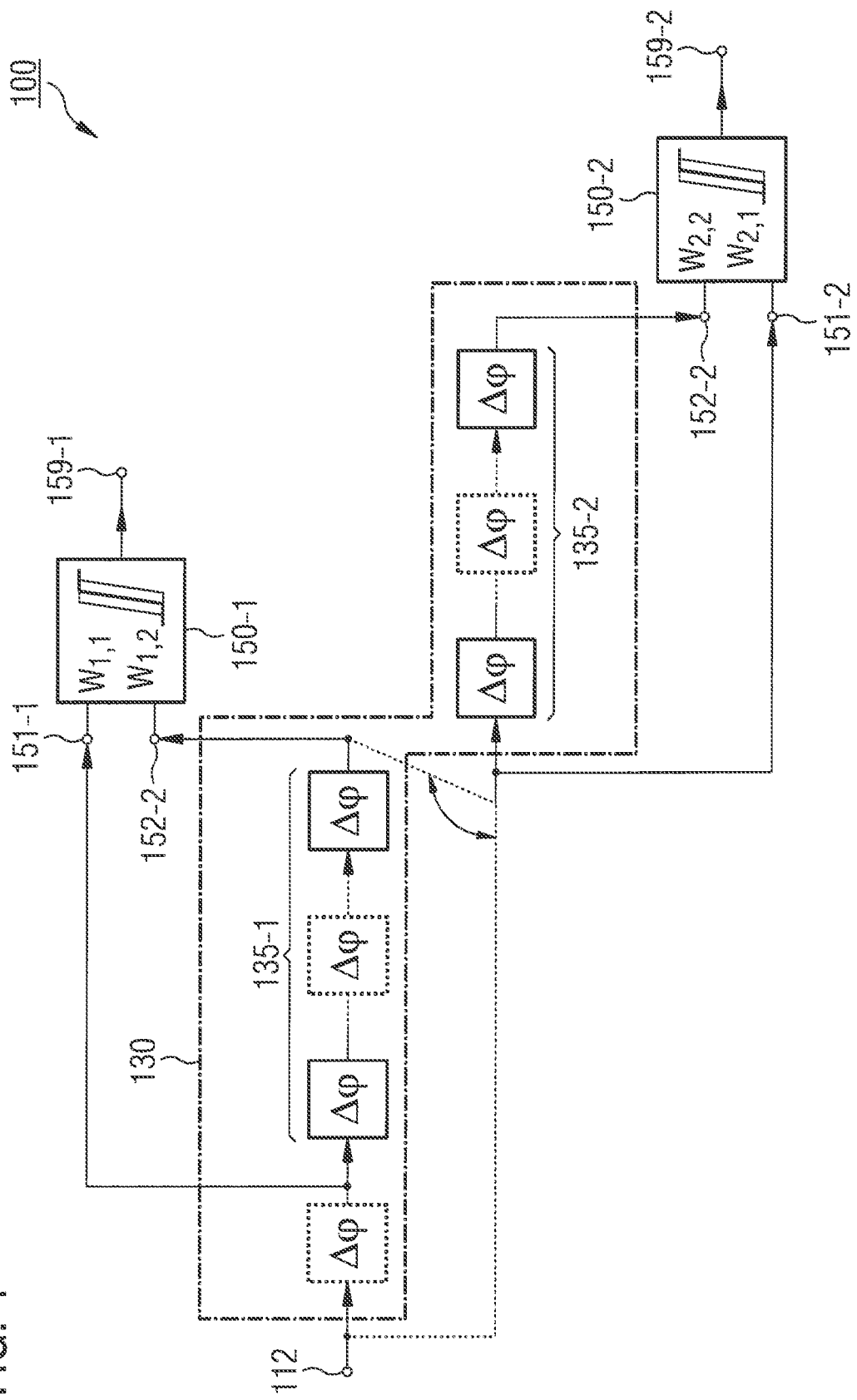
FIG. 1 shows a block diagram of a multiphase signal generator.

FIG. 1 shows a block diagram of a multiphase signal generator 100. The multiphase signal generator 100 comprises an input port 112. Furthermore, the multiphase signal generator 100 comprises a plurality 130 of phase shifters.

Each phase shifter of the plurality 130 of phase shifters is configured to provide an identical phase shift Δφ. At least one phase shifter is connected to the input port 112. Furthermore, the multiphase signal generator 100 comprises a first phase interpolator 150-1 and at least a second phase interpolator 150-2. Each phase interpolator 150-1, 150-2 has a respective output terminal 159-1, 159-2. Each phase interpolator 150-1, 150-2 is configured to weight a phase of a signal at a respective first input terminal 151-1, 151-2 of the phase interpolator 150-1, 150-2 with a respective first weighting factor $w_{i,1}$ and to weight a phase of another signal at a respective second input terminal 152-1, 152-2 of the phase interpolator 151-1, 151-2 with a respective second weighting factor $w_{1,2}$ to generate an interpolated phase signal at the respective output terminal 159-1, 159-2 of the phase interpolator 151-1, 151-2. A first subset 135-1 of the plurality 130 of phase shifters comprises n>1 serially connected phase shifters. The first subset 135-1 of phase shifters is coupled between the first input terminal 151-1 and the second input terminal 152-1 of the first phase interpolator 150-1. A different second subset 135-2 of the plurality 130 of phase shifters comprises n serially connected phase shifters. The second subset 135-2 of phase shifters is coupled between the first input terminal 151-2 and the second input terminal 152-2 of the second phase interpolator 150-2.

According to this, the proposed multiphase signal generator 100 can comprise a feed forward open-loop architecture. Compared to other multiphase signal generators, complicated feedback structures may hence be avoided, so that circuit overhead can be reduced and/or system stability can be ensured for the multiphase signal generator 100.

The first subset 135-1 and the second subset 135-2 of phase shifters comprise the same number n of phase shifters. As indicated in FIG. 1, the first subset 135-1 can be connected in series to the second subset 135-2. Alternatively, the first subset 135-1 and the second subset 135-2 may be part of different series connections of phase shifters branching off from the input port 112, for example. Furthermore, a union of the first and the second subset 135-1, 135-2 of phase shifters does not necessarily comprise all phase shifters of the plurality 130 of phase shifters. As indicated in FIG. 1, a phase shifter of the plurality 130 of phase shifters can be connected in series between the input port 112 and the first subset 135-1 of phase shifters, for example. The first subset 135-1 is different from the second subset 135-2 of phase shifters in the sense that there is at least one phase shifter that belongs to one of the subsets 135-1, 135-2 but does not belong to the other subset. For example, there may be at least one phase shifter that belongs only to the first subset 135-1 but not to the second subset 135-2, and/or there may be a phase shifter that belongs only to the second subset 135-2 but not to the first subset 135-1.

The first weighting factor $w_{1,1}$ for weighting a phase of a signal at the first input terminal 151-1 of the first phase interpolator 150-1 can differ from the first weighting factor $w_{2,1}$ for weighting a phase of a signal at the first input terminal 151-2 of the second phase interpolator 150-2. Likewise, the second weighting factor $w_{1,2}$ for weighting a phase of a signal at the second input terminal 152-1 of the first phase interpolator 150-1 can differ from the second weighting factor $w_{2,2}$ for weighting a phase of a signal at the second input terminal 152-2 of the second phase interpolator 150-2.

The input port 112 of the multiphase signal generator 100 can be configured to receive a periodic signal. For example, the input port 112 can be connected to an oscillator circuit (e.g., a crystal oscillator, an oven controlled crystal oscillator, a voltage controlled oscillator, a phase-locked-loop circuit, an optical oscillator), to a clock signal generation circuit, and/or to any circuit providing a periodic signal (e.g., a receiver circuit configured to receive a time code transmitted by a radio transmitter connected to a time standard). The periodic signal at the input port 112 can have various pulse shapes such as rectangular pulses, triangular pulses, trapezoidal pulses, raised-cosine pulses, Gaussian pulses, sinusoidal pulses and/or any superposition thereof. The periodic signal can be a single-ended signal. Alternatively, the periodic signal can be a differential signal according to some examples.

The proposed multiphase signal generator 100 can generate a first output signal at the output terminal 159-1 of the first phase interpolator 150-1 and a second output signal at the output terminal 159-2 of the second phase interpolator 150-2. The first and the second output signal can have a fixed phase shift with respect to each other that is accurately set to a desired value. Accuracy can be achieved due to each phase shifter providing the same phase shift Δφ and due to the same number of n phase shifters being coupled between the respective first and respective second input terminal of the first and the second phase interpolator 150-1, 150-2.

Figure 2A:
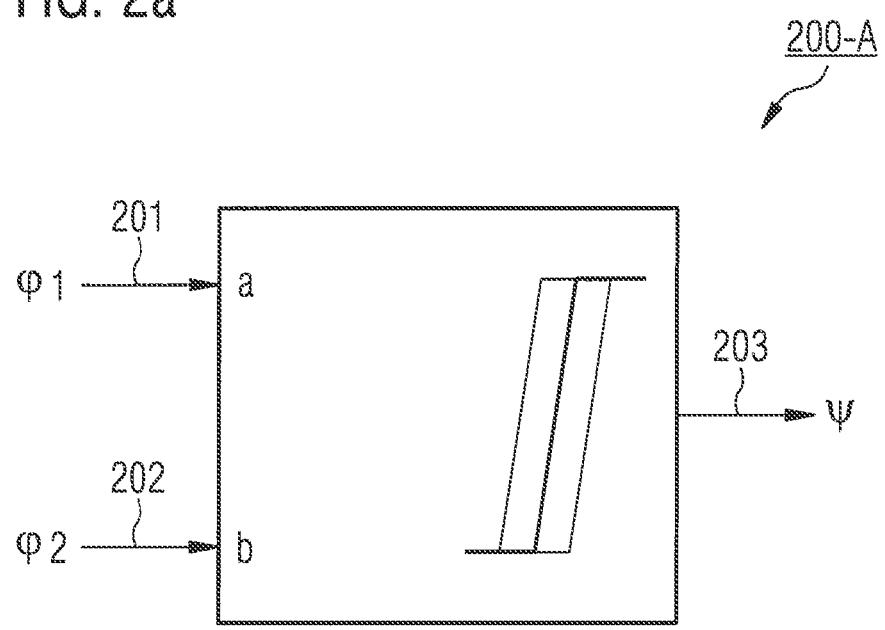
FIG. 2*a* shows a block diagram of a phase interpolator.

A phase interpolator can be an electric circuit that can generate an output signal of a desired phase from a weighted interpolation of respective phases of its input signals. A block diagram of a phase interpolator 200-A with two input signals 201, 202 of phase $\varphi_1$ and $\varphi_2$, respectively, and an output signal 203 of phase ψ is shown in FIG. 2a. The phase interpolator 200-A is configured to weight the phase $\varphi_1$ of the first input signal 201 with a weighting factor a, and to weight the phase $\varphi_2$ of the second input signal 202 with a weighting factor b. Moreover, the phase interpolator 200-A is configured to set the phase w of its output signal 203 according to the weighted average of the phases of its input signals. This can be expressed by Equation 1.1:

$$\psi = \frac{1}{a+b}(a \cdot \varphi_1 + b \cdot \varphi_2).$$

For a generic phase interpolator comprising a number of m input terminals, the phase V of its output signal can be expressed by Equation 1.2:

$$\psi = \frac{1}{\sum_{j=1}^{m} w_j} \sum_{j=1}^{m} w_j \varphi_j,$$

where $\varphi_j$ denotes the phase of an input signal at the j-th input terminal of the generic phase interpolator, and $w_j$ denotes the weighting factor at the j-th input terminal.

Turning back to FIG. 1, for each phase interpolator 150-1, 150-2 of the multiphase signal generator 100, a ratio of the first weighting factor $w_{i,1}$ to the second weighting factor $w_{i,2}$ of the respective phase interpolator 150-1, 150-2 can correspond to a sum of a non-negative integer constant C and a respective number of $l_i$ (i=1, 2, . . . ) serially connected phase shifters coupled between the input port 112 and the first input terminal 151-1, 151-2 of the respective phase interpolator 150-1, 150-2 divided by (n−$l_i$−C). This can be expressed by Equation 2.1:

$$\frac{w_{i,1}}{w_{i,2}} = \frac{C + l_i}{n - l_i - C}.$$

The phase $\psi_i$ of a respective output signal of a respective phase interpolator 150-1, 150-2 can then be expressed by Equation 2.2:

$$\psi_i = \frac{1}{w_{i,1} + w_{i,2}}(w_{i,1} \cdot \varphi_{i,1} + w_{i,2} \cdot \varphi_{i,2}),$$

where $\varphi_{i,1}$ represents the phase of a signal at a respective first input terminal and $\varphi_{i,2}$ the phase of a signal at a respective second input terminal of the respective phase interpolator 150-1, 150-2.

Since there can be $l_i$ serially connected phase shifters coupled between the input port 112 and the first input terminal 151-1, 151-2 of a respective phase interpolator 150-1, 150-2, the phases $\varphi_{i,1}$ at the first input terminals can be expressed by Equation 2.3:

$\varphi_{i,1} = \varphi_0 + l_i \Delta \varphi$, where $\varphi_0$ represents the phase of a signal at the input port 112 of the multiphase signal generator 100. As the respective subsets 135-1, 135-2 comprise n serially connected phase shifters, the phases $\varphi_{i,2}$ at the second input terminals of the respective phase interpolators can be expressed by Equation 2.4:

$\varphi_{i,2} = \varphi_0 + (n + l_i)\Delta \varphi$.

In other words, for each phase interpolator 150-1, 150-2 of the multiphase signal generator 100 a number of ($l_i$+n) serially connected phase shifters can be coupled between the input port 112 and the second input terminal 152-1, 152-2 of the respective phase interpolator 150-1, 150-2. The input signal of the multiphase signal generator 100 can first travel from the input port 112 through $l_i$ serially connected phase shifters, be tapped off to the first input terminal of a respective phase shifter, and travel further through a respective subset of n serially connected phase shifters to reach the second input terminal of the respective phase shifter.

Due to the respective subsets 135-1, 135-2 of phase shifters being coupled between the respective first and the respective second input terminal of the respective phase interpolator, a signal at the second input terminal may be delayed with respect to a signal at the first input terminal. This can cause the respective phase interpolator to interpolate the delayed signal at its second input terminal with a next period (or a next pulse) of the signal at its first input terminal. Hence, Equation 2.3 can be reformulated into Equation 2.5:

$\varphi_{i,1} = \varphi_0 + l_i \Delta \varphi + 360°$, wherein the term 360° may take account of the respective phase interpolator interpolating the delayed signal at its second input terminal with the next period (or next pulse, or the second next period or pulse, or an even later period or pulse) of the signal at its first input terminal. Substituting Equations 2.1, 2.4, and 2.5 into Equation 2.2 leads to Equation 3.1 expressing the phase $\psi_i$ of a respective output signal:

$$\psi_i = \varphi_0 + \frac{C + l_i}{n} \cdot 360° + (n - C)\Delta \varphi.$$

For each phase interpolator of the multiphase signal generator 100, a different number $l_i$ of serially connected phase shifters of the plurality 130 of phase shifters can be coupled between the input port 112 and the first input terminal of the respective phase interpolator.

For example, with $l_1$ denoting the number of serially connected phase shifters coupled between the input port 112 and the first input terminal 151-1 of the first phase interpolator 150-1, the phase $\psi_1$ of the first output signal (provided by the first phase interpolator 150-1 at its output terminal 159-1) can be expressed by Equation 3.2:

$$\psi_1 = \varphi_0 + \frac{C + l_1}{n} \cdot 360° + (n - C)\Delta \varphi.$$

With $l_2$ denoting the number of serially connected phase shifters coupled between the input port 112 and the first input terminal 151-2 of the second phase interpolator 150-2, the phase $\psi_2$ of the second output signal (provided by the second phase interpolator 150-2 at its output terminal 159-2) can be expressed by Equation 3.3:

$$\psi_2 = \varphi_0 + \frac{C + l_2}{n} \cdot 360° + (n - C)\Delta \varphi.$$

A phase relationship $\Delta \psi_{21}$ (e.g., a phase difference) between the first and the second output signal can then be expressed by Equation 3.4:

$$\Delta \psi_{21} = \psi_2 - \psi_1 = \frac{l_2 - l_1}{n} \cdot 360°.$$

The above consideration and/or Equation 3.4 show that the phase relationship $\Delta \psi_{21}$ between the first and the second output signal can be independent of the (common) phase shift $\Delta \varphi$ of the phase shifters of the plurality 130 of phase shifters. Hence, the design of the multiphase signal generator 100 may be done independently of the exact value of $\Delta \varphi$. As long as each phase shifter is configured to provide the identical phase shift $\Delta \varphi$ (neglecting manufacturing tolerances), this phase shift $\Delta \varphi$ can cancel in Equation 3.4 and the phase relationship $\Delta \psi_{21}$ can be accurately set to a desired value be the choice of $l_1$, $l_2$, and n.

Furthermore, the first and the second weighting factor of both the first and the second phase interpolator can be non-negative. This can facilitate an implementation of the multiphase signal generator 100. For example, the non-negative integer constant C may be chosen such that the ratio of the respective first to the respective second weighting factor according to Equation 2.1 is positive for each phase interpolator. This can be expressed by In equation 3.5:

$n - l_i - C \geq 0$ for each $i$,

→$C \leq n - \max(l_i)$.

Hence, the non-negative integer constant C may be selected such that C is smaller than (or equal to) the number n of phase shifters of the respective subsets 135-1, 135-2 of phase shifters minus the maximum number $l_i$ of serially connected phase shifters coupled between the input port 112 and the first input terminal of a phase interpolator of the multiphase signal generator 100.

According to an embodiment, the non-negative integer constant C is equal to one. This can reduce the number of phase shifters of the plurality 130 of phase shifters and hence hardware complexity of the multiphase signal generator 100.

The phase shifters of the plurality 130 of phase shifters can have corresponding (e.g., equal) circuit schematics. This can facilitate the phase shift Δφ being the same for each of the plurality 130 of phase shifters. To this end, each phase shifter may comprise electrical elements (e.g., transmission lines, resistors, capacitors, inductors, transistors, diodes, switches, relays, etc.) of the same type (e.g., separated but the same elements). Additionally, the electrical elements of each phase shifter may be electrically connected in the same circuit configuration. Additionally, corresponding electrical elements of the phase shifters may have the same (nominal) dimensions (e.g., the same transmission line length, the same resistance, the same capacitance, the same inductance, the same channel width, the same channel length, etc., neglecting manufacturing tolerances). In other words, the phase shifters of the plurality 130 of phase shifters may have the same scattering parameters (neglecting manufacturing tolerances).

For example, the phase shifters of the plurality 130 of phase shifters may each comprise a transmission line of a predefined electrical length to provide the identical phase shift Δφ for each phase shifter. Additionally or alternatively, the phase shifters of the plurality 130 of phase shifters may each comprise a capacitor and/or a bank of capacitors (in a parallel and/or in series configuration) to provide the identical phase shift Δφ for each phase shifter. Additionally or alternatively, the phase shifters of the plurality 130 of phase shifters may each comprise a filter circuit comprising lumped elements (such as resistors, capacitors and/or inductors) and/or transmission line elements to provide the identical phase shift Δφ for each phase shifter.

Additionally or alternatively, the phase interpolators (e.g., the first and the second phase interpolator 150-1, 150-2) can have corresponding (e.g., equal) circuit schematics. This can further enhance the accuracy of the phase relationship of the output signals (e.g., the first and the second output signal) of the multiphase signal generator 100.

For each phase interpolator (e.g., the first and the second phase interpolator 150-1, 150-2) a different number $l_i$ of serially connected phase shifters can be coupled between the input port 112 and the first input terminal (e.g., input terminals 151-1 and 151-2, respectively) of the respective phase interpolator. This can cause the phase relationship of the output signals (e.g., $\Delta\psi_{21}$) to be different from zero.

For example, suppose (as indicated in FIG. 1) there is one phase shifter coupled between the input port 112 and the first subset 135-1 of phase shifters. Hence $l_i$ is equal to 1 in this example. Further suppose for this example, that the second subset 135-2 of phase shifters branches off from the input port 112 and that there is not any other phase shifter coupled between the second subset 135-2 and the input port 112, so that $l_2$=0. Further suppose for this example, that the first and the second subset 135-1, 135-2 each comprise n=3 phase shifters. From Equation 3.4 the phase difference between the first output signal (provided at the output terminal 159-1 of the first phase interpolator 150-1) and the second output signal (provided at the output terminal 159-2 of the second phase interpolator 150-2) is then $$\Delta\psi_{21} = \frac{0-1}{3} \cdot 360° = -120°.$$

The negative sign can mean that the second output signal lags the first output signal.

According to some examples, the first subset 135-1 and the second subset 135-2 of phase shifters can be connected in series. Additionally, there can be one or more phase shifters of the plurality 130 of phase shifters that is coupled in series between the first subset 135-1 and the second subset 135-2 of phase shifters and connects the subsets 135-1 and 135-2.

For example, suppose again $l_1$=1 and n=3, but this time the second subset 135-2 is connected in series to the first subset 135-1 of phase shifters as indicated as an option in FIG. 1. Hence, there can be 4 phase shifters (i.e., the one phase shifter coupled between the input port 112 and the first input terminal 151-1 of the first phase interpolator 150-1 plus the three phase shifters of the first subset 135-1) that are coupled between the input port 112 and the first input terminal 151-2 of the second phase interpolator 150-2. Hence, in this example, $l_2$ can be equal to 4. Consequently, according to Equation 3.4, the phase difference between the first and the second output signal can be $$\Delta\psi_{21} = \frac{4-1}{3} \cdot 360° = 360°,$$

meaning that the first and the second output signal are shifted by one period with respect to each other. If there is, for example, one additional phase shifter connected serially between the first subset 135-1 and the second subset 135-2, $l_2$ can be equal to 5, and hence $$\Delta\psi_{21} = \frac{5-1}{3} \cdot 360° = 480°,$$

meaning that the second output signal can lead the first output signal by one period and an additional 120°, which may come down to 120° for a periodic input signal at input port 112.

According to some examples the first and the second subset of phase shifters comprise at least one common phase shifter. This can reduce the hardware effort of the multiphase signal generator 100 and/or can allow a larger variety in the phase relationship between output signals of the multiphase signal generator 100.

Figure 2B:
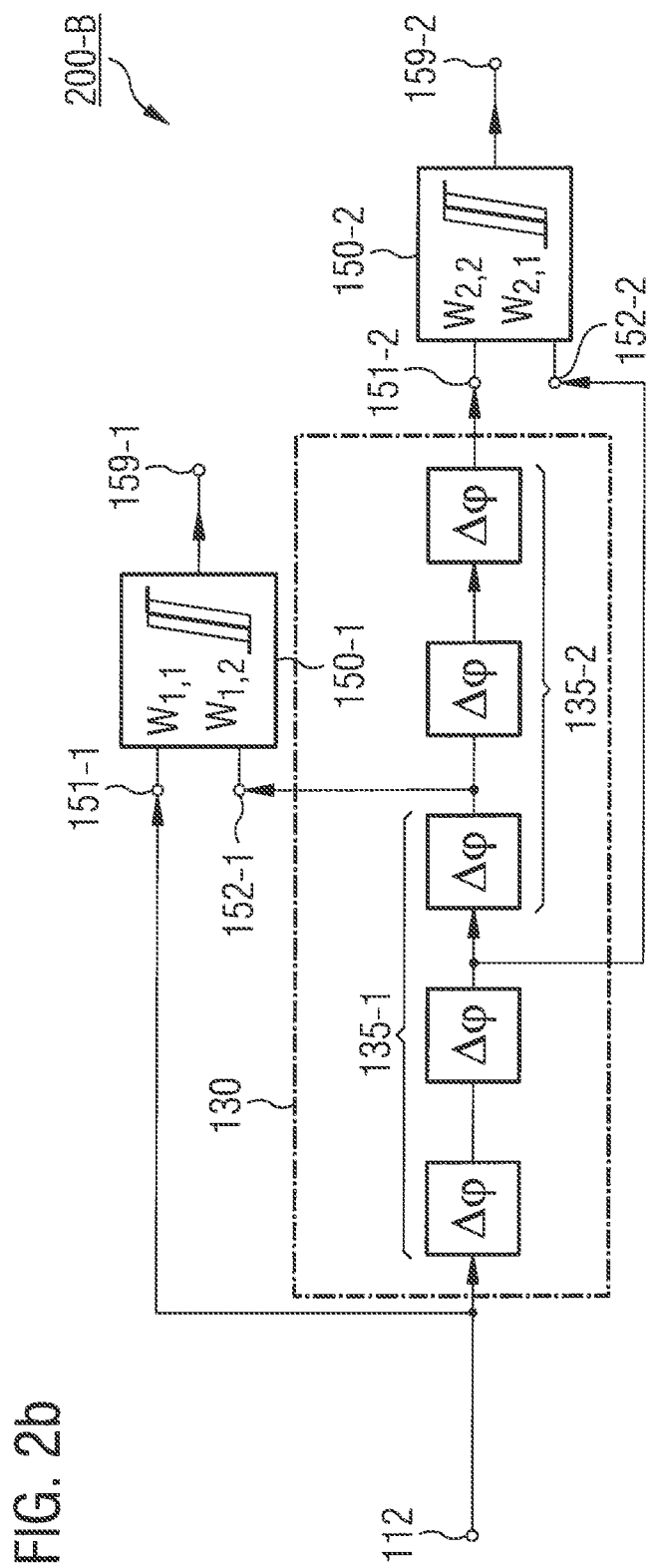
FIG. 2*b* shows a block diagram of another multiphase signal generator.

For example, the first subset 135-1 and the second subset 135-2 of phase shifters can be connected in series and can comprise at least one common phase shifter. Such an example of a multiphase signal generator 200-B is shown in FIG. 2b, where the first subset 135-1 and the second subset 135-2 of phase shifters comprise one common phase shifter, which is the last phase shifter of the first subset 135-1 (e.g., the furthest from the input port 112 in the series connection of the phase shifters of the first subset 135-1) and the first phase shifter of the second subset 135-2 (e.g., the closest to the input port 112 in the series connection of the phase shifters of the second subset 135-2). In the exemplary multiphase signal generator 200-B there are not any phase shifters coupled between the input port 112 and the first input terminal 151-1 of the first phase interpolator 150-1, so that $l_1$=0. Since in this example the first and the second subset of phase shifters of the multiphase signal generator 200-B each comprise n=3 phase shifters, $l_2$=2. Calculating the phase difference between the first and the second output signal of the multiphase signal generator 200-B hence yields $$\Delta\psi_{21} = \frac{2-0}{3} \cdot 360° = 240°.$$

Of course, the first subset 135-1 and the second subset 135-2 may comprise more than one common phase shifter according to some examples.

According to some examples, phase interpolators of the multiphase signal generator 100 can comprise more than two input terminals. For example, some (e.g., at least two) input terminals of a phase interpolator may be connected to the same electrical net (e.g., to the same wire). This electrical net can then represent an actual input terminal of the phase interpolator. For example, connecting several input terminals of a phase interpolator to the same electrical net can facilitate providing a desired weighting factor. The number of input terminals of a phase interpolator connected the same electrical net may be proportional to the weighting factor.

Additionally or alternatively, phase interpolators of the multiphase signal generator 100 can comprise more than two input terminals having different input signals (e.g., being connected to different phase shifters of the plurality of phase shifters).

According to an example, each phase interpolator 150-1, 150-2 comprises an additional respective third input terminal and an additional respective fourth input terminal. Additionally, each phase interpolator 150-1, 150-2 can be configured to generate the interpolated phase signal at its respective output terminal 159-1, 159-2 by additionally weighting a phase of a signal at its respective third input terminal with a respective third weighting factor $w_{i,3}$ and by additionally weighting a phase of a signal at its respective fourth input terminal with a respective fourth weighting factor $w_{i,4}$. Furthermore, a different third subset (with respect to the first and the second subset) of the plurality of phase shifters can comprise n serially connected phase shifters and can be coupled between the third and the fourth input terminal of the first phase interpolator 150-1. Furthermore, a different fourth subset (with respect to the first, second, and third subset) of the plurality of phase shifters can comprise n serially connected phase shifters and can be coupled between the third and the fourth input terminal of the second phase interpolator 150-2.

The third weighting factor $w_{i,3}$ of a respective phase interpolator can be different from the fourth weighting factor $w_{i,4}$ of the respective phase interpolator. Furthermore, the third weighting factor $w_{i,3}$ of a respective phase interpolator can be different from the first weighting factor $w_{i,1}$ and/or the second weighting factor $w_{i,2}$ of the respective phase interpolator.

For example, for each phase interpolator a ratio of the third weighting factor $w_{i,3}$ to the fourth weighting factor $w_{i,4}$ of the respective phase interpolator can correspond to (e.g., be equal to) the ratio of the first weighting factor $w_{i,1}$ to the second weighting factor $w_{i,2}$ of the respective phase interpolator.

Additionally or alternatively, for each phase interpolator the ratio of the third weighting factor $w_{i,3}$ to the fourth weighting factor $w_{i,4}$ can correspond to a sum of the non-negative integer constant C and a respective number of $l_{i,3}$ serially connected phase shifters coupled between the input port 112 and the third input terminal of the respective phase interpolator divided by $(n-l_{i,3}-C)$.

According to some examples, the third weighting factor $w_{i,3}$ can equal the first weighting factor $w_{i,1}$ of a respective phase interpolator and/or the fourth weighting factor $w_{i,4}$ can equal the second weighting factor $w_{i,2}$ of the respective phase interpolator.

Figure 2C:
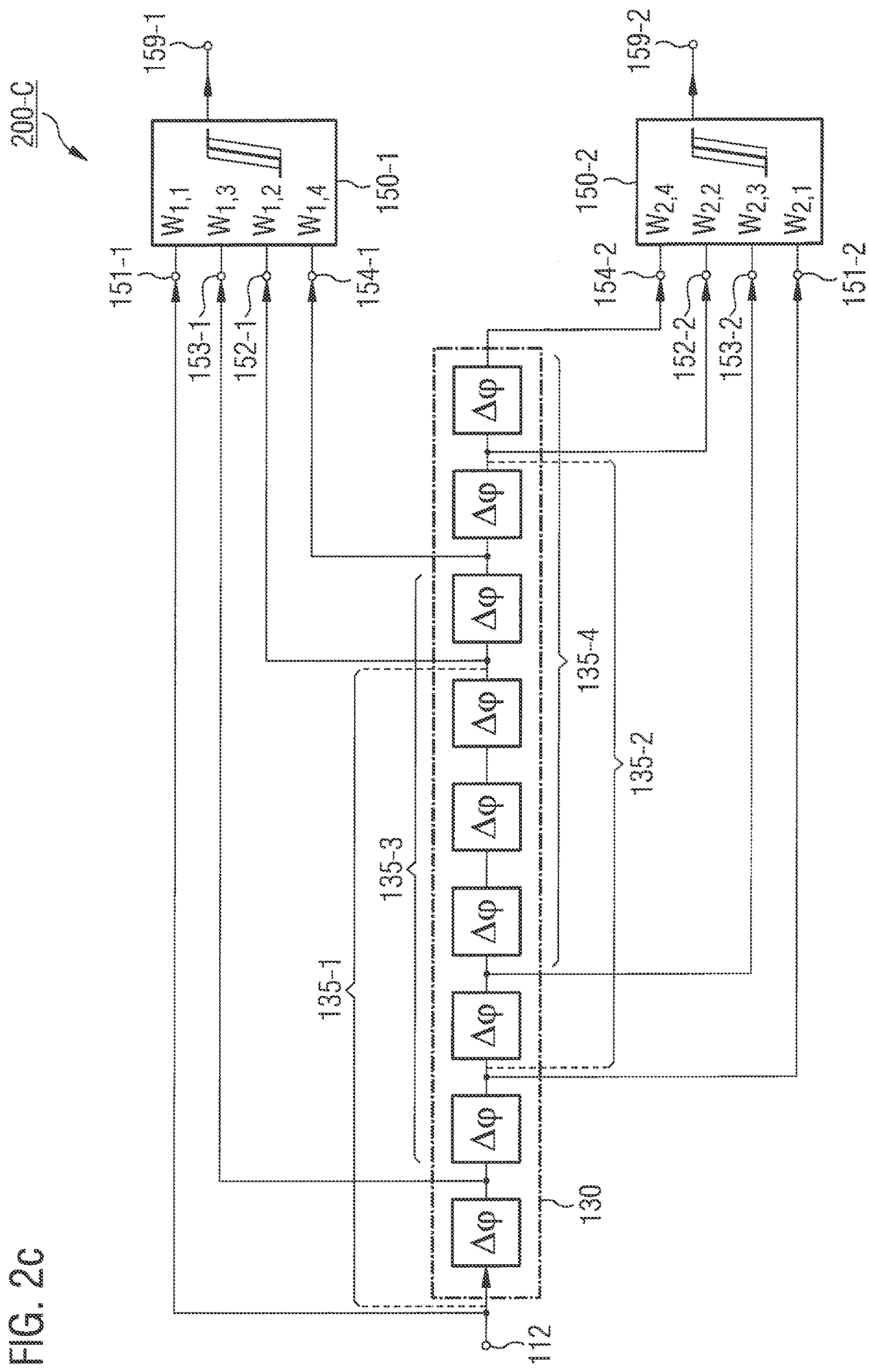
FIG. 2*c* shows a block diagram of a multiphase signal generator whose phase interpolators comprise more than two input terminals.

FIG. 2c shows an example of a multiphase signal generator 200-C whose respective phase interpolators 150-1, 150-2 comprise more than two input terminals. In this example, each phase interpolators 150-1, 150-2 comprises four input terminals. In this example, $w_{i,1}=w_{i,3}$ and $w_{i,2}=w_{i,4}$.

The multiphase signal generator 200-C comprises a plurality 130 of phase shifters. The plurality 130 of phase shifters comprises nine serially connected phase shifters that each provide an identical phase shift Δφ. For being serially connected, an output terminal of a preceding phase shifter is connected to an input terminal of a succeeding phase shifter. The input terminal of a first phase shifter of the plurality 130 of phase shifters is connected to an input port 112 of the multiphase signal generator 200-C. The plurality 130 of phase shifters comprises four subsets of phase shifters 135-1, 135-2, 135-3, and 135-4. Each subset of phase shifters comprises n=6 phase shifters. The first subset 135-1 comprises the first to sixth phase shifter (as counted from the input port 112) of the plurality 130 of phase shifters. The second subset 135-2 comprises the third to eighth phase shifter of the plurality 130 of phase shifters, so that the first and second subset have the third to sixth phase shifter of the plurality 130 of phase shifters in common. The third subset 135-3 comprises the second to seventh phase shifter of the plurality 130 of phase shifters, so that the first and third subset have the second to sixth phase shifter of the plurality 130 of phase shifters in common, and the second and third subset have the third to seventh phase shifter of the plurality 130 of phase shifters in common. The fourth subset 135-4 comprises the fourth to ninth phase shifter of the plurality 130 of phase shifters, so that the first and fourth subset have the fourth to sixth phase shifter of the plurality 130 of phase shifters in common, the second and fourth subset have the fourth to eighth phase shifter of the plurality 130 of phase shifters in common, and the third and fourth subset have the fourth to seventh phase shifter of the plurality 130 of phase shifters in common. The common usage of phase shifters can reduce the number of phase shifters and hence hardware complexity of the multiphase signal generator 200-C.

The first input terminal 151-1 of the first phase interpolator 150-1 of the multiphase signal generator 200-C is connected to the input port 112 of the multiphase signal generator 200-C. The first subset 135-1 of phase shifters is coupled between the first input terminal 151-1 and the second input terminal 152-1 of the first phase interpolator 150-1. The third subset 135-3 of phase shifters is coupled between the third input terminal 153-1 and the fourth input terminal 154-1 of the first phase interpolator 150-1. The second subset 135-2 of phase shifters is coupled between the first input terminal 151-2 and the second input terminal 152-2 of the second phase interpolator 150-2 of the multiphase signal generator 200-C. The fourth subset 135-4 of phase shifters is coupled between the third input terminal 153-2 and the fourth input terminal 154-2 of the second phase interpolator 150-2.

The ratio of the first to the second weighting factor for each phase interpolator 150-1, 150-2 can again be given by Equation 2.1. The number of $l_1$ serially connected phase shifters coupled between the input port 112 and the first input terminal 151-1 of the first phase interpolator 150-1 is equal to zero. Choosing, for example, the non-negative integer constant C being equal to 2, Equation 2.1 yields:

$$\frac{w_{1,1}}{w_{1,2}} = \frac{C+l_1}{n-l_1-C} = \frac{2+0}{6-0-2} = \frac{1}{2},$$

so that $w_{1,1}$ and hence $w_{1,3}$ may each be set to 1, and $w_{1,2}$ and hence $w_{1,4}$ may each be set to 2.

For the second phase interpolator 150-2 there are $l_2=2$ serially connected phase shifters coupled between the input port 112 and its first input terminal 151-2. Evaluating Equation 2.1 for the second phase interpolator 150-2 thus yields:

$$\frac{w_{2,1}}{w_{2,2}} = \frac{C+l_2}{n-l_2-C} = \frac{2+2}{6-2-2} = \frac{2}{1},$$

so that $w_{2,1}$ and hence $w_{2,3}$ may each be set to 2, and $w_{2,2}$ and hence $w_{2,4}$ may each be set to 1.

Applying Equation 1.2 for a phase interpolator with four input terminals, the phase $\psi_i$ of a respective output signal of a respective phase interpolator 150-1, 150-2 can be expressed by Equation 4.1:

$$\psi_i = \frac{1}{w_{i,1}+w_{i,2}+w_{i,3}+w_{i,4}}(w_{i,1}\varphi_{i,1}+w_{i,2}\varphi_{i,2}+w_{i,3}\varphi_{i,3}+w_{i,4}\varphi_{i,4}).$$

For the phase interpolation, each phase interpolator 150-1, 150-2 may use a next period (and/or next pulse) of the respective signals at its first and third input terminal due to the respective subsets of phase shifters being coupled between the first and the second input terminal and the third and fourth input terminal, respectively.

The phase $\psi_1$ of the first output signal of the first phase interpolator 150-1 can then be given by Equation 4.2:

$$\psi_1 = \frac{1}{6}((\varphi_0+360°)+2(\varphi_0+6\Delta\varphi)+(\varphi_0+\Delta\varphi+360°)+2(\varphi_0+7\Delta\varphi)),$$

$$\psi_1 = \varphi_0+120°+\frac{27\Delta\varphi}{6}.$$

The phase $\psi_2$ of the second output signal of the second phase interpolator 150-2 can be given by Equation 4.3:

$$\psi_2 = \frac{1}{6}(2(\varphi_0+360°+2\Delta\varphi)+$$

$$(\varphi_0+8\Delta\varphi)+2(\varphi_0+360°+3\Delta\varphi)+(\varphi_0+9\Delta\varphi)),$$

$$\psi_2 = \varphi_0+240°+\frac{27\Delta\varphi}{6}.$$

Hence, a phase relationship $\Delta\psi_{21}$ (e.g., a phase difference) between the first and the second output signal can then be expressed by Equation 4.4:

$$\Delta\psi_{21}=\psi_2-\psi_1=120°.$$

This shows that also for the case of phase interpolators with more than two input terminals, the phase relationship $\Delta\psi_{21}$ between their respective output signals can be independent of the (exact) phase shift $\Delta\varphi$ of the phase shifters of the plurality 130 of phase shifters. Hence, an accurate phase relationship $\Delta\psi_{21}$ can be provided by the multiphase signal generator 200-C.

Turning back to FIG. 1, in order to facilitate the respective phase interpolators 150-1, 150-2 interpolating a signal at their respective second input terminals with a later period (e.g., the next period, or a later pulse) of a signal at their respective first input terminals, the first subset 135-1 and the second subset 135-2 of the plurality 130 of phase shifters can each be configured to provide a phase shift of 360° within a predefined tolerance range. In this way, the additional 360° can be introduced in Equation 2.5.

A phase interpolator may have a limited linear interpolation range with respect to the phase difference of its input signals. The linear interpolation range can define a maximal phase difference between input signals of the phase interpolator for which the phase interpolator can perform the interpolation. For example, for a phase interpolator with two input terminals, the rising (and/or falling) edges of pulses at the respective input terminals may be maximally spaced by the linear interpolation range apart from each other to enable the phase interpolator performing a phase interpolation according to Equation 1.1.

According to some examples, the predefined tolerance range, within which the first subset 135-1 and the second subset 135-2 of the plurality 130 of phase shifters can provide a phase shift of 360°, may be at most as large as a minimal linear interpolation range of the first and the second phase interpolator 150-1, 150-2. The minimal linear interpolation range of the first and the second phase interpolator 150-1, 150-2 may correspond to that linear interpolation range of the first or the second phase interpolator 150-1, 150-2, whichever is smaller (or the smallest) with respect to each other.

Optionally, the multiphase signal generator 100 can further comprise a signal splitter (not shown in FIG. 1). The signal splitter can be coupled between two phase shifters (e.g., two serially connected phase shifters of the plurality 130 of phase shifters). An input terminal of the signal splitter can be connected to an output terminal of a phase shifter preceding the signal splitter. A first output terminal of the signal splitter can be connected to an input terminal of another phase shifter succeeding the preceding phase shifter. A second output terminal of the signal splitter can be coupled to an output port of the multiphase signal generator. In this way, the multiphase signal generator 100 can provide an additional output signal with a fixed phase relationship to the output signals provided by the first and the second phase interpolator 150-1, 150-2.

For example, the phase shifter preceding the signal splitter can be an $(n-C)^{th}$ phase shifter of the plurality of phase shifters counted from the input port. A phase $\psi_3$ of a third output signal of the multiphase signal generator 100 at the second output terminal of the signal splitter (and/or at the output port connected to the second output terminal of the signal splitter) can then be given by Equation 5.1:

$$\psi_3=\varphi_0+(n-C)\Delta\varphi,$$

where $\varphi_0$ denotes again the phase of a signal at the input port 112.

The phase relationship $\psi_{31}$ (e.g., the phase difference) between the third and the first output signal and the phase relationship $\psi_{32}$ (e.g., the phase difference) between the third and the second output signal can then be derived from Equation 5.1 and Equation 3.2 and Equation 3.3, respectively, and be expressed by Equation 5.2 and 5.3. Equation 5.2:

$$\Delta \psi_{31} = \psi_3 - \psi_1 = \frac{C + l_1}{n} \cdot 360°.$$

Equation 5.3:

$$\Delta \psi_{32} = \psi_3 - \psi_2 = \frac{C + l_2}{n} \cdot 360°.$$

From Equation 5.2 and 5.3 it can be deduced that the phase relationships $\psi_{31}$ and $\gamma_{32}$ can be independent of the phase shifts $\Delta \varphi$ of the phase shifters of the plurality 130 of phase shifters as long as the phase shifts $\Delta \varphi$ are identical (neglecting manufacturing tolerances). Optionally corresponding circuit schematics of the phase shifters of the plurality 130 of phase shifters can facilitate an implementation of identical phase shifts $\Delta \varphi$. As a result, accurate phase relationships $\Delta \psi_{21}$, $\Delta \psi_{31}$, and $\Delta \psi_{32}$ between the output signals of the multiphase signal generator 100 can be obtained.

Optionally, the multiphase signal generator 100 can further comprise a delay circuit (not shown). The delay circuit can be coupled between the second output terminal of the signal splitter and the output port of the multiphase signal generator 100 (at which the third output signal is provided). A delay of the delay circuit can correspond to (e.g., be equal to) a delay of at least one of the first and the second phase interpolator 150-1, 150-2. This way, the third output signal may experience the same delay as the first and/or the second output signal when being processed by the first and the second phase interpolator 150-1, 150-2, respectively. This can enhance the accuracy of the phase relationships $\Delta \psi_{31}$ and $\Delta \psi_{32}$.

For example, the delay circuit can be a transmission line tuned to a length providing the same delay as the first and/or the second phase interpolator 150-1, 150-2. Alternatively, the delay circuit can be a lumped element filter, a distributed filter, or a phase shifter, for example.

According to an example, the multiphase signal generator 100 additionally comprises a third phase interpolator coupled between the signal splitter and the output port (at which the third output signal is provided). The second output terminal of the signal splitter can be connected to both a first and a second input terminal of the third phase interpolator. An output terminal of the third phase interpolator is connected to the output port (at which the third output signal is provided). In other words, by connecting the first and the second input terminal of the third phase interpolator to the second output terminal of the signal splitter, the third phase interpolator may be employed as a delay circuit. This way, the third output signal may experience the same delay as the first and/or the second output signal when being processed by the first and the second phase interpolator 150-1, 150-2, respectively. In turn, this can lead to more accurate phase relationships $\Delta \psi_{31}$ and $\Delta \psi_{32}$. This can be further supported by corresponding circuit schematics of the first, second, and third phase interpolator.

So far the multiphase signal generator 100 has been illustrated in terms of two phase shifters (e.g., the first and the second phase shifter 150-1, 150-2) and the optional third phase interpolator which may be used as a delay circuit. However, this disclosure does not limit the number of phase interpolators of the multiphase signal generator 100. The multiphase signal generator 100 can comprise more than two phase interpolators (or more than three phase interpolators) in order to provide more output signals that have accurate phase relationships with respect to each other.

According to an example, the multiphase signal generator 100 comprises a number of (n−1) phase interpolators. The number n may be larger than 2 (or larger than 3, or larger than 4, or larger than 5, or larger than 6, or even larger). The plurality 130 of phase shifters may comprise a number of at least (2n−2) phase shifters. For each phase interpolator a different subset of phase shifters comprising n phase shifters can be coupled between the first and the second input terminal of the respective phase interpolator.

Figure 2D:
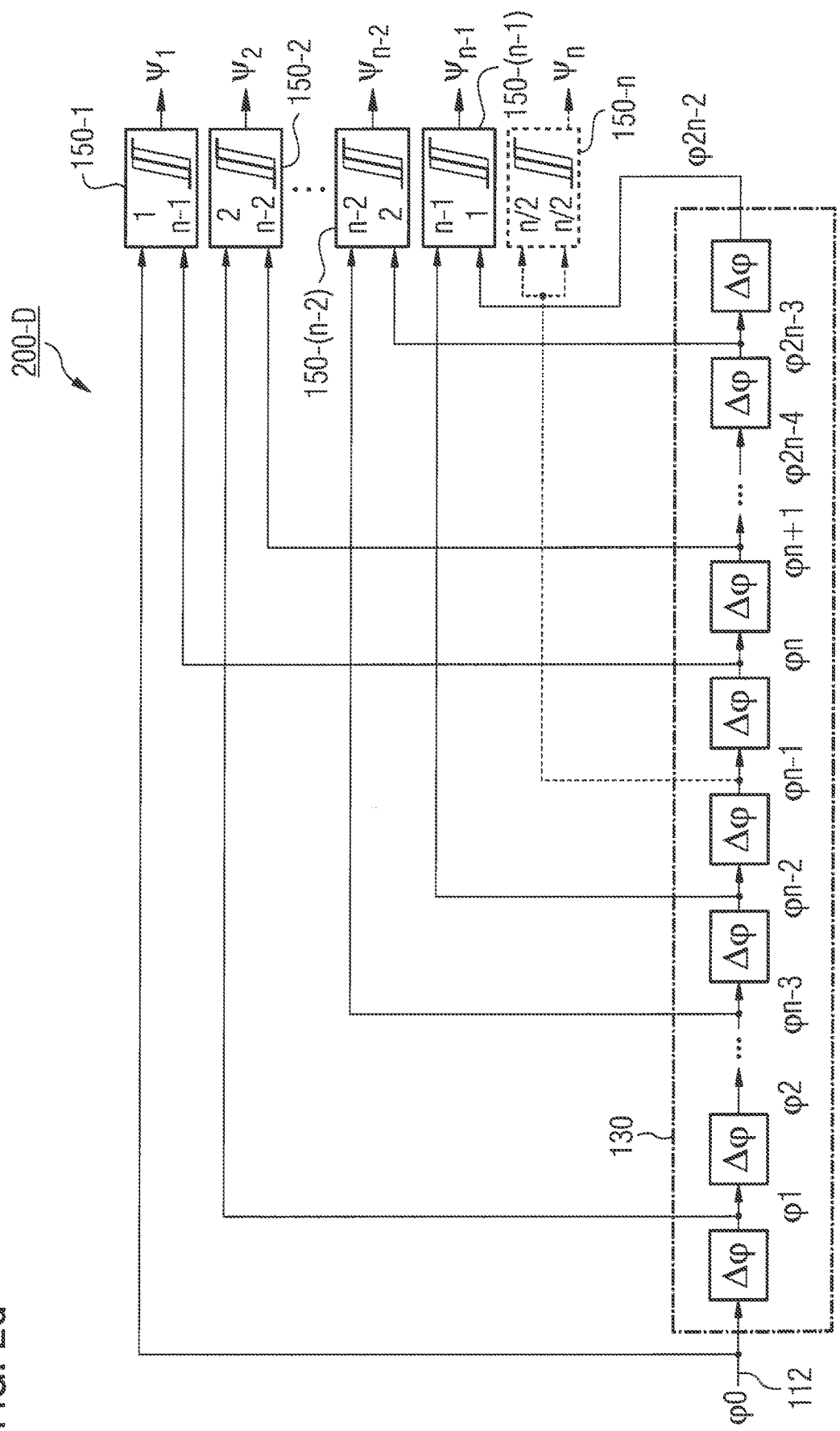
FIG. 2*d* shows a block diagram of a multiphase signal generator with serially connected phase shifters.

An example of such a multiphase signal generator 200-D is shown in FIG. 2d. The (2n−2) phase shifters of the plurality 130 of phase shifters of the multiphase signal generator 200-D are connected in series. Due to this series connection, the multiphase signal generator 200-D may have a reduced hardware complexity with respect to other examples of multiphase signal generators.

A number of $l_i = (i-1)$ serially connected phase shifters is coupled between a respective first input terminal of the i-th (i=1, 2, . . . , n−1) phase interpolator of the multiphase signal generator 200-D and the input port 112 of the multiphase signal generator 200-D. For the multiphase signal generator 200-D, the non-negative integer constant C has been set to 1. Hence, according to Equation 2.1, for the i-th phase interpolator the ratio of the first to the second weighting factor can be:

$$\frac{w_{i,1}}{w_{i,2}} = \frac{C + l_i}{n - l_i - C} = \frac{1 + i - 1}{n - (i - 1) - 1} = \frac{i}{n - i}.$$

As shown in FIG. 2d, the first weighting factor $w_{i,1}$ of the i-th phase interpolator is set to equal to i, while the second weighting factors $w_{i,2}$ of the i-th phase interpolator is set to (n−i).

From Equation 3.1, the phase of the i-th output signal of the multiphase signal generator 200-D provided by the i-th phase interpolator at its respective output terminal can then be $$\psi_i = \varphi_0 + \frac{i}{n} \cdot 360° + (n - 1)\Delta \varphi.$$

The phase relationship (e.g., the phase difference) between the i-th output signal and a j-th output signal (j=1, 2, . . . , n−1; i≠j) can then be $$\Delta \psi_{ji} = \psi_j - \psi_i = \frac{j - i}{n} \cdot 360°.$$

Consequently, accurate phase relationships between the output signals of the multiphase signal generator 200-D can be provided independent of the value of the (identical) phase shift $\Delta \varphi$ of each of the plurality 130 of phase shifters. Furthermore, the multiphase signal generator 200-D can provide output signals that are equally spaced in phase (e.g., spaced by 360°/n).

Turning back to FIG. 1, the multiphase signal generator 100 can optionally comprise an $n^{th}$ phase interpolator. Both the first and the second input terminal of the $n^{th}$ phase interpolator can be connected to an output terminal of an $(n-C)^{th}$ phase shifter in a series connection of phase shifters counted from the input port 112. This is exemplarily shown for the multiphase signal generator 200-D of FIG. 2d, where C=1 and the output terminal of the $(n-1)^{th}$ phase shifter (as counted from the input port 112 of the multiphase signal generator 200-D) is connected via a signal splitter to the first and the second input terminal of the n-th phase interpolator of the multiphase signal generator 200-D. The phase $\psi_n$ of an n-th output signal of the multiphase signal generator 200-D can then be given by $$\psi_n = \varphi_0 + (n-1)\Delta\varphi,$$

which can make the phase relationship $\Delta\psi_{ni}$ between the n-th output signal and the i-th output signal of the multiphase signal generator 200-D independent of the phase shift $\Delta\varphi$ and can hence result in an accurate phase relationship $\Delta\psi_{ni}$. With the $n^{th}$ phase interpolator, the multiphase signal generator 200-D can provide n output signals that are equally spaced in phase over 360°, e.g., spaced by 360°/n in phase. For example, if n=3, the multiphase signal generator 200-D can provide three output signals that are spaced by 120° in phase with respect to each other. If n=4, the multiphase signal generator 200-D can provide four output signals that are spaced by 90° in phase with respect to each other, for example.

Optionally, the multiphase signal generator 200-D can comprise additional phase shifters connected in series and coupled between the input terminal of the first phase interpolator 150-1 and the input port 112.

Turning back to FIG. 1, one or more signal splitters may be employed for coupling a subset 135-1, 135-2 of phase shifters between two input terminals of a phase shifter 150-1, 150-2. For example, the multiphase signal generator 100 can comprise a plurality of signal splitters. For each respective subset of phase shifters that is coupled between the first and the second input terminal of a respective phase interpolator, a respective signal splitter of the plurality of signal splitters can be configured to provide an input signal of a first phase shifter of the respective subset of phase shifters to the first input terminal of the respective phase interpolator. The first phase shifter of the respective subset of phase shifters may be the phase shifter that is closest to the input port 112 with respect to the phase shifters of the respective subset (e.g., has the least number of phase shifters coupled between itself and the input port 112).

Optionally, for at least one subset of phase shifters that is coupled between the first and the second input terminal of a respective phase interpolator, another respective signal splitter of the plurality of signal splitters can be configured to provide an output signal of a last phase shifter of the respective subset of phase shifters to the second input terminal of the respective phase interpolator. The last phase shifter of the respective subset of phase shifters may be the phase shifter that is furthest from the input port 112 with respect to the phase shifters of the respective subset (e.g., has the highest number of phase shifters coupled between itself and the input port 112).

For example, a signal splitter can comprise a Wilkinson divider, a resistive divider, a directional coupler, and/or a transmission line junction. For accurate phase relationships of the output signals of the multiphase signal generator 100, the signal splitters of the plurality of signal splitter can have corresponding circuit schematics. Within the context of the present disclosure, two serially connected phase shifters may have a signal splitter coupled in between them and may still be referred to as serially connected.

Figure 3:
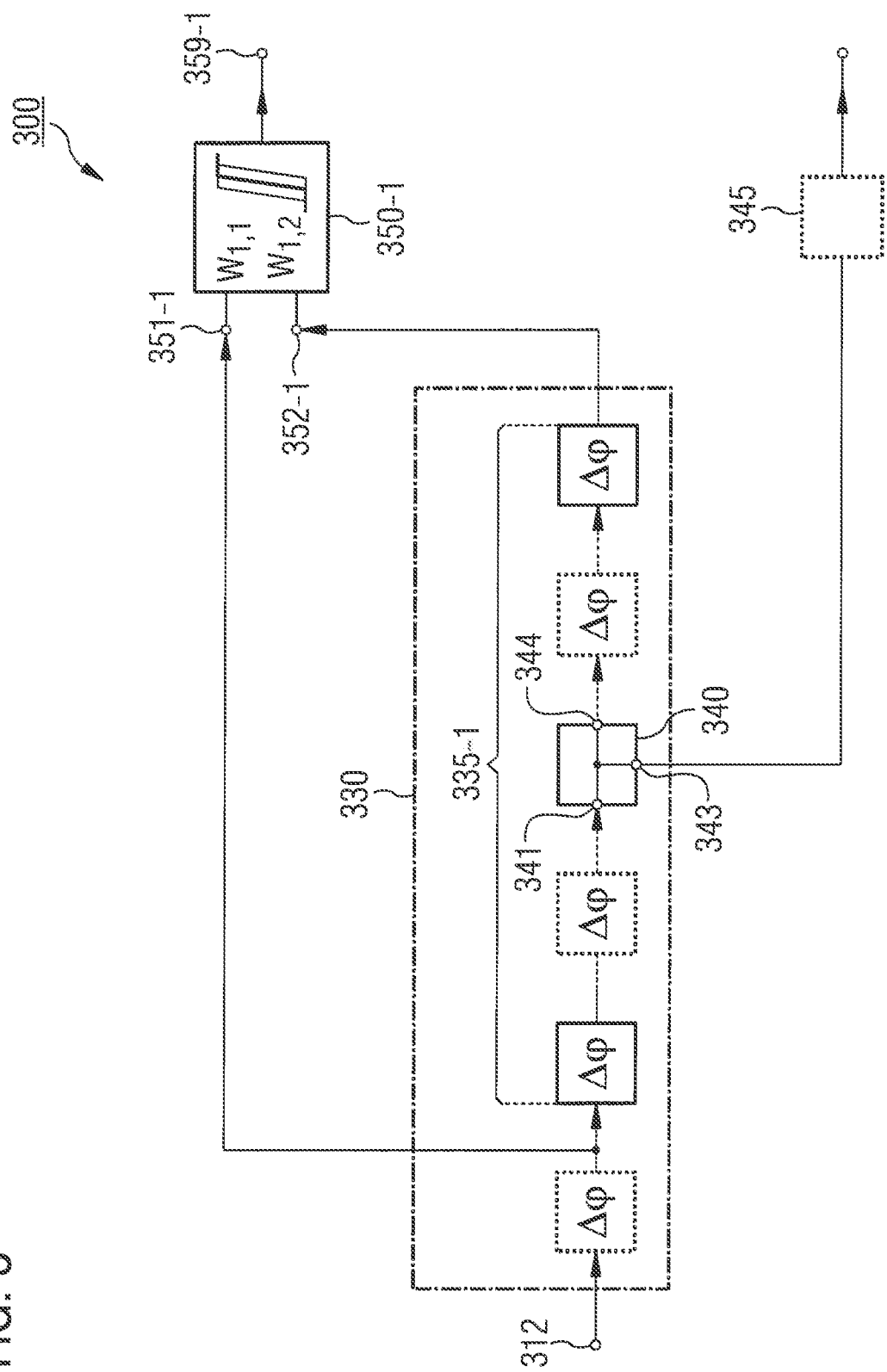
FIG. 3 shows a block diagram of a multiphase signal generator with a phase interpolator and a signal splitter.

FIG. 3 shows a block diagram of another multiphase signal generator 300. The multiphase signal generator 300 comprises an input port 312. Furthermore, the multiphase signal generator 300 comprises a plurality 330 of phase shifters. Each phase shifter is configured to provide an identical phase shift $\Delta\varphi$. At least one phase shifter is connected to the input port 312. Furthermore, the multiphase signal generator 300 comprises at least one phase interpolator 350-1. The phase interpolator 350-1 is configured to weight a phase of a signal at a first input terminal 351-1 of the phase interpolator 350-1 with a first weighting factor $w_{1,1}$ and to weight a phase of another signal at a second input terminal 352-1 of the phase interpolator 350-1 with a second weighting factor $w_{1,2}$ to generate an interpolated phase signal at an output terminal 359-1 of the phase interpolator 350-1. A subset 335-1 of the plurality of phase shifters 330 comprises n>1 serially connected phase shifters. The subset 335-1 of the plurality of phase shifters is coupled between the first input terminal 351-1 and the second input terminal 352-1 of the phase interpolator 350-1. Furthermore, the multiphase signal generator 300 comprises a signal splitter 340 coupled between two serially connected phase shifters of the plurality 330 of phase shifters. The signal splitter 340 is configured to provide an output signal of a phase shifter preceding the signal splitter at an output terminal 343 of the signal splitter 340.

The multiphase signal generator 300 can provide a first output signal with a phase $\psi_1$ at the output terminal 359-1 of the phase interpolator 350-1 and a second output signal with a phase $\psi_2$ at the output terminal 343 of the signal splitter 340. This way, at least two output signals of a given phase relationship $\Delta\psi_{21} = \psi_2 - \psi_1$ can be provided by the multiphase signal generator 300. To this end, the multiphase signal generator 300 can comprise a first output port and a second output port. The first output port can be connected to (or coincide with) the output terminal of the phase interpolator 350-1. The second output port can be connected to (or coincide with) the output terminal 343 of the signal splitter 340. The multiphase signal generator 300 may then provide the first output signal of phase $\psi_1$ at its first output port and the second output signal of phase $\psi_2$ at its second output port.

For coupling the signal splitter 340 between two serially connected phase shifters of the plurality 130 of phase shifters, an input terminal 341 of the signal splitter can be connected to the output terminal of the phase shifter preceding the signal splitter (with respect to a signal coming from the input port 312 and traveling through the plurality of phase shifters) and a second output terminal 344 of the signal splitter 340 can be connected to an input terminal of a phase shifters of the plurality 130 of phase shifters succeeding the signal splitter 340.

Optionally, a ratio of the first weighting factor $w_{1,1}$ to the second weighting factor $w_{1,2}$ of the phase interpolator 350-1 can correspond to a sum of a non-negative integer constant C and a number $l_i$ of phase shifters coupled between the input port 312 and the first input terminal 351-1 of the phase interpolator 350-1 divided by $(n-l_1-C)$. Additionally, the phase shifter preceding the signal splitter can be an $(n-C)^{th}$ phase shifter in a series connection of phase shifters counted from the input port 312.

The ratio of the first weighting factor $w_{1,1}$ to the second weighting factor $w_{1,2}$ of the phase interpolator 350-1 can be given by Equation 6.1:

$$\frac{w_{1,1}}{w_{1,2}} = \frac{C + l_1}{n - l_1 - C}.$$

Analogously to Equation 3.1, the phase of the first output signal of the multiphase signal generator 300 can then be given by Equation 6.2:

$$\psi_1 = \varphi_0 + \frac{C+l_1}{n} \cdot 360° + (n-C)\Delta\varphi,$$

where $\varphi_0$ represents the phase of a signal at the input port 312 of the multiphase signal generator 300. If the phase shifter preceding the signal splitter is the $(n-C)^{th}$ phase shifter in a series connection of phase shifters counted from the input port 312, the phase $\psi_2$ of the second output signal of the multiphase signal generator 300 can be given by Equation 6.3:

$$\psi_2 = \varphi_0 + (n-C)\Delta\varphi.$$

The phase relationship $\Delta\psi_{21}$ between the first and the second output signal can then be expressed by Equation 6.4:

$$\Delta\psi_{21} = \psi_2 - \psi_1 = \frac{C+l_1}{n} \cdot 360°.$$

Equation 6.4 shows that the phase relationship $\Delta\psi_{21}$ can be independent of the value of the phase shift $\Delta\varphi$ of each of the plurality 130 of phase shifters. This can result in an accurate phase relationship $\Delta\psi_{21}$.

The multiphase signal generator 300 can optionally comprise a delay circuit 345. The delay circuit 345 can be coupled between the output terminal 343 of the signal splitter 340 and the second output port of the multiphase signal generator 300. A delay of the delay circuit 345 can correspond to (e.g., be equal to) a delay of the phase interpolator 350-1. For example, the delay of the delay circuit 345 can be equal to the delay of the phase interpolator 350-1 (neglecting manufacturing tolerances). This way, accuracy of the phase relationship $\Delta\psi_{21}$ can be further enhanced. In an actual implementation of the multiphase signal generator 300, the accuracy of the phase relationship $\Delta\psi_{21}$ may correspond to the relative deviation of the phase relationship $\Delta\psi_{21}$ from the value computed according to Equation 6.4.

Alternatively, the multiphase signal generator 300 can comprise a second phase interpolator. The output terminal 343 of the signal splitter 340 can be connected to both a first input terminal and a second input terminal of the second phase interpolator. The second phase interpolator may then apply a delay to the second output signal similar (or equal) to the delay that is applied by the first phase interpolator to the first output signal of multiphase signal generator 300. This can further enhance accuracy of the phase relationship $\Delta\psi_{21}$.

In addition, the second phase interpolator can be configured to weight a phase of a signal at its first input terminal with the same weighting factor as applied by the second phase interpolator for weighting the phase of the signal at its second input terminal to generate a signal at an output terminal of the second phase interpolator. In other words, the output signal of the output terminal 343 of the signal splitter 340 can arrive at the first and the second input terminal of the second phase interpolator, where it can be weighted with the same weighting factor for generating the second output signal of the multiphase signal generator 300. This can further enhance accuracy of the phase relationship $\Delta\psi_{21}$.

The multiphase signal generator 300 may comprise one or more additional features mentioned in context of FIGS. 1-2d. In some examples, the subset 335-1 of phase shifters may comprise all phase shifters of the plurality 330 of phase shifters. Furthermore, in some examples, the multiphase signal generator 300 may comprise one or more additional phase interpolators with a respective subset of n phase shifters being coupled between a respective first and a respective second input terminal of the additional phase interpolator(s). This way, the multiphase signal generator 300 can be configured to provide more than two output signals of accurate phase relationship with respect to each other.

According to at least some examples of the present disclosure, multiphase signal generators can be realized as integrated circuits (or as parts of an integrated circuit) and/or on a printed circuit board comprising several electronic devices mounted onto the printed circuit board and being interconnected with each other by transmission lines. Of course, multiphase signal generators may comprise further electronic components, such as amplifiers, filtering circuitry, matching circuitry, and/or power supply circuitry. Multiphase signal generators may comprise an own housing (e.g., a shielded housing) and/or may be stand-alone electronic devices.

According to another aspect of the present disclosure, it is provided a multiphase signal generator that is configured to generate $3 \cdot n$ ($n \in \mathbb{N}$) output phases that can exhibit phase differences of $360°/(3 \cdot n)$, e.g., 120°, 60°, 30°, . . . . The proposed principle can be a feed forward open-loop architecture. Hence, complicated feedback structures may be avoided, that may in other multiphase signal generators increase circuit overhead and/or may raise concerns about the system stability.

Apart from using the $360°/(3 \cdot n)$ spaced phases, at least some multiphase signal generators of the present disclosure can be used as frequency multipliers and/or as a clock multipliers, amongst other applications. In that case, the individual phases can be combined into a single output signal that can have a frequency that is $3 \cdot n$ times (e.g. ×3, ×6, . . . ) an input frequency of the multiphase signal generator (e.g., in the case of a 50% input duty cycle, using rising and falling transitions) or that is $3 \cdot n/2$ times (e.g. ×1.5, ×3, . . . ) the input frequency of the multiphase signal generator (for any input duty cycle, using either rising or falling edges).

At least some multiphase signal generators according to the present disclosure can overcome issues exhibited in other multiphase generators such as the need for accurately (analog) tunable delay elements and/or complicated feedback structures. At least some multiphase signal generators according to the present disclosure can make use of matched phase shifts (e.g. time delays) and of weighted linear phase interpolation that can depend on device matching. The architecture(s) of at least some multiphase signal generators according to the present disclosure can be a feasible candidate (or feasible candidates) for battery powered operation offering reduced power consumption for given noise and jitter constraints.

Figure 4A:
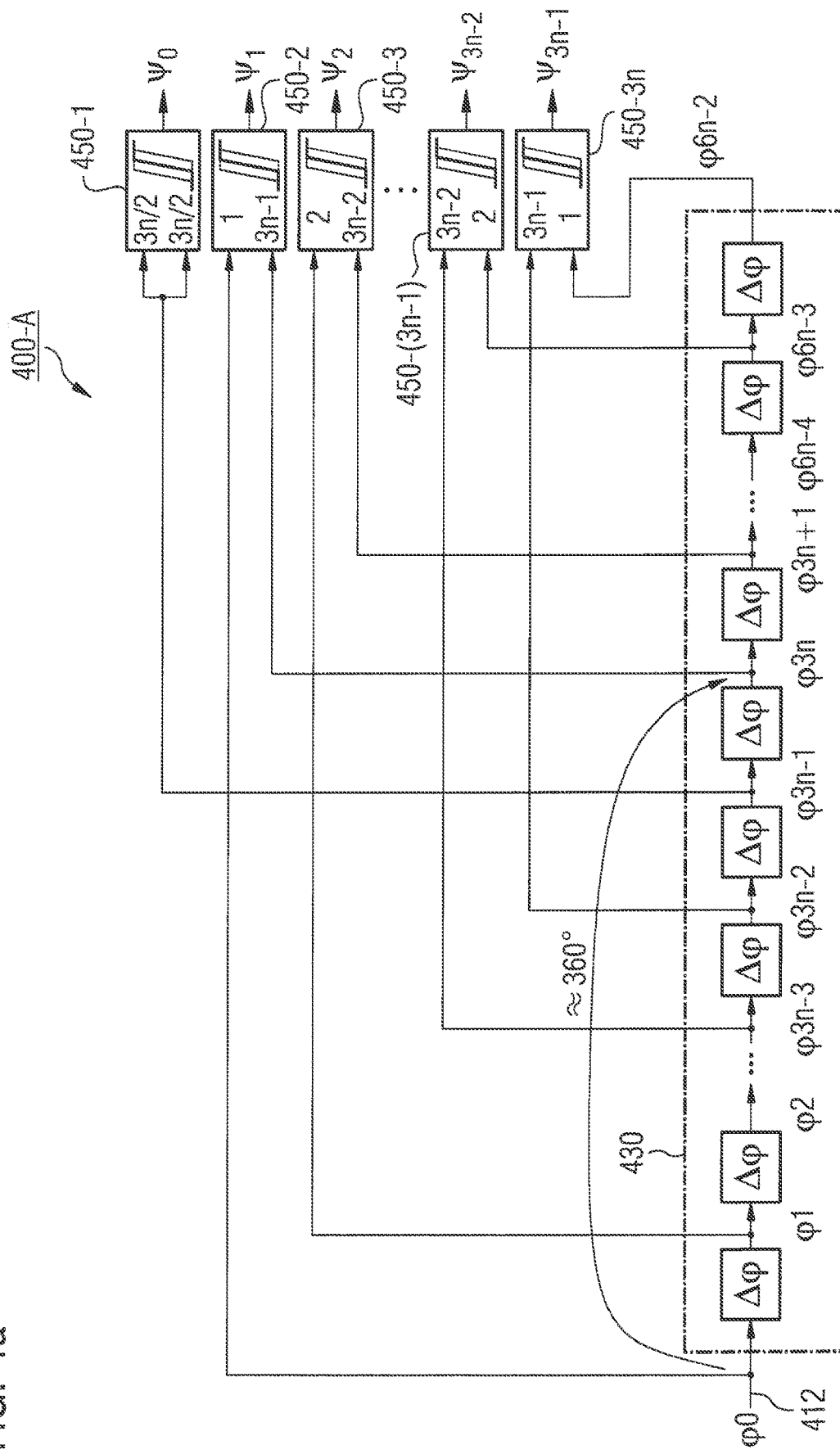
FIG. 4*a* shows a block diagram of another multiphase signal generator with output signals spaced 360°/(3·n) in phase.

FIG. 4a shows a block diagram of a multiphase signal generator 400-A with output signals spaced $360°/(3 \cdot n)$ in phase. The multiphase signal generator 400-A comprises a plurality 430 of at least $(6 \cdot n - 2)$ serially connected phase shifters ($n \geq 1$). The serially connected phase shifters are configured to each provide an identical phase shift $\Delta\varphi$. An input port 412 of the multiphase signal generator 400-A is connected to a first phase shifter of the plurality 430 of serially connected phase shifters. Furthermore, the multiphase signal generator 400-A comprises a plurality of at least 3·n phase interpolators 450-1, . . . , 450-3n. Each phase interpolator comprises two input terminals. The (phase) interpolators' weights are annotated at the respective input terminals. The two input terminals of a first phase interpolator 450-1 of the plurality 430 of phase interpolators are both connected to the output terminal of the (3n−1)-th phase shifter (as counted from the input port 412) of the serially connected phase shifters. (3n−1) different subsets of the plurality 430 of phase shifters each comprise a number of 3·n phase shifters. A respective subset of phase shifters is coupled between the two input ports of a respective phase interpolator 450-2, 450-3, . . . , 450-(3n−1), 450-3n. Furthermore, each phase interpolator 450-1, 450-2, 450-3, . . . , 450-(3n−1), 450-3n is configured to provide an output signal of the multiphase signal generator 400-A with a respective phase $\psi_i$ (i=0, . . . , 3 n−1).

The proposed circuit of the multiphase signal generator 400-A is configured to generate (6·n−2) auxiliary phases $\varphi_k$ (k=1, . . . , 6·n−2) from its input phase $\varphi_0$ all shifted consecutively by $\Delta\varphi$ as shown in FIG. 4a. The k-th phase $\varphi_k$ can then be expressed by Equation 7.1:

$$\varphi_k = \mu_0 + k \cdot \Delta\varphi$$

To generate the 360°/(3·n) spaced output phases, phases from the next input period ($\psi_k$ for k<3·n−1) and the current period ($\varphi_k$ for k>3·n−1) (that can be sufficiently delayed) can be interpolated to yield the desired outputs. The i-th output $\varphi_i$ (i=1, . . . , 3·n−1) can be created by interpolating the two phases $\varphi_{i-1}$. (using the transition already of the next period, hence the additional 360° in the formula) and $\varphi_{3n-1+i}$ (delayed transition of the current period) with the weights i/(3·n) and (3·n−i)/(3·n), respectively. The value of $\psi_i$ can then be expressed by Equation 7.2:

$$\psi_i = [i \cdot (\varphi_{i-1} + 360°) + (3 \cdot n - i) \cdot \varphi_{3n-1+i}]/(3 \cdot n),$$

$$\psi_i = \varphi_0 + (3 \cdot n - 1) \cdot \Delta\varphi + i/(3 \cdot n) \cdot 360°.$$

These weighted interpolations are also shown in FIG. 4a. To facilitate practical phase interpolation, the phase shifts $\Delta\varphi$ can be chosen so that $\Delta\varphi \approx 360°/(3 \cdot n)$ and $\varphi_{3n} \approx \varphi_0 + 360°$. Hence the phases $\varphi_i$ and $\varphi_{3n+1}$ that are used for interpolation can be close. As seen in the above equations, there may be no need for exact absolute phase or delay matching, the single phase shifts (e.g., of the phase shifters of the plurality 430 of phase shifters) may only match each other.

The proposed circuit (e.g., the multiphase signal generator 400-A) can generate 360°/(3·n) without the need for precisely tuned delay elements as in other multiphase generators, such as delay locked loops and the like. The proposed concept can optionally be implemented with digital-like sub-circuits and can therefore exhibit small silicon area usage and can be highly suitable for very deep submicron technologies while offering low power consumption.

Equation 7.2 can be derived as follows:

$$\psi_i = [i \cdot (\varphi_{i-1} + 360°) + (3 \cdot n - i) \cdot \varphi_{3n-1+i}]/(3 \cdot n)$$

$$= [i \cdot (\varphi_0 + (i-1) \cdot \Delta\varphi + 360°) + (3 \cdot n - i) \cdot$$

$$(\varphi_0 + (3 \cdot n - 1 + i) \cdot \Delta\varphi)]/(3 \cdot n)$$

$$= [i \cdot \varphi_0 + (3n - i)\varphi_0 + i(i-1)\Delta\varphi +$$

$$(3n - i) \cdot (3n - 1 + i)\Delta\varphi + i \cdot 360°]/(3n)$$

$$= [3n \cdot \varphi_0 + (9n^2 - 3n)\Delta\varphi + i \cdot 360°]/(3n)$$

$$= \varphi_0 + (3n - 1)\Delta\varphi + i/(3n) \cdot 360°.$$

The difference (e.g., the phase relationship) between two adjacent phases (e.g., the phase difference between the output signal of the (i+1)-th phase interpolator and the i-th phase interpolator) is $\Delta\psi_{i+1,i} = \psi_{i+1} - \psi_i = 360°/(3 \cdot n)$.

In the following, the proposed circuit principle (of the multiphase signal generator 400-A) is explained in more detail and with implementation aspects for n=1 (e.g., the respective subsets of phase shifters each comprising 3 serially connected phase shifters), generating three 120° spaced outputs, and for n=2 (e.g., the respective subsets of phase shifters each comprising 6 serially connected phase shifters), obtaining six 60° spaced outputs.

Figure 4B:
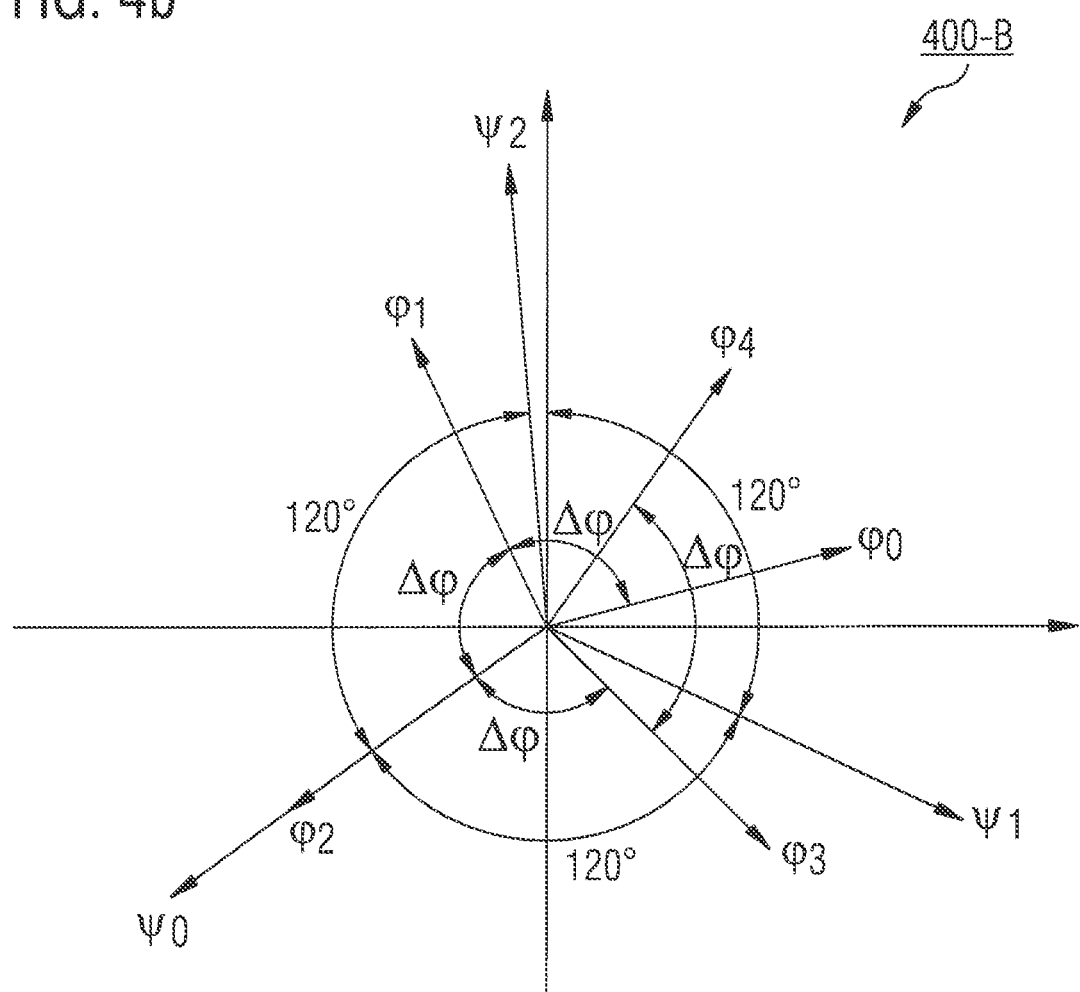
FIGS. 4*b,c* show different possible phasor diagrams for the multiphase signal generator of FIG. 4*a*.
Figure 4C:
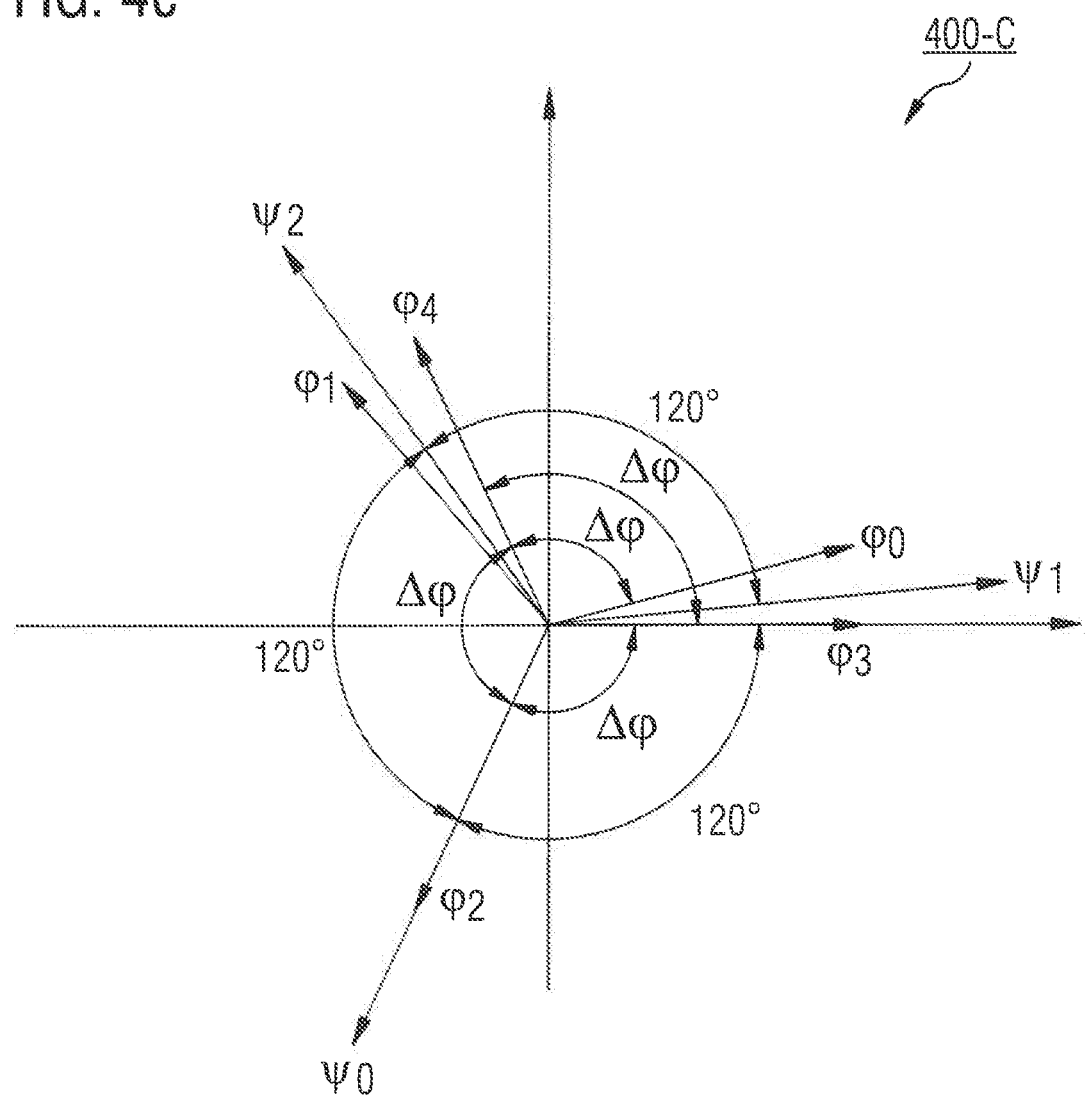
FIG. 4*d* shows a block diagram of a multiphase signal generator with three phase interpolators.
FIG. 4*e* shows a block diagram of a multiphase signal generator with six phase interpolators.
FIG. 4*f* shows a phasor diagram for the multiphase signal generator of FIG. 4*e*.
Figure 4D:
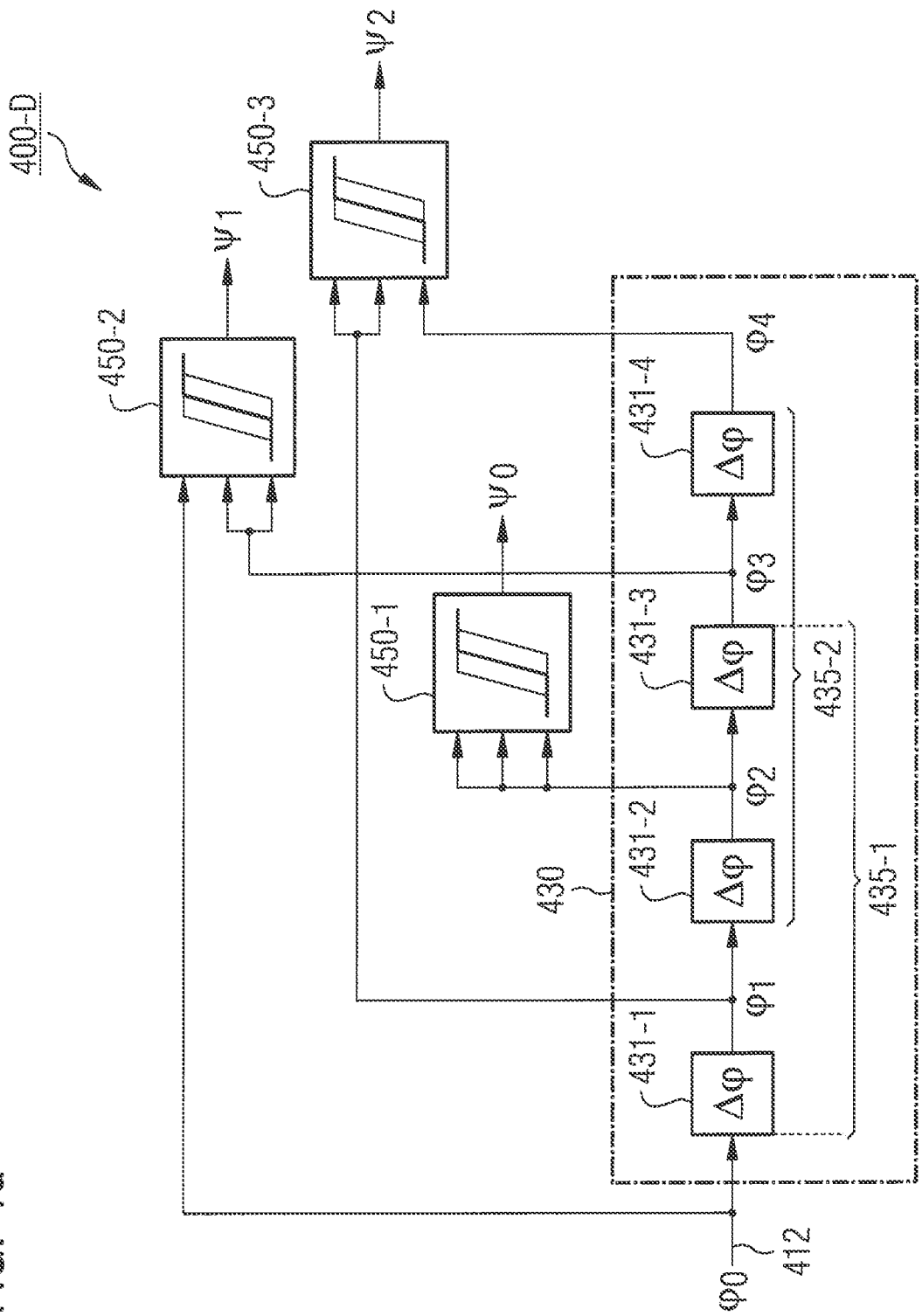

Phasor diagrams 400-B, 400-C for different values of the phase shift $\Delta\varphi$ for n=1 are shown in FIGS. 4b-c, generating 120° spaced outputs $\psi_1$, $\psi_2$, and $\psi_3$. A corresponding phase space block diagram (e.g., for n=1) is shown in FIG. 4d. In other words, FIG. 4d shows a block diagram of yet another example of a multiphase signal generator 400-D. The multiphase signal generator 400-D may be similar to the multiphase signal generator 400-A of FIG. 4a.

The multiphase signal generator 400-D comprises a plurality 430 of phase shifters of identical phase shift $\Delta\varphi$ (neglecting manufacturing tolerances). That is to say, each phase shifter is configured to generate an output signal at its respective output terminal, the output signal being shifted by $\Delta\varphi$ in phase with respect to a signal applied at a respective input terminal of the respective phase shifter. The phase shifters of the plurality of phase shifters are connected in series. An input port 412 of the multiphase signal generator 400-D is connected to an input terminal of a first phase shifter 431-1 of the plurality 430 of phase shifters. An output terminal of the first phase shifter 431-1 is connected to an input terminal of a second phase shifter 431-2 of the plurality 430 of phase shifters. An output terminal of the second phase shifter 431-2 is connected to an input terminal of a third phase shifter 431-3 of the plurality 430 of phase shifters. An output terminal of the third phase shifter 431-3 is connected to an input terminal of a fourth phase shifter 431-4 of the plurality 430 of phase shifters.

Furthermore, the multiphase signal generator 400-D comprises a plurality of phase interpolators (e.g., a first phase interpolator 450-1, a second phase interpolator 450-2, and a third phase interpolator 430-3). Each phase interpolator comprises three input terminals and an output terminal. Moreover, each phase interpolator is configured to weight the phase of respective signals applied to its respective input terminals with the same weighting factor to generate an interpolated phase signal at its respective output terminal. The first phase interpolator 450-1 is configured to provide a first output signal (of the multiphase signal generator 400-D) of phase $\psi_0$. The second phase interpolator 450-2 is configured to provide a second output signal (of the multiphase signal generator 400-D) of phase $\psi_1 = \psi_1$. The third phase interpolator 450-3 is configured to provide a third output signal (of the multiphase signal generator 400-D) of phase $\psi_2$. By splitting a signal and connecting it to more than one input terminal of a phase interpolator the phase of this signal can be weighted more strongly. For example, a first signal may be connected to the first and the second input terminal of a phase interpolator and a second signal may be connected to the third input terminal of the phase interpolator. The phase of the first signal may then be weighted twice as much as the phase of the second signal during phase interpolation performed by the phase interpolator.

The first output $\psi_0$ could optionally be directly obtained from an auxiliary phase $\varphi_2$ (provided at the output terminal of the second phase interpolator 431-2) without interpolating two separate signals. However, in order to equalize the delays along the separate signal paths (e.g., of the output signals), the (first) phase interpolator 450-1 is kept. The (first) output (e.g., the phase $\psi_0$ of the first output signal of the multiphase signal generator 400-A) can then be expressed by Equation 8.1:

$$\psi_0=[3\cdot\varphi_2]/3=[3\cdot(\varphi_0+2\cdot\Delta\varphi)]/3=\varphi_0+2\cdot\Delta\varphi.$$

The plurality 430 of phase shifters comprises a first subset 435-1 of phase shifters. The first subset 435-1 comprises the first, second, and third phase shifter 431-1, 431-2, 431-3 and is coupled between the first input terminal and the second plus third input terminal of the second phase interpolator 450-2. That is to say, the input port 412 is connected to the first input terminal of the second phase interpolator 450-2, while the output terminal of the third phase shifter 431-3 is connected to both the second and third input terminal of the second phase interpolator 450-2. The second output $\psi_1$ (e.g., the second output signal of the multiphase signal generator 400-D with phase $\psi_1$) can be generated by weighted interpolation of the auxiliary phase $\varphi_3$ (provided at the output terminal of the third phase shifter 431-3) and the input phase $\varphi_0$ (of an input signal applied to the input port 412 of the multiphase signal generator 400-D). Since the output terminal of the third phase shifter 431-3 is connected to the second and third input terminal of the second phase interpolator 450-2, while the input port 412 is connected to the first input terminal of the second phase interpolator 450-2, the auxiliary phase $\varphi_3$ may be weighted twice as much as the phase $\varphi_0$ during phase interpolation performed by the second phase interpolator 450-2. The edges of the next period of the phase $\varphi_0$ can be used, which can imply an additional 360°. The phase $\psi_1$ of the second output signal of the multiphase signal generator 400-A can then be expressed by Equation 8.2:

$$\psi_1 = [(\varphi_0+360°)+2\cdot\varphi_3]/3 =$$
$$[(\varphi_0+360°)+2\cdot(\varphi_0+3\cdot\Delta\varphi)]/3$$
$$= \varphi_0+2\cdot\Delta\varphi+120°.$$

The third output (e.g., the phase $V_2$ of the third output signal of the multiphase signal generator 400-A) can be generated by interpolating an auxiliary phase $\varphi_4$ and the (auxiliary) phase $\varphi_1$, which, referred to $\varphi_4$, can also be from the next period, implying the added 360°.

To this end, the plurality 430 of phase shifters comprises a second subset 435-2 of phase shifters. The second subset 435-2 comprises the second, third, and fourth phase shifter 431-2, 431-3, 431-4. Compared to the first subset 435-1, the second subset 435-2 of phase shifters comprises the fourth phase shifter 431-4, which does not belong to the first subset 435-1, but does not comprise the first phase shifter 431-1. This way, the first and the second subset 435-1, 435-2 are different, but comprise the same number of phase shifters. The second subset 435-2 of phase shifters is coupled between the first plus the second input terminal and the third input terminal of the third phase interpolator 450-3. That is to say, the output terminal of the first phase shifter 431-1 is connected to both the first and the second input terminal of the third phase interpolator 450-3, while the output terminal of the fourth phase shifter 431-4 is connected to the third input terminal of the third phase interpolator 450-3. In this manner, the auxiliary phase 91 may be weighted twice as much as the auxiliary phase $\varphi_4$ during phase interpolation performed by the third phase interpolator 450-3. The phase $\psi_2$ of the third output signal of the multiphase signal generator 400-A can then be expressed by Equation 8.3:

$$\psi_2 = [2\cdot(\varphi_1+360°)+\varphi_4]/3 =$$
$$[2\cdot(\varphi_0+\Delta\varphi+360°)+(\varphi_0+4\cdot\Delta\varphi)]/3$$
$$= \varphi_0+2\cdot\Delta\varphi+240°.$$

From Equations 8.1, 8.2, and 8.3 it can be deduced, that the phase difference (e.g., the phase relationship) between the phases of the i-th and (i+1)-th output signal (e.g., between the first and the second output signal, and/or between the second and third output signal, and/or between the third and the first output signal) can be 120°. This can be expressed by Equation 8.4:

$$\psi_{i+1}-\psi_i=\psi_2-\psi_1=\psi_3-\psi_2=(360°+\psi_1)-\psi_3=120°.$$

Consequently, accurate phase relationships between the output signals of the multiphase signal generator 400-D can be provided independent of the value of the phase shift $\Delta\varphi$ of each of the plurality 430 of phase shifters.

For linear phase interpolation, the phase interpolators' inputs can be aligned sufficiently close. To this the phase shift can be set such that $\Delta\varphi\approx360°/(3\cdot n)$. For the case when n=1 (e.g., for the multiphase signal generator 400-D), $\Delta\varphi\approx120°$ and the input $\varphi_0$ and the phase $\varphi_3$ can be approximately overlapping $\varphi_3\approx\varphi_0+360°$ (likewise $\varphi_1$ and $\varphi_4$ can be approximately overlapping). This condition can be ensured, for example, with a calibration loop running at startup. After these phase shifts have been sufficiently adjusted, the circuit (e.g., the multiphase signal generator 400-D) can be operated in its open loop feed forward configuration.

Figure 4E:
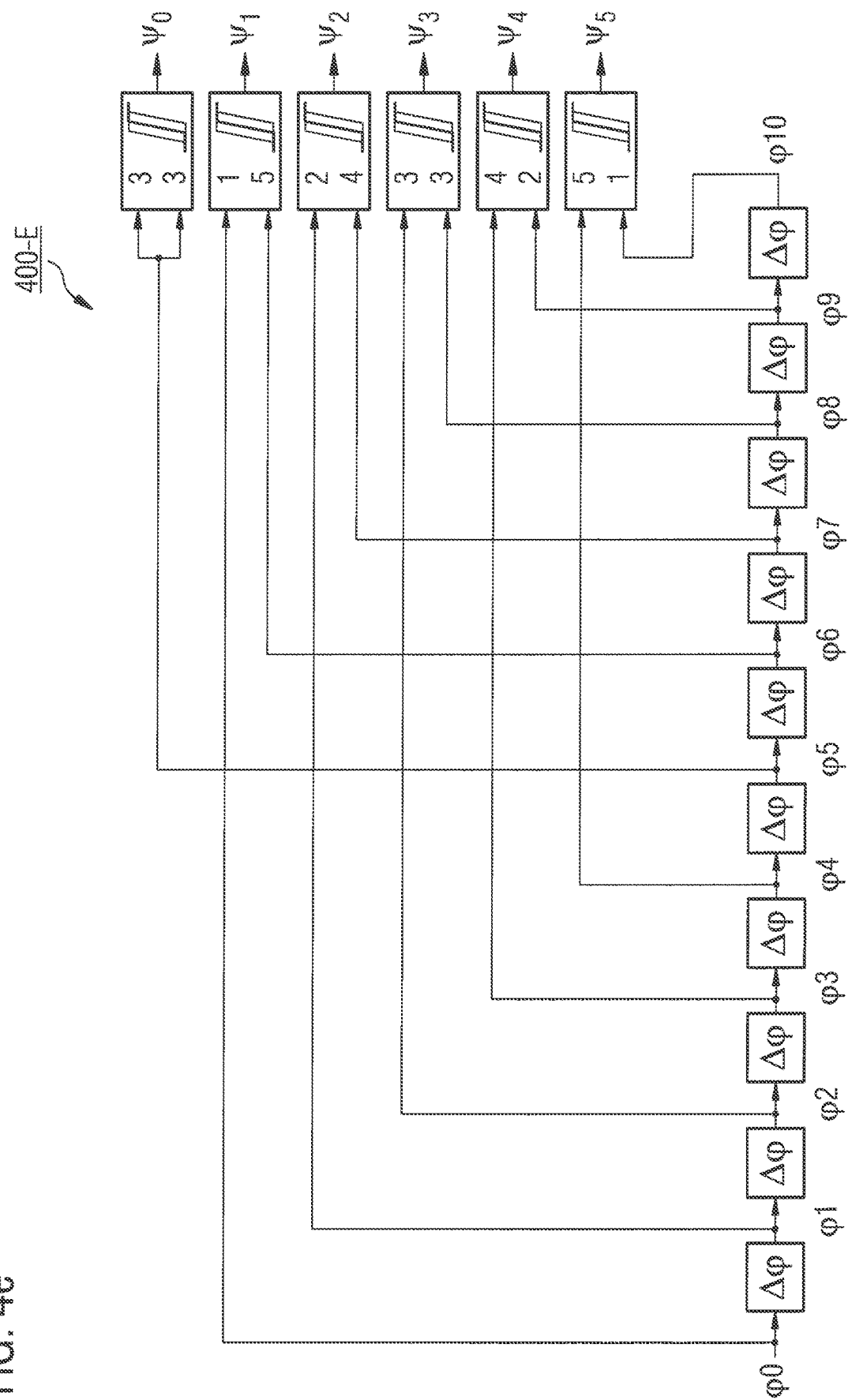
Figure 4F:
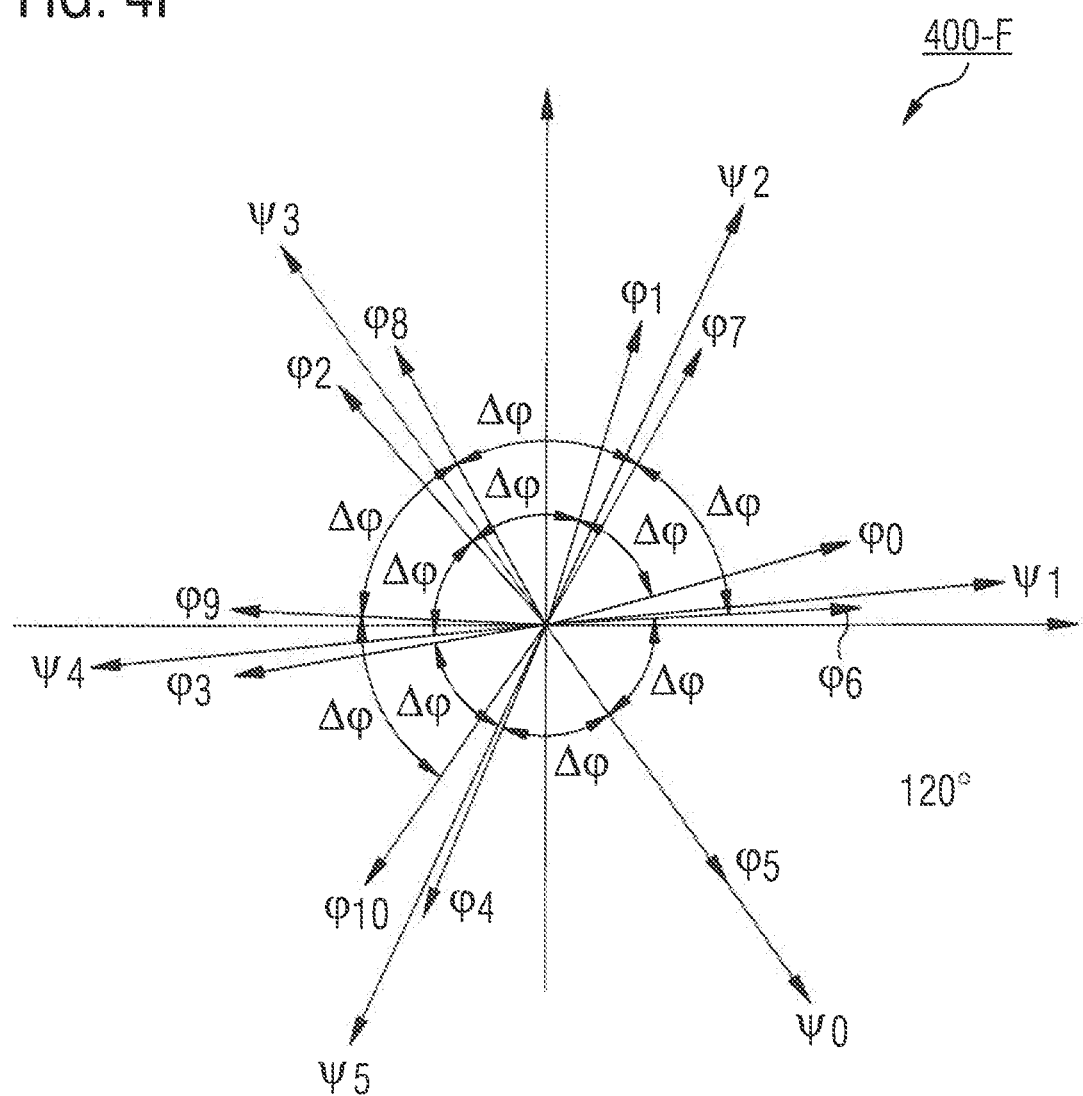

Similarly for n=2, the multiphase signal generator 400-A (e.g., the respective subsets of phase shifters each comprising 3n=6 serially connected phase shifters) can be adapted to the multiphase signal generator 400-E, whose block diagram (or phase space block diagram) is shown in FIG. 4e. FIG. 4f shows a phasor diagram for n=2, generating six 600 spaced outputs.

Similarly to the case when n=1 (as for the multiphase signal generator 400-D), the six outputs $\psi_0$ through $\psi_5$ can be expressed by Equations 9.1 to 9.6.

$$\psi_0=[6\cdot\varphi_5]/6=[6\cdot(\varphi_0+5\cdot\Delta\varphi)]/6=\varphi_0+5\cdot\Delta\varphi. \quad\text{Equation 9.1:}$$

Equation 9.2:

$$\psi_1 = [(\varphi_0+360°)+5\cdot\varphi_6]/6 =$$
$$[(\varphi_0+360°)+5\cdot(\varphi_0+6\cdot\Delta\varphi)]/6$$
$$= \varphi_0+5\cdot\Delta\varphi+60°.$$

Equation 9.3:

$$\begin{aligned}\psi_2 &= [2\cdot(\varphi_1+360°)+4\cdot\varphi_7]/6 = \\ &\quad [2\cdot(\varphi_0+\Delta\varphi+360°)+4\cdot(\varphi_0+7\cdot\Delta\varphi)]/6 \\ &= \varphi_0+5\cdot\Delta\varphi+120°.\end{aligned}$$

Equation 9.4:

$$\begin{aligned}\psi_3 &= [3\cdot(\varphi_2+360°)+3\cdot\varphi_8]/6 = \\ &\quad [3\cdot(\varphi_0+2\cdot\Delta\varphi+360°)+3\cdot(\varphi_0+8\cdot\Delta\varphi)]/6 \\ &= \varphi_0+5\cdot\Delta\varphi+180°.\end{aligned}$$

Equation 9.5:

$$\begin{aligned}\psi_4 &= [4\cdot(\varphi_3+360°)+2\cdot\varphi_9]/6 = \\ &\quad [4\cdot(\varphi_0+3\cdot\Delta\varphi+360°)+2\cdot(\varphi_0+9\cdot\Delta\varphi)]/6 \\ &= \varphi_0+5\cdot\Delta\varphi+240°.\end{aligned}$$

Equation 9.6:

$$\begin{aligned}\psi_5 &= [5\cdot(\varphi_4+360°)+1\cdot\varphi_{10}]/6 = \\ &\quad [5\cdot(\varphi_0+4\cdot\Delta\varphi+360°)+(\varphi_0+10\cdot\Delta\varphi)]/6 \\ &= \varphi_0+5\cdot\Delta\varphi+300°.\end{aligned}$$

As can be deduced from Equations 9.1 to 9.6, the phase differences between adjacent phases (of the output signals of the multiphase signal generator 400-E) can be 60° as desired.

Again similar to the case when n=1 (e.g., similar to the multiphase signal generator 400-D of FIG. 4d), linear phase interpolation can be facilitated by closely aligned input phases of the phase interpolators of the multiphase signal generator 400-E. For example, the input phases of a respective phase interpolator may be maximally spaced by the linear interpolation range of the respective phase interpolator apart from each other. Therefore, the phase shifts $\Delta\varphi$ may be chosen so that $\Delta\varphi\approx 60°$ and the phase $\varphi_0$ and the phase $\varphi_6$ can be approximately overlapping $\varphi_6\approx\varphi_0+360°$. The adjustability of the phase shift $\Delta\varphi$ may be coarse, just in order for the phase interpolation to work in a linear manner. Therefore, complicated analog fine tuning can be avoided, which can be a major improvement over other architectures.

FIG. 5a shows a high level circuit schematic of a multiphase signal generator 500-A (e.g., an overall multiphase generator). The multiphase signal generator 500-A may be similar to the multiphase signal generator 400-E of FIG. 4e, where n=2.

The dimensioning of circuit elements of the multiphase signal generator 500-A can depend on the desired noise and jitter performance. The multiphase signal generator 500-A comprises an input port 512, a delay line 530 that comprises a plurality of phase shifters, and a plurality 550 of phase interpolators comprising six phase interpolators. Each of the plurality 550 of phase interpolators is configured to provide a respective output signal of the multiphase signal generator 500-A at its respective output terminal. The output signals of the multiphase signal generator 500-A can be (nominally) spaced 60° in phase apart from each other as expressed by Equations 9.1 to 9.6. The delay line 530 can resemble the phase shifts $\Delta\varphi$. The additional plurality 555 of dummy phase interpolators can serve as a dummy load in order to keep a loading of all nodes in the delay line equal. For example, FIG. 5a shows a multiphase generator for n=2 generating six outputs exhibiting 60° phase shifts.

FIG. 5b shows a circuit schematic of a delay line 500-B that may be used for the delay line 530 of the multiphase signal generator 500-A of FIG. 5a. The delay line 500-B comprises a plurality of delay stages 531 (e.g., phase shifters). For example, FIG. 5b shows a ten stage coarsely tunable delay line.

FIG. 5c shows a circuit schematic of a single delay stage 500-C with binary weighted programmable load capacitance 532. The delay stage 500-C can be used for implementing a delay stage 531 of the delay line 500-B of FIG. 5b. The binary weighted programmable load capacitance 532 comprises a plurality of digitally programmable capacitor elements 533.

Figure 5D:
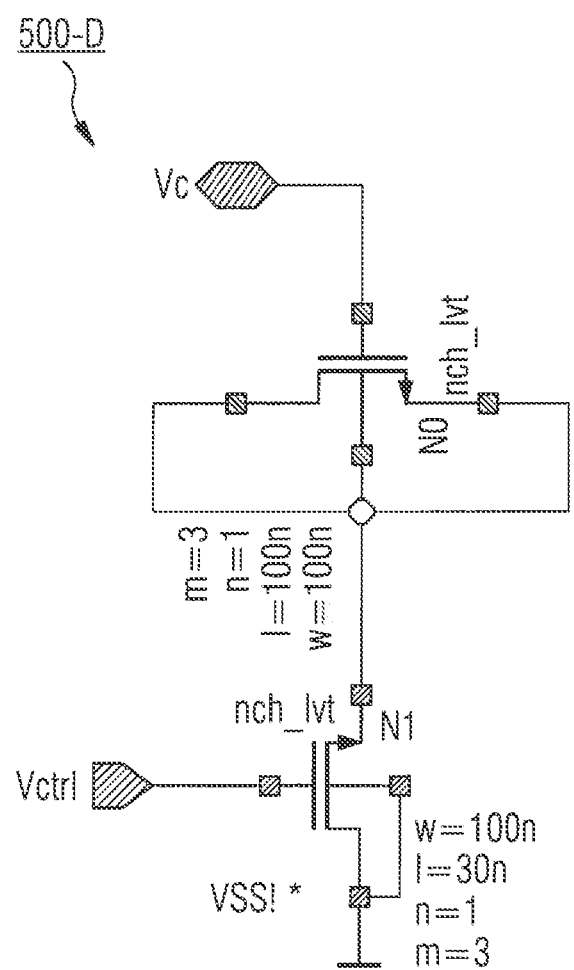
FIG. 5*d* shows a circuit schematic of a digitally programmable load capacitance.

FIG. 5d shows a circuit schematic of a digitally programmable load capacitance 500-D (e.g., a digitally programmable capacitor element). The digitally programmable load capacitance 500-D may behave differently for rising and falling edges. Coarsely tunable phase shifts and/or delays can be sufficient for at least some examples of the proposed circuit architecture.

Figure 5E:
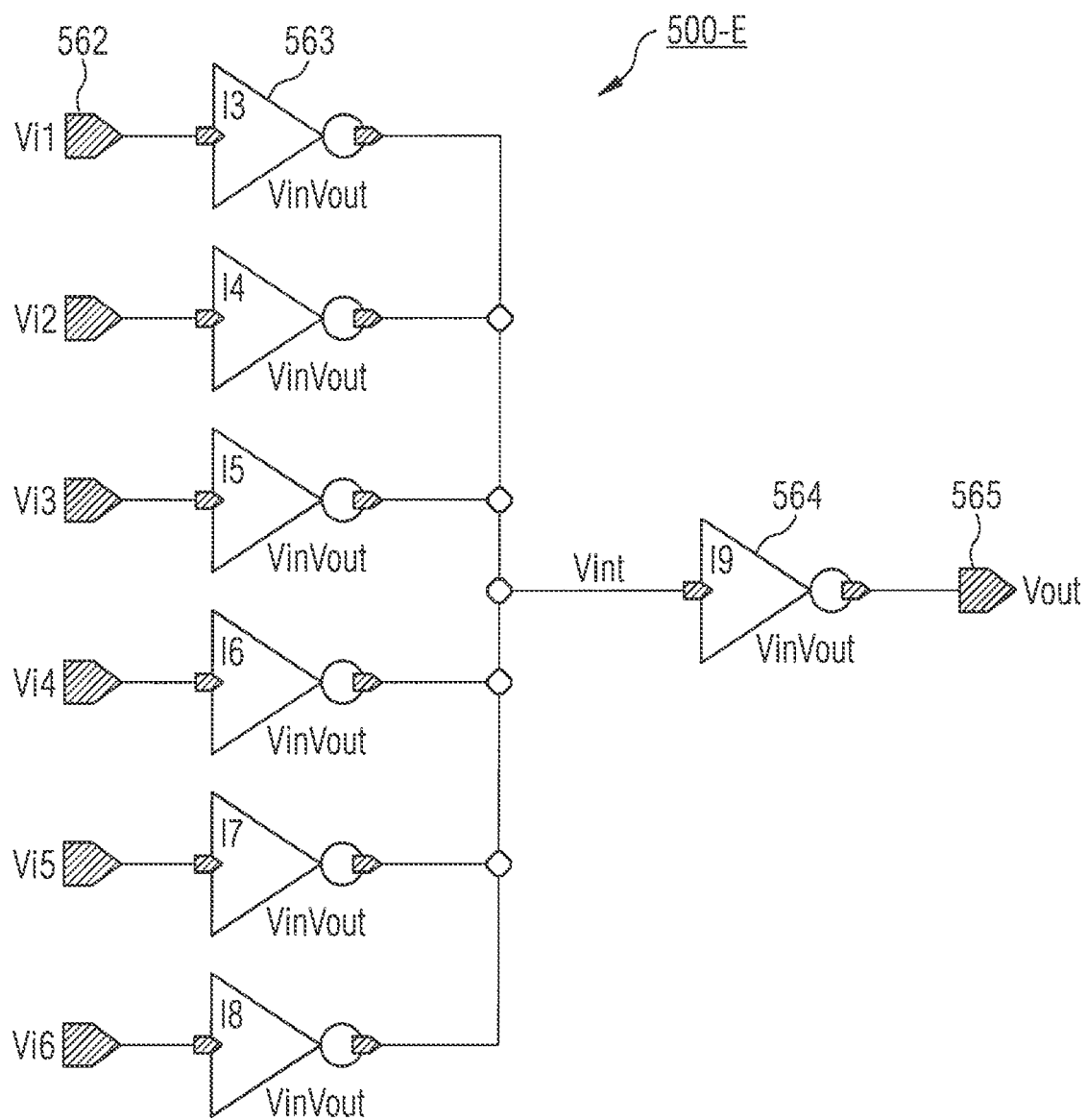
FIG. 5*e* shows a circuit schematic of a phase interpolator.

FIG. 5e shows a circuit schematic of a phase interpolator 500-E. The phase interpolator 500-E can be used for implementing a weighted phase interpolation. The phase interpolator 500-E comprises a plurality of input terminals 562. Each input terminal is connected to a respective input inverter subcircuit 563 of a plurality of input inverter subcircuits of the phase interpolator 500-E. The output terminals of the input inverter subcircuits are connected to a common internal node of the phase interpolator 500-E. The common internal node is connected to an input terminal of an output inverter subcircuit 564 of the phase interpolator 500-E. An output terminal of the output inverter subcircuit 564 corresponds to an output terminal of the phase interpolator 500-E.

Respective weighting factors of the phase interpolator 500-E can be realized according to the number of input terminals 562 of the phase interpolator 500-E connected to the same input signal (e.g., the same electrical net and/or wire). For example, if the phase interpolator 500-E comprises six input terminals (as shown in FIG. 5e) and a first input signal of the phase interpolator 500-E is connected to three input terminals, while a second input signal of the phase interpolator 500-E is connected to the other remaining three input terminals, the weighting factors for weighting the phases of the first and the second input signal during phase interpolation performed by the phase interpolator 500-E may be equal. If instead the first input signal is connected to four input terminals, and the second input signal is connected to the remaining two input terminals, the weighting factor for weighting the phase of the first input signal may be twice as large as the weighting factor for weighting the phase of the second input signal during phase interpolation. In yet another configuration, the first input signal can be connected to five input terminals, and the second input signal can be connected to the one remaining input terminal only. Hence, the weighting factor for weighting the phase of the first input signal can be five times as large as the weighting factor for weighting the phase of the second input signal during phase interpolation. In other words, the voltage mode phase interpolator 500-E comprises inverters that share their outputs. The number of inverters connected to each input can determine the according interpolation weight of that signal. FIG. 5*f* shows a timing diagram 500-F of a first output signal 572-1 of phase $\psi_0$ (as expressed by Equation 9.1), a second output signal 572-2 of phase $\psi_1$ (as expressed by Equation 9.2), a third output signal 572-3 of phase $\psi_2$ (as expressed by Equation 9.3), a fourth output signal 572-4 of phase $\psi_3$ (as expressed by Equation 9.4), a fifth output signal 572-5 of phase $\psi_4$ (as expressed by Equation 9.5), and a sixth output signal 572-6 of phase $\psi_5$ (as expressed by Equation 9.6) of the multiphase signal generator 500-A of FIG. 5*a* with respect to 1.3 GHz input signal 571 of the multiphase signal generator 500-A.

An ideal phase shift of 60° corresponds to a delay of 128 ps for this input frequency. The timing error is below 1 picosecond (ps), which corresponds to a phase error lower than 0.5°. The duty cycle of the outputs (e.g., the output signals 572-1, 572-2, 572-3, 572-4, 572-5, 572-6) does not follow the duty cycle of the inputs (e.g., the input signal 571) since the chosen capacitive load can behave differently for rising and falling edges. For a possible application of frequency multiplication, only the rising edges of the output signals 572-1, 572-2, 572-3, 572-4, 572-5, 572-6 may be of interest. Alternatively, symmetrical load capacitances and/or a different delay element can be used when targeting different applications. The six output signals 572-1, 572-2, 572-3, 572-4, 572-5, 572-6 can be merged with an edge combiner for ×3 frequency multiplication.

Figure 6:
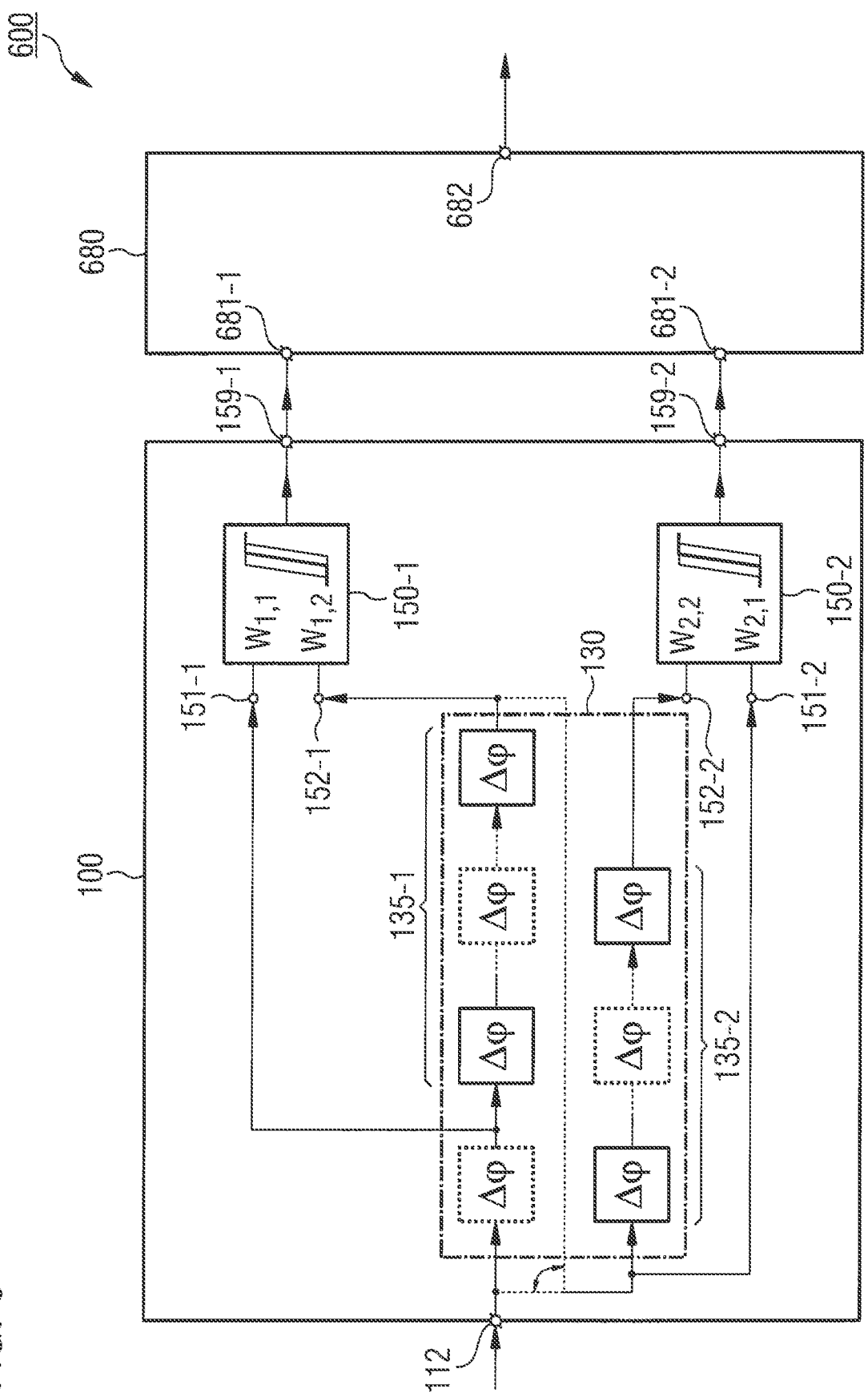
FIG. 6 shows a block diagram of a frequency multiplier.

FIG. 6 shows a block diagram of a frequency multiplier 600 according to another aspect of the present disclosure. The frequency multiplier 600 comprises a multiphase signal generator 100. The multiphase signal generator 100 comprises an input port 112. Furthermore, the multiphase signal generator 100 comprises a plurality 130 of phase shifters. Each phase shifter of the plurality 130 of phase shifters is configured to provide an identical phase shift $\Delta\varphi$. At least one phase shifter is connected to the input port 112. Furthermore, the multiphase signal generator 100 comprises a first phase interpolator 150-1 and at least a second phase interpolator 150-2. Each phase interpolator 150-1, 150-2 has a respective output terminal 159-1, 159-2. Each phase interpolator 150-1, 150-2 is configured to weight a phase of a signal at a respective first input terminal 151-1, 151-2 of the phase interpolator 150-1, 150-2 with a respective first weighting factor $w_{i,1}$ (i=1, 2) and to weight a phase of another signal at a respective second input terminal 152-1, 152-2 of the phase interpolator 151-1, 151-2 with a respective second weighting factor $w_{i,2}$ (i=1, 2) to generate an interpolated phase signal at the respective output terminal 159-1, 159-2 of the phase interpolator 151-1, 151-2. A first subset 135-1 of the plurality 130 of phase shifters comprises n>1 serially connected phase shifters. The first subset 135-1 of phase shifters is coupled between the first input terminal 151-1 and the second input terminal 152-1 of the first phase interpolator 150-1. A different second subset 135-2 of the plurality 130 of phase shifters comprises n serially connected phase shifters. The second subset 135-2 of phase shifters is coupled between the first input terminal 151-2 and the second input terminal 152-2 of the second phase interpolator 150-2. Furthermore, the frequency multiplier 600 comprises an edge combiner circuit 680. A first clock input terminal 681-1 of the edge combiner circuit 680 is connected to the output terminal 159-1 of the first phase interpolator 150-1 of the multiphase signal generator 100. A second clock input terminal 681-2 of the edge combiner circuit 680 is connected to the output terminal 159-2 of the second phase interpolator 150-2 of the multiphase signal generator 100. An output terminal 682 of the edge combiner circuit 680 corresponds to an output port of the frequency multiplier 600.

The multiphase signal generator 100 of FIG. 6 may be similar to the multiphase signal generator 100 of FIG. 1 and may comprise one or more optional and/or additional features of the multiphase signal generator 100 of FIG. 1.

The edge combiner circuit 680 can be configured to provide an output signal at its output terminal 682. Furthermore, the edge combiner circuit 680 can be configured to change a signal level of its output signal when a signal level at (at least) one of its clock input terminals 681-1, 681-2 changes. For example, the edge combiner circuit 680 can be configured to change the signal level of its output signal from a logic high level to a logic low level (and vice versa) when the signal level at (at least) one of its clock input terminals 681-1, 681-2 changes between two logic levels. Additionally or alternatively, the edge combiner circuit 680 can be configured to generate a pulse at its output terminal 682 when a signal level at (at least) one of its clock input terminals 681-1, 681-2 changes between two logic levels. For example, the edge combiner circuit 680 can be configured to change the signal level of its output signal (or to generate a pulse at its output terminal 682) upon each rising edge and/or upon each falling edge of respective input signals applied to the respective clock input terminals of the edge combiner circuit 680. Hence, if the respective input signals applied to the respective clock input terminals of the edge combiner circuit 680 are phase shifted with respect to each other, the output signal of the edge combiner circuit 680 may change its level (or show a pulse) at a higher rate with respect to each of the respective input signals applied to the respective clock input terminals of the edge combiner circuit 680. Connecting respective clock input terminals 681-1, 681-2 of the edge combiner circuit 680 to respective output terminals 159-1, 159-2 of the multiphase signal generator 100 can thus provide a circuit for frequency multiplication (e.g., the frequency multiplier 600). The frequency multiplier 600 can then provide an output signal of a higher frequency at the output terminal 682 of the edge combiner circuit 680 with respect to a frequency of a signal applied to the input port 112 of the multiphase signal generator 100.

In response to a signal applied to the input port 112 of the multiphase signal generator 100, the multiphase signal generator 100 can provide a first output signal at the output terminal 159-1 of the first phase interpolator 150-1 to the first clock input terminal 681-1 of the edge combiner circuit 680 and can provide a second output signal at the output terminal 159-2 of the second phase interpolator 150-2 to the second clock input terminal 681-2 of the edge combiner circuit 680. Since the first and the second output signal of the multiphase signal generator 100 can have an accurately set phase difference (as explained in the context of FIGS. 1-5*f*), a frequency multiplication factor (e.g., a ratio of a desired frequency of the output signal of the edge combiner circuit 680 to the frequency of the signal applied to the input port 112 of the multiphase signal generator 100) of the frequency multiplier 600 can be accurately set. Furthermore, the output signal provided by the edge combiner circuit 680 can be of reduced jitter and/or of reduced phase noise due to the accurately set phase difference.

According to an example, the multiphase signal generator 100 is configured to provide its first output signal at the output terminal 159-1 of the first phase interpolator 150-1 being shifted by 90° with respect to the second output signal of the multiphase signal generator 100 provided at the output terminal 159-2 of the second phase interpolator 150-2. Furthermore, the edge combiner circuit 680 is configured to change the signal level of its output signal upon each rising and each falling edge of the multiphase signal generator's first and second output signal provided to the first and the second clock input terminal 681-1, 681-2 of the edge combiner circuit 680, respectively. This way, the frequency multiplier 600 may double the frequency of a signal applied to the input port 112 of the multiphase signal generator 100.

The edge combiner circuit 680 can comprise more than two clock input terminals in order to realize different multiplication factors of the frequency multiplier 600. To this end, the multiphase signal generator 100 can comprise a corresponding number of output terminals (and a corresponding number of phase interpolators and/or signal splitters) for providing phase shifted signals to the respective clock input terminals of the edge combiner circuit 680.

Optionally, the edge combiner circuit 680 can be configured to transfer a signal from an input terminal (not shown in FIG. 6) of the edge combiner circuit 680 to the output terminal 682 of the edge combiner circuit 680 if a signal level at at least one of the first clock input terminal 681-1 and the second clock input terminal 681-2 changes by more than a predefined threshold. The predefined threshold can, for instance, correspond to high and/or low thresholds of logic voltage levels of a certain technology (e.g., the Complementary Metal-Oxide-Semiconductor (CMOS) technology, the Transistor-Transistor Logic (TTL) technology, and the like).

Additionally, the frequency multiplier 600 can comprise an inverter circuit (not shown in FIG. 6). An input terminal of the inverter circuit can be connected to the output terminal 682 of the edge combiner circuit 680. An output terminal of the inverter circuit can be connected to the input terminal of the edge combiner circuit 680. In other words, the inverter circuit can establish a feedback loop from the output terminal 682 of the edge combiner circuit 680 to the input terminal of the edge combiner circuit 680.

Due to the edge combiner circuit 680 being configured to transfer a signal from its input terminal (different from the clock input terminals) to its output terminal 682 when a signal level at at least one of the first and the second clock input terminal 681-1, 681-2 changes and due to the feedback loop that can provide the inverted output signal of the edge combiner circuit 680 to the input terminal of the edge combiner circuit 680, the edge combiner circuit 680 can be configured to change the signal level of its output signal between two logic levels when the signal level at (at least) one of its clock input terminals 681-1, 681-2 changes between two logic levels.

Figure 7:
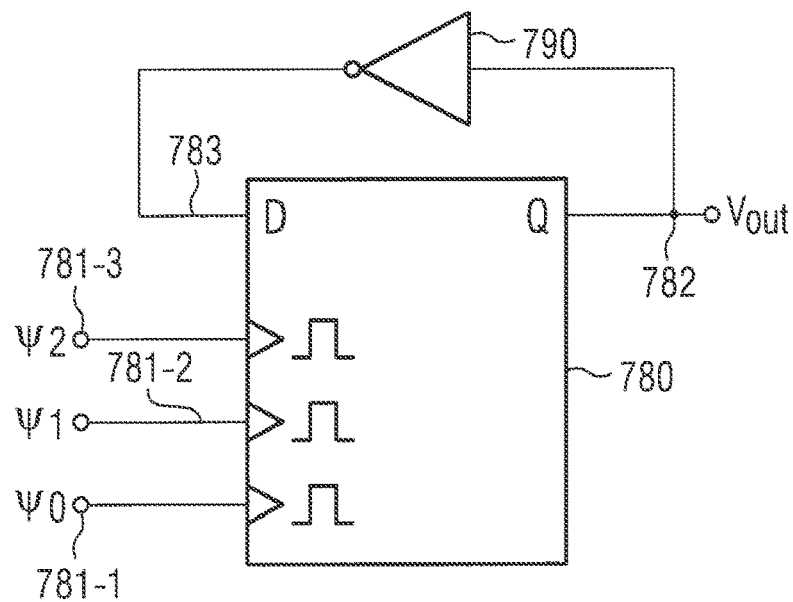
FIG. 7 shows a block diagram of an edge combiner circuit connected to an inverter circuit.

FIG. 7 shows an example of such an edge combiner circuit 780 combined with an inverter circuit 790. The edge combiner circuit 780 comprises a first clock input terminal 781-1, a second clock input terminal 781-2, a third clock input 781-3, an input terminal 783 and an output terminal 782. The edge combiner circuit 780 is configured to transfer a signal from its input terminal 783 to its output terminal 782 when a signal level at at least one of its first, second, and third clock input terminal 781-1, 781-2, 781-3 changes (e.g., from a logic low level to a logic high level and/or from a logic high level to a logic low level). To this end, the edge combiner circuit 780 may comprise a memory subcircuit (e.g., a data flip-flop) and load the memory subcircuit with the value of the signal applied to its input terminal 783 when a signal level at at least one clock input terminal 781-1, 781-2, 781-3 changes. Furthermore, an input terminal of the inverter circuit 790 is connected to the output terminal 782 of the edge combiner circuit 780. An output terminal of the inverter circuit 790 is connected to the input terminal 783 of the edge combiner circuit 780.

If, for example, an output signal provided at the output terminal 782 of the edge combiner circuit 780 is at a logic low level, an input signal of the edge combiner circuit 780 provided by the inverter circuit 790 to the input terminal 783 can be at a logic high level. If now, for example, the logic level of a signal at the first clock input terminal 781-1 changes, the edge combiner circuit 780 may transfer its input signal to its output terminal 782, so that its output signal may increase its signal level from the logic low level to the logic high level. In response, the inverter circuit 790 can change the signal level of the input signal of the edge combiner circuit 780 to the logic low level. Next, for example, the logic level of a signal at the second clock input terminal 781-2 changes causing the output signal of the edge combiner circuit 780 to change back again to logic low level and the input signal of the edge combiner circuit 780 to change back again to logic high level, and so forth. Hence, if the signals applied to the clock input terminals 781-1, 781-2, 781-3 are of a fixed phase difference (e.g., an equally spaced phase difference), the edge combiner circuit 780 together with the inverter circuit 790 and together with a multiphase signal generator (e.g., the multiphase signal generator 100 of FIGS. 1, 6) can be used as a frequency multiplier.

For example, the edge combiner circuit 780 and the inverter circuit 790 can be combined with the multiphase signal generator 400-D of FIG. 4*d*. The three outputs (e.g., output signals) of the multiphase signal generator 400-D can be used for ×3 frequency multiplication with the edge combiner circuit 780, assuming a 50% input duty cycle (of a signal applied to the input port 412 of the multiphase signal generator 400-D). The edge combiner circuit 780 can then use rising and falling edges to trigger the transitions of its output signal. Alternatively, a ×1.5 frequency multiplication can be achieved by configuring the edge combiner circuit 780 to use only either rising or falling edges (of the signals applied to its clock input terminals 781-1, 781-2, 781-3). This can result in an ideal 50% output duty cycle regardless of the input's duty cycle.

For example, FIG. 7 shows a three phase edge combiner with clock inputs sensitive to both rising and falling edges for ×3 frequency multiplication.

Figure 8:
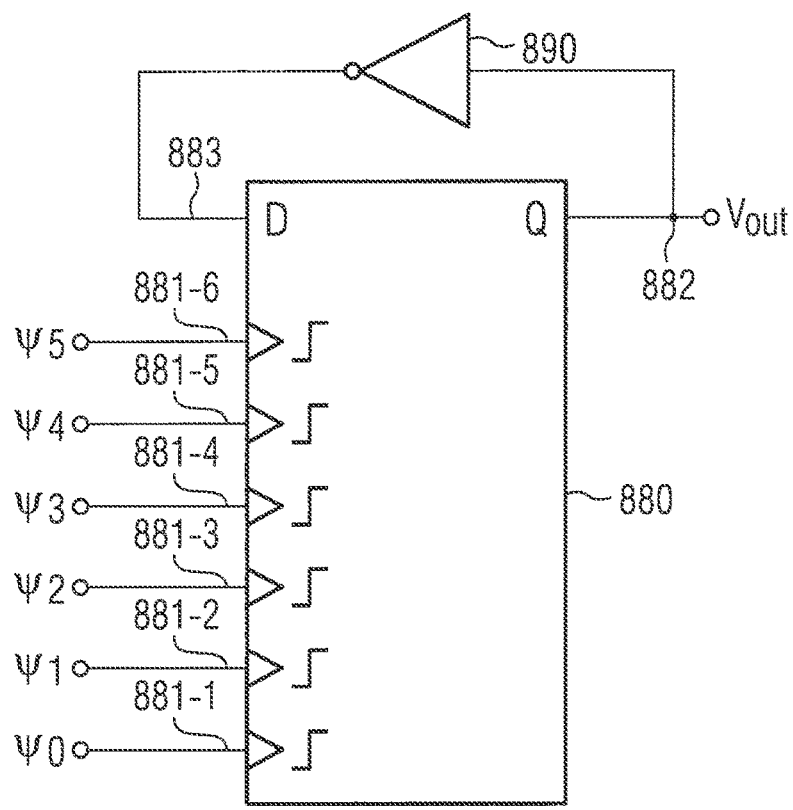
FIG. 8 shows a block diagram of another edge combiner circuit connected to an inverter circuit.

The circuit shown in FIG. 8 comprises an edge combiner circuit 880 combined with an inverter circuit 890 and may be similar to the circuit shown in FIG. 7. However, the edge combiner circuit 880 comprises more than three clock input terminals. That is to say, the edge combiner circuit 880 comprises a first clock input terminal 881-1, a second clock input terminal 881-2, a third clock input 881-3, a fourth clock input terminal 881-4, a fifth clock input terminal 881-5, and a sixth clock input 881-6. Furthermore, the edge combiner circuit 880 is configured to transfer a signal from its input terminal 883 to its output terminal 882 when a signal level at least one of its clock input terminals 881-1, 881-2, 881-3, 881-4, 881-5, 881-6 changes from a logic low level to a logic high level (e.g., upon rising edges only).

For example, the edge combiner circuit 880 and the inverter circuit 890 can be combined with the multiphase signal generator 400-E of FIG. 4*e*. To this end, respective clock input terminals 881-1, 881-2, 881-3, 881-4, 881-5, 881-6 of the edge combiner circuit 880 can be connected to respective output terminals of respective phase interpolators of the multiphase signal generator 400-E. In this way, the six outputs (e.g., output signals) of the multiphase signal generator 400-E can be used for ×3 frequency multiplication with the edge combiner 880 and the inverter circuit 890, but with an arbitrary duty cycle. In the case of a 50% input duty cycle, with an edge combiner sensitive to both rising and falling transitions, a ×6 frequency multiplication can be achieved.

For example, FIG. 8 shows a three phase edge combiner with clock inputs sensitive to both rising and falling edges for ×3 frequency multiplication.

Figure 9:
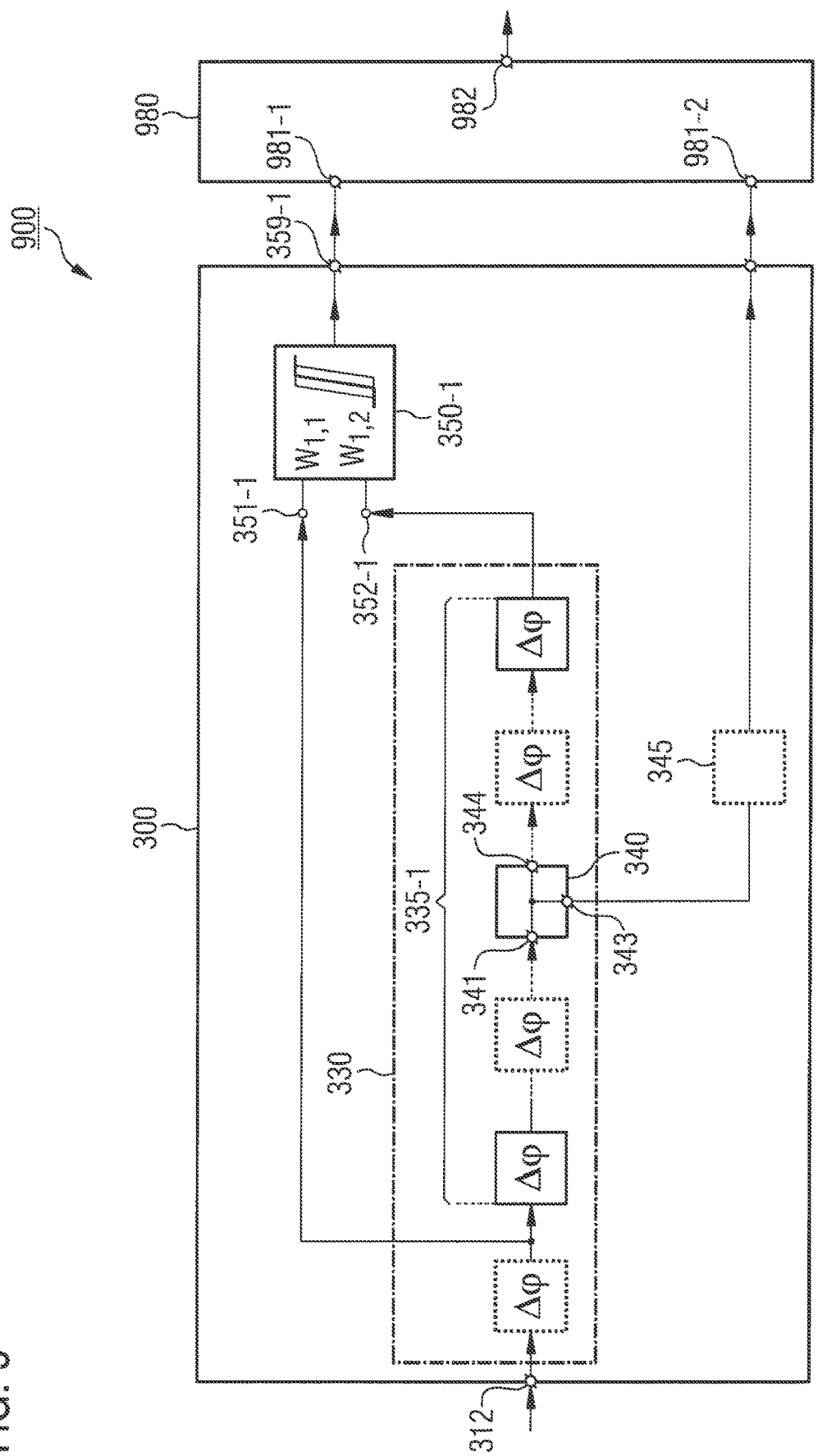
FIG. 9 shows a block diagram of another frequency multiplier.

FIG. 9 shows a block diagram of another frequency multiplier 900 according to another aspect of the present disclosure. The frequency multiplier 900 comprises a multiphase signal generator 300. The multiphase signal generator 300 comprises an input port 312. Furthermore, the multiphase signal generator 300 comprises a plurality 330 of phase shifters. Each phase shifter is configured to provide an identical phase shift Δφ. At least one phase shifter is connected to the input port 312. Furthermore, the multiphase signal generator 300 comprises at least one phase interpolator 350-1. The phase interpolator 350-1 is configured to weight a phase of a signal at a first input terminal 351-1 of the phase interpolator 350-1 with a first weighting factor $w_{1,1}$ and to weight a phase of another signal at a second input terminal 352-1 of the phase interpolator 350-1 with a second weighting factor $w_{1,2}$ to generate an interpolated phase signal at an output terminal 359-1 of the phase interpolator 350-1. A subset 335-1 of the plurality of phase shifters comprises n>1 serially connected phase shifters. The subset 335-1 of the plurality of phase shifters is coupled between the first input terminal 351-1 and the second input terminal 352-1 of the phase interpolator 350-1. Furthermore, the multiphase signal generator 300 comprises a signal splitter 340 coupled between two serially connected phase shifters of the plurality 330 of phase shifters. The signal splitter 340 is configured to provide an output signal of a phase shifter preceding the signal splitter at an output terminal 343 of the signal splitter 340. Furthermore, the frequency multiplier 900 comprises an edge combiner circuit 980. A first clock input terminal 981-1 of the edge combiner circuit 980 is connected to the output terminal 359-1 of the phase interpolator 350-1 of the multiphase signal generator 300. A second clock input terminal 981-2 of the edge combiner circuit 980 is connected to the output terminal 343 of the signal splitter of the multiphase signal generator 300. An output terminal 982 of the edge combiner circuit corresponds to an output port of the frequency multiplier 900.

The edge combiner circuit 980 may be similar to the edge combiner circuits 680, 780, and 880 of FIG. 6, FIG. 7, and FIG. 8, respectively, and may comprise one or more optional and/or additional features of the edge combiner circuits 680, 780, and 880. The multiphase signal generator 300 of FIG. 9 may be similar to the multiphase signal generator 300 of FIG. 3 and may comprise one or more optional and/or additional features of the multiphase signal generator 300 of FIG. 3.

Combining the multiphase signal generator 300 with the edge combiner circuit 980, can enable the frequency multiplier 900 to provide a signal at the output terminal 982 of the edge combiner circuit whose frequency is a multiple of a frequency of a signal applied to the input port 312 of the multiphase signal generator 300. In response to a signal applied to the input port 312 of the multiphase signal generator 300 of the frequency multiplier 900, the multiphase signal generator 300 can provide a first output signal at the output terminal 359-1 of the phase interpolator 350-1 to the first clock input terminal 981-1 of the edge combiner circuit 980 and can provide a second output signal at the output terminal 343 of the signal splitter 340 to the second clock input terminal 981-2 of the edge combiner circuit 980. Since the first and the second output signal of the multiphase signal generator 300 can have an accurately set phase difference (as explained in the context of FIG. 3), a frequency multiplication factor of the frequency multiplier 900 can be accurately set. Furthermore, the output signal provided by the edge combiner circuit 980 can be of reduced jitter and/or of reduced phase noise due to the accurately set phase difference.

An optional delay circuit 345 of the multiphase signal generator 300 can be additionally coupled between the output terminal 343 of the signal splitter 340 and the second clock input terminal 981-2 of the edge combiner circuit 980. A delay of the delay circuit 345 can correspond to (e.g., be equal to) a delay of the phase interpolator 350-1. This way, accuracy of the phase difference between the output signals provided by the multiphase signal generator 300 can be further enhanced, which in turn can result in a more accurately set frequency multiplication factor, and or in even further reduced jitter and/or phase noise of the output signal of the edge combiner circuit 980.

In some examples, the multiphase signal generator 300 can comprise a second phase interpolator. The output terminal 343 of the signal splitter 340 can then be connected to both a first and a second input terminal of the second phase interpolator. An output terminal of the second phase interpolator can be connected to the second clock input terminal 981-2 of the edge combiner circuit 980. Furthermore, a delay of the second phase interpolator may correspond to (e.g., be equal to) a delay of the first phase interpolator 350-1. To this end, the first and the second phase interpolator may comprise corresponding circuit schematics, for example. This can result in a more accurately set frequency multiplication factor, and or in even further reduced jitter and/or phase noise of the output signal of the edge combiner circuit 980.

Additionally, the second phase interpolator can be configured to weight a phase of a signal at its first input terminal with the same weighting factor as at its second input terminal.

Figure 10:
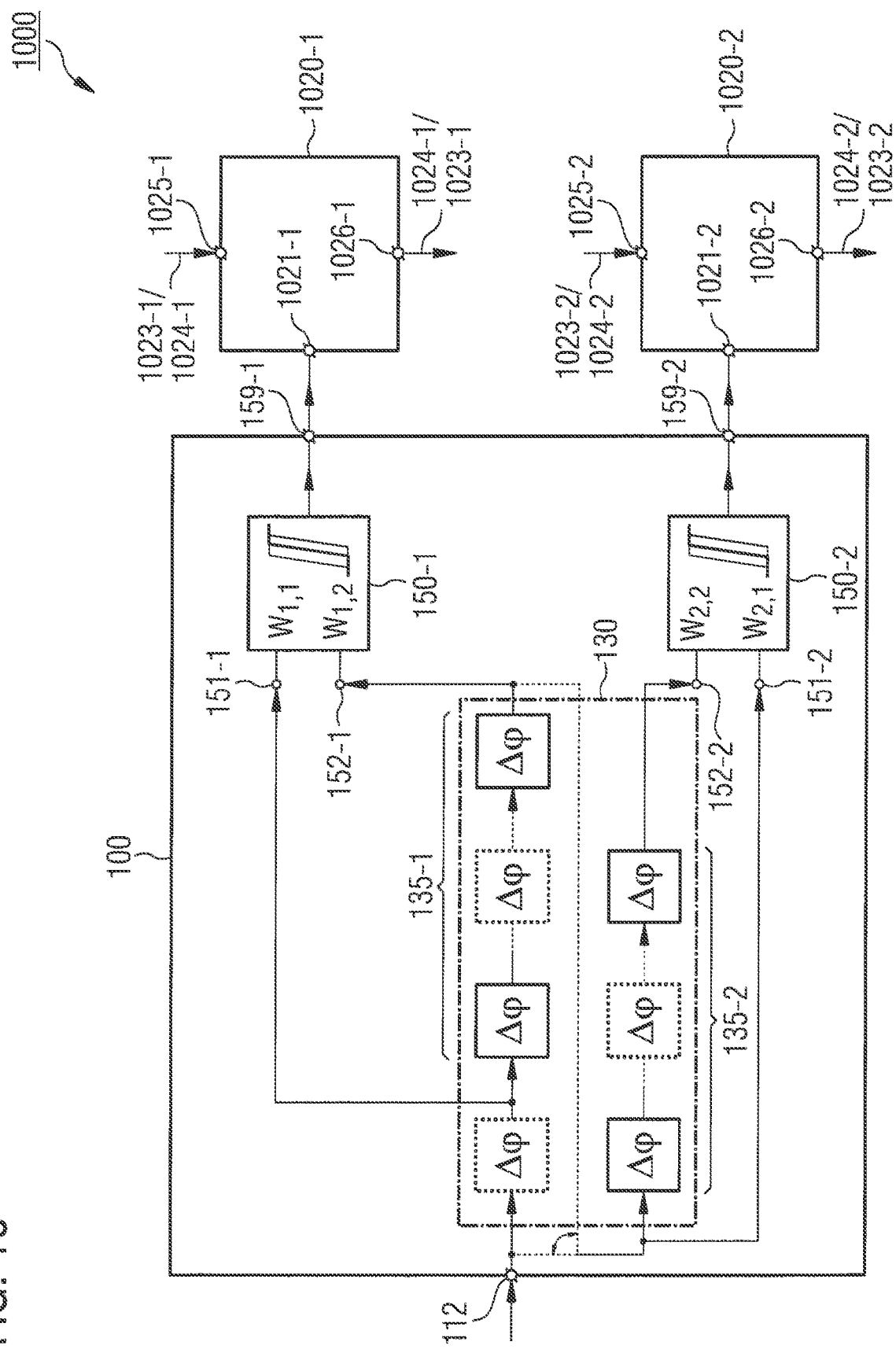
FIG. 10 shows a block diagram of a mixed signal circuit.

FIG. 10 shows a block diagram of a mixed signal circuit 1000 according to another aspect of the present disclosure. The mixed signal circuit 1000 comprises a multiphase signal generator 100. The multiphase signal generator 100 comprises an input port 112. Furthermore, the multiphase signal generator 100 comprises a plurality 130 of phase shifters. Each phase shifter of the plurality 130 of phase shifters is configured to provide an identical phase shift Δφ. At least one phase shifter is connected to the input port 112. Furthermore, the multiphase signal generator 100 comprises a first phase interpolator 150-1 and at least a second phase interpolator 150-2. Each phase interpolator 150-1, 150-2 has a respective output terminal 159-1, 159-2. Each phase interpolator 150-1, 150-2 is configured to weight a phase of a signal at a respective first input terminal 151-1, 151-2 of the phase interpolator 150-1, 150-2 with a respective first weighting factor $w_{i,1}$ and to weight a phase of another signal at a respective second input terminal 152-1, 152-2 of the phase interpolator 151-1, 151-2 with a respective second weighting factor $w_{i,2}$ to generate an interpolated phase signal at the respective output terminal 159-1, 159-2 of the phase interpolator 151-1, 151-2. A first subset 135-1 of the plurality 130 of phase shifters comprises n>1 serially connected phase shifters. The first subset 135-1 of phase shifters is coupled between the first input terminal 151-1 and the second input terminal 152-1 of the first phase interpolator

150-1. A different second subset 135-2 of the plurality 130 of phase shifters comprises n serially connected phase shifters. The second subset 135-2 of phase shifters is coupled between the first input terminal 151-2 and the second input terminal 152-2 of the second phase interpolator 150-2. Furthermore, the mixed signal circuit 1000 comprises a first converter subcircuit 1020-1 and at least a second converter subcircuit 1020-2. Each converter subcircuit 1020-1, 1020-2 is configured for at least one of converting a respective analog signal 1023-1, 1023-2 to a respective digital signal 1024-1, 1024-2 and converting a respective digital signal 1024-1, 1024-2 to a respective analog signal 1023-1, 1023-2. A clock input terminal 1021-1 of the first converter subcircuit 1020-1 is connected to the output terminal 159-1 of the first phase interpolator 150-1. A clock input terminal 1021-2 of the second converter subcircuit 1020-2 is connected to the output terminal 159-2 of the second phase interpolator 150-2.

The multiphase signal generator 100 of FIG. 10 may be similar to the multiphase signal generator 100 of FIG. 1 and may comprise one or more optional and/or additional features of the multiphase signal generator 100 of FIG. 1.

The first converter subcircuit 1020-1 can comprise an input terminal 1025-1 (different from its clock input terminal 1021-1) and an output terminal 1026-1. For example, the first converter subcircuit 1020-1 can be configured to sample a first analog signal 1023-1 applied at its input terminal 1025-1 at a frequency of a first clock signal provided by the first phase interpolator 150-1 and to provide a corresponding first digital signal 1024-1 at its output terminal 1026-1. The first clock signal may correspond to (e.g., be) an output signal provided by the first phase interpolator 150-1 at its output terminal 159-1. Alternatively, the first converter subcircuit 1020-1 can be configured to convert the first digital signal 1024-1, if applied at its input terminal 1025-1, at the frequency of the first clock signal and to provide the corresponding first analog signal 1023-1 at its output terminal 1026-1.

Accordingly, the second converter subcircuit 1020-2 can comprise an input terminal 1025-2 (different from its clock input terminal 1021-2) and an output terminal 1026-2. For example, the second converter subcircuit 1020-2 can be configured to sample a second analog signal 1023-2 applied at its input terminal 1025-2 at a frequency of a second clock signal provided by the second phase interpolator 150-2 and to provide a corresponding second digital signal 1024-2 at its output terminal 1026-2. The second clock signal may have the same frequency as the first clock signal and may correspond to (e.g., be) an output signal provided by the second phase interpolator 150-2 at its output terminal 159-2. Alternatively, the second converter subcircuit 1020-2 can be configured to convert the second digital signal 1024-2, if applied at its input terminal 1025-2, at the frequency of the second clock signal and to provide the corresponding second analog signal 1023-2 at its output terminal 1026-2.

For instance, each converter subcircuit of the mixed signal circuit 1000 can be an analog-to-digital converter, according to some examples. Alternatively, each converter subcircuit of the mixed signal circuit 1000 can be digital-to-analog converter.

Due to an accurately set phase difference of the first and the second clock signal provided by the multiphase signal generator 100, a high degree of synchronization of signal conversion (e.g., analog-to-digital and/or digital-to-analog conversion) of the first and the second converter subcircuit 1020-1, 1020-2 can be achieved. The first and the second converter subcircuit 1020-1, 1020-2 may convert analog signals to digital signals (or vice versa) at the same frequency (derived from a periodic input signal at the input port 112 of the multiphase signal generator 100), but take samples of their input signals with a fixed time offset as set by the phase difference of the first and the second clock signal.

According to an example, the input terminal 1025-1 of the first converter subcircuit 1020-1 and the input terminal 1025-2 of the second converter subcircuit 1020-2 are connected to the same analog signal (e.g., to the same wire). Furthermore, each converter subcircuit 1020-1, 1020-2 is configured to sample the analog signal upon a rising (or alternatively a falling) edge of its respective clock signal. Furthermore, the multiphase signal generator 100 is configured to provide a phase difference of 180° between the two clock signals of the first and the second converter subcircuit 1020-1, 1020-2. While each the frequency of the first clock signal and the frequency of the second clock signal correspond to a frequency of a signal (e.g., a common clock signal) applied to the input port 112 of the multiphase signal generator 100, the mixed signal circuit 1000 may convert the analog signal to a digital signal at double the frequency of the signal applied to the input port 112. For example, the first converter subcircuit 1020-1 may provide a first portion of the digital signal and the second converter subcircuit 1020-2 may provide a second portion of the digital signal. In other words, the first and the second converter subcircuit 1020-1, 1020-2 may alternately deliver samples of the analog signal.

Without leaving the scope of the present disclosure, the example illustrated above may also be transferred to the conversion of a digital signal into an analog signal at double (or a multiple) of the frequency of the signal applied at the input port 112 of the multiphase signal generator 100.

The mixed signal circuit 1000 can comprise a plurality of (n−1)≥2 converter subcircuits (e.g., at least two, or at least three, or at least four converter subcircuits, or even more). Moreover, the multiphase signal generator 100 can comprise a number of (n−1) phase interpolators. Moreover, the plurality 130 of phase shifters can comprise a number of (2n−2) serially connected phase shifters. For each phase interpolator a different subset of phase shifters comprising n serially connected phase shifters can be coupled between the first and the second input terminal of the respective phase interpolator. A respective output terminal of each phase interpolator can be connected to a respective clock input terminal of a different converter subcircuit. This way, a high degree of synchronization of two or more (e.g., three, four, five, six, seven or more) converter subcircuits for signal conversion can be achieved. Additionally, hardware effort of the multiphase signal generator 100 can be kept low due to the (2n−2) phase shifters being connected in series.

Optionally, the mixed signal circuit 1000 can additionally comprise an $n^{th}$ converter subcircuit. Moreover, the multiphase signal generator 100 can additionally comprise an $n^{th}$ phase interpolator. Both a first and a second input terminal of the $n^{th}$ phase interpolator can be connected to an output terminal of an $(n-C)^{th}$ phase shifter in a series connection of phase shifters counted from the input port 112 of the multiphase signal generator 100. An output terminal of the $n^{th}$ phase interpolator can be connected to a clock input terminal of the $n^{th}$ converter subcircuit. C can be a non-negative integer constant smaller than n.

Additionally, for each of the first to the (n−1)-th phase interpolator of the multiphase signal generator 100 a ratio of the first weighting factor $w_{i,1}$ to the second weighting factor $w_{i,2}$ of the respective phase interpolator (i=1, 2, . . . , n−1) can correspond to a sum of the non-negative integer constant C and a respective number of $l_i$ serially connected phase shifters coupled between the input port 112 and the first input terminal of the respective phase interpolator divided by $(n-l_i-C)$. In this way, clock signals of equally spaced phase difference may be provided by the multiphase signal generator 100 to the plurality of n converter subcircuits.

Figure 11:
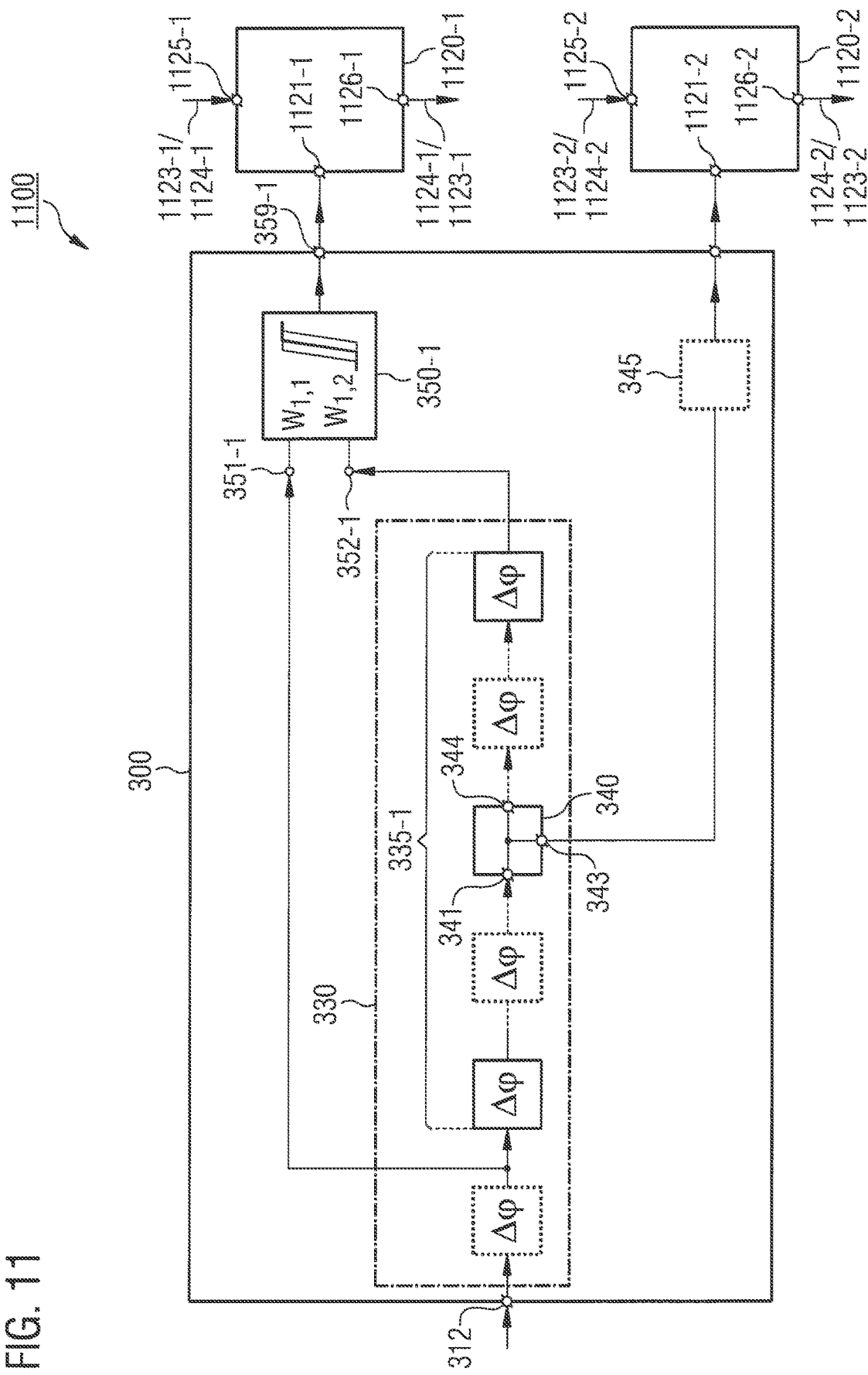
FIG. 11 shows a block diagram of another mixed signal circuit.

FIG. 11 shows a block diagram of another mixed signal circuit 1100 according to another aspect of the present disclosure. The mixed signal circuit 1100 comprises a multiphase signal generator 300. The multiphase signal generator 300 comprises an input port 312. Furthermore, the multiphase signal generator 300 comprises a plurality 330 of phase shifters. Each phase shifter is configured to provide an identical phase shift $\Delta\varphi$. At least one phase shifter is connected to the input port 312. Furthermore, the multiphase signal generator 300 comprises at least one phase interpolator 350-1. The phase interpolator 350-1 is configured to weight a phase of a signal at a first input terminal 351-1 of the phase interpolator 350-1 with a first weighting factor $w_{1,1}$ and to weight a phase of another signal at a second input terminal 352-1 of the phase interpolator 350-1 with a second weighting factor $w_{1,2}$ to generate an interpolated phase signal at an output terminal 359-1 of the phase interpolator 350-1. A subset 335-1 of the plurality of phase shifters comprises n>1 serially connected phase shifters. The subset 335-1 of the plurality 330 of phase shifters is coupled between the first input terminal 351-1 and the second input terminal 352-1 of the phase interpolator 350-1. Furthermore, the multiphase signal generator 300 comprises a signal splitter 340 coupled between two serially connected phase shifters of the plurality 330 of phase shifters. The signal splitter 340 is configured to provide an output signal of a phase shifter preceding the signal splitter at an output terminal 343 of the signal splitter 340. Furthermore, the mixed signal circuit 1100 comprises a first converter subcircuit 1120-1 and at least a second converter subcircuit 1120-2. Each converter subcircuit 1120-1, 1120-2 is configured for at least one of converting a respective analog signal 1123-1, 1123-2 to a respective digital signal 1124-1, 1124-2 and converting a respective digital signal 1124-1, 1124-2 to a respective analog signal 1123-1, 1123-2. A clock input terminal 1121-1 of the first converter subcircuit 1120-1 is connected to the output terminal 359-1 of the phase interpolator 350-1 of the multiphase signal generator 300. A clock input terminal 1121-2 of the second converter subcircuit 1120-2 is connected to the output terminal 343 of the signal splitter 340.

The multiphase signal generator 300 of the mixed signal circuit 1100 of FIG. 11 may be similar to the multiphase signal generator 300 of FIG. 3 and may comprise one or more optional and/or additional features of the multiphase signal generator 300 of FIG. 3.

The first converter subcircuit 1120-1 can comprise an input terminal 1125-1 (different from its clock input terminal 1121-1) and an output terminal 1126-1. For example, the first converter subcircuit 1120-1 can be configured to sample a first analog signal 1123-1 applied at its input terminal 1125-1 at a frequency of a first clock signal provided by the phase interpolator 350-1 and to provide a corresponding first digital signal 1124-1 at its output terminal 1126-1. The first clock signal may correspond to (e.g., be) an output signal provided by the phase interpolator 350-1 at its output terminal 359-1. Alternatively, the first converter subcircuit 1120-1 can be configured to convert the first digital signal 1124-1, if applied at its input terminal 1125-1, at the frequency of the first clock signal and to provide the corresponding first analog signal 1123-1 at its output terminal 1126-1.

Accordingly, the second converter subcircuit 1120-2 can comprise an input terminal 1125-2 (different from its clock input terminal 1121-2) and an output terminal 1126-2. For example, the second converter subcircuit 1120-2 can be configured to sample a second analog signal 1123-2 applied at its input terminal 1125-2 at a frequency of a second clock signal provided by the signal splitter 340 and to provide a corresponding second digital signal 1124-2 at its output terminal 1126-2. The second clock signal may have the same frequency as the first clock signal and may correspond to (e.g., be) an output signal provided by the signal splitter 340 at its output terminal 343. Alternatively, the second converter subcircuit 1120-2 can be configured to convert the second digital signal 1124-2, if applied at its input terminal 1125-2, at the frequency of the second clock signal and to provide the corresponding second analog signal 1123-2 at its output terminal 1126-2.

For instance, each converter subcircuit of the mixed signal circuit 1100 can be an analog-to-digital converter. Alternatively, each converter subcircuit of the mixed signal circuit 1000 can be digital-to-analog converter, according to some examples.

Due to an accurately set phase difference of the first and the second clock signal provided by the multiphase signal generator 300, a high degree of synchronization of signal conversion (e.g., analog-to-digital and/or digital-to-analog conversion) of the first and the second converter subcircuit 1120-1, 1120-2 can be achieved. The first and the second converter subcircuit 1120-1, 1120-2 may convert analog signals to digital signals (or vice versa) at the same frequency with respect to each other, but take samples of their input signals with a fixed time offset as set by the phase difference of the first and the second clock signal. In this way, as explained in context of FIG. 10, an analog-to-digital converter and/or a digital-to-analog converter of an increased sampling frequency (e.g., an increased conversion frequency) can be provided.

An optional delay circuit 345 (or an additional phase interpolator) of the multiphase signal generator 300 can be coupled between the output terminal 343 of the signal splitter 340 and the clock input terminal 1121-2 of the second converter subcircuit 1120-2. A delay of the delay circuit 345 (or of the additional phase interpolator) can correspond to (e.g., be equal to) a delay of the phase interpolator 350-1.

Figure 12:
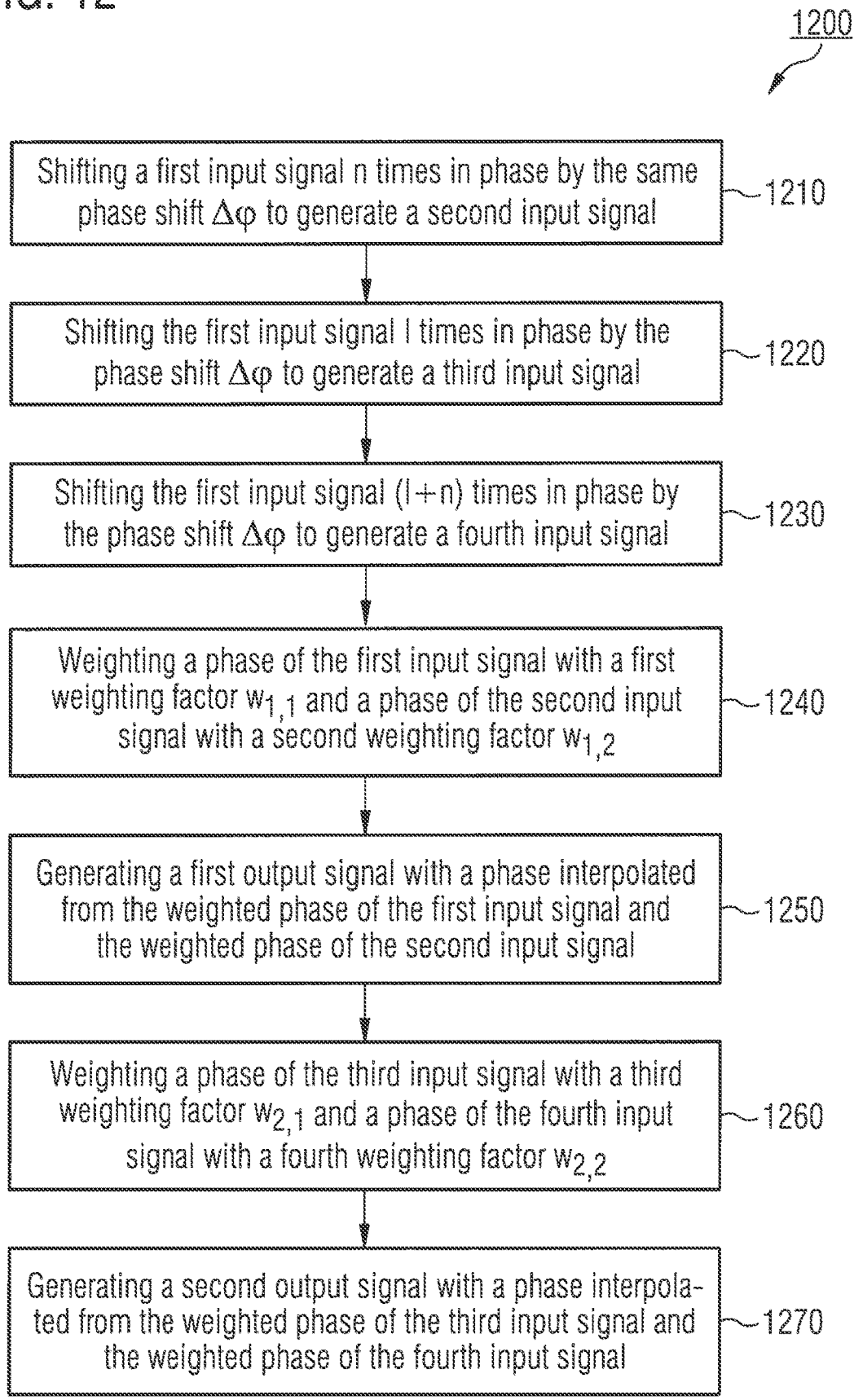
FIG. 12 shows a flow chart of a method for generating phase shifted signals.

FIG. 12 shows a flow chart of a method 1200 for generating phase shifted signals. The method 1200 comprises shifting 1210 a first input signal n times in phase by the same phase shift $\Delta\varphi$ to generate a second input signal. Furthermore, the method 1200 comprises shifting 1220 the first input signal l times in phase by the phase shift $\Delta\varphi$ to generate a third input signal. Furthermore, the method 1200 comprises shifting 1230 the first input signal (l+n) times in phase by the phase shift $\Delta\varphi$ to generate a fourth input signal. Furthermore, the method 1200 comprises weighting 1240 a phase of the first input signal with a first weighting factor $w_{1,1}$ and a phase of the second input signal with a second weighting factor $w_{1,2}$. A ratio $w_{1,1}/w_{1,2}$ of the first weighting factor to the second weighting factor corresponds to a constant C divided by (n−C). Furthermore, the method 1200 comprises generating 1250 a first output signal with a phase interpolated from the weighted phase of the first input signal and the weighted phase of the second input signal. Furthermore, the method 1200 comprises weighting 1260 a phase of the third input signal with a third weighting factor $w_{2,1}$ and a phase of the fourth input signal with a fourth weighting factor $w_{2,2}$. A ratio $w_{2,1}/w_{2,2}$ of the third weighting factor to the fourth weighting factor corresponds to $(C+l)/(n-l-C)$. Furthermore, the method 1200 comprises generating 1270 a second output signal with a phase interpolated from the weighted phase of the third input signal and the weighted phase of the fourth input signal.

The proposed method 1200 can generate a first output signal and a second output signal having a fixed phase difference with respect to each other, the phase difference being accurately set to a desired value. Accuracy can be achieved due to the same phase shift $\Delta\varphi$ and due to the second input signal being shifted by $n\cdot\Delta\varphi$ in phase with respect to the first input signal and due to the fourth input signal being also shifted by $n\cdot\Delta\varphi$ in phase with respect to the third input signal.

Generating 1250 the first output signal with a phase $\psi_1$ can comprise interpolating the weighted phase $w_{1,1}\cdot\varphi_1$ of the first input signal ($\varphi_1$ being the phase of the first input signal) and the weighted phase $w_{1,2}\cdot\varphi_2$ of the second input signal ($\varphi_2$ being the phase of the second input signal) according to Equation 10.1:

$$\psi_1 = \frac{1}{w_{1,1}+w_{1,2}}(w_{1,1}\cdot\varphi_1 + w_{1,2}\cdot\varphi_2).$$

Since the second input signal is generated by shifting the first input signal n times by the same phase shift $\Delta\varphi$, the phase $\varphi_2$ of the second input signal can be calculated according to Equation 10.2:

$$\varphi_2 = \varphi_1 + n\cdot\Delta\varphi.$$

Generating 1270 the second output signal with a phase $\psi_2$ can comprise interpolating the weighted phase $w_{2,1}\cdot\varphi_3$ of the third input signal ($\varphi_3$ being the phase of the third input signal) and the weighted phase $w_{2,2}\cdot\varphi_4$ of the fourth input signal ($\varphi_4$ being the phase of the fourth input signal) according to Equation 10.3:

$$\psi_2 = \frac{1}{w_{2,1}+w_{2,2}}(w_{2,1}\cdot\varphi_3 + w_{2,2}\cdot\varphi_4).$$

Since the third input signal is generated by shifting the first input signal l times in phase by the same phase shift $\Delta\varphi$, the phase $\varphi_3$ of the third input signal can be calculated according to Equation 10.4:

$$\varphi_3 = \varphi_1 + l\cdot\Delta\varphi.$$

Since the fourth input signal is generated by shifting the first input signal (l+n) times in phase by the same phase shift $\Delta\varphi$, the phase $\varphi_4$ of the fourth input signal can be calculated according to Equation 10.5:

$$\varphi_4 = \varphi_1 + (l+n)\cdot\Delta\varphi.$$

The second input signal can be shifted by 360° in phase within a predefined tolerance range with respect to the first input signal. That is to say, $n\cdot\Delta\varphi$ can be (e.g., equal) 360° within the predefined tolerance range. Additionally, the fourth input signal can be shifted by 360° in phase within the predefined tolerance range with respect to the third input signal.

Optionally, the predefined tolerance range can be at most as large as a minimal linear interpolation range of respective phase interpolators employed for generating the first and the second output signal. The minimal linear interpolation range of the respective phase interpolators may correspond to the smallest linear interpolation range of the phase interpolators employed for generating the first and the second output signal.

The first input signal may be a periodic signal. When interpolating the first input signal with the second input signal, the second input signal may be interpolated with a next period (or next pulse) of the first input signal, because the second input signal may be delayed with respect to the first input signal due to being shifted $n\cdot\Delta\varphi$ in phase with respect to the first input signal. Likewise, when interpolating the third input signal with the fourth input signal, the fourth input signal may be interpolated with a next period (or next pulse) of the third input signal, because the fourth input signal may be delayed with respect to the third input signal due to being shifted $n\cdot\Delta\varphi$ in phase with respect to the third input signal. Consequently Equation 10.1 and 10.3 can be reformulated into Equation 10.6:

$$\psi_1 = \frac{1}{w_{1,1}+w_{1,2}}(w_{1,1}\cdot(\varphi_1+360°) + w_{1,2}\cdot\varphi_2),$$

and Equation 10.7:

$$\psi_2 = \frac{1}{w_{2,1}+w_{2,2}}(w_{2,1}\cdot(\varphi_3+360°) + w_{2,2}\cdot\varphi_2).$$

By substituting Equation 10.2 and the ratio $w_{1,1}/w_{1,2}$ into Equation 10.1, the phase $\psi_1$ of the first output signal can be expressed by Equation 10.8:

$$\psi_1 = \varphi_1 + \frac{C}{n}360° + (n-C)\Delta\varphi.$$

By substituting Equation 10.4 and 10.5 and the ratio $w_{2,1}/w_{2,2}$ into Equation 10.3, the phase $\psi_2$ of the second output signal can be expressed by Equation 10.9:

$$\psi_2 = \varphi_1 + \frac{C+l}{n}360° + (n-C)\Delta\varphi.$$

A phase relationship $\Delta\psi_{21}$ (e.g., a phase difference) between the first and the second output signal can then be expressed by Equation 10.10:

$$\Delta\psi_{21} = \psi_2 - \psi_1 = \frac{l}{n}360°.$$

The above considerations and/or Equation 10.10 show that the phase relationship $\Delta\psi_{21}$ between the first and the second output signal can be independent of the (common) phase shift $\Delta\varphi$ applied for generating the second, third, and fourth input signal. As long as the phase shift $\Delta\varphi$ is identical when applying it multiple times to generate the second, third, and fourth input signal, the phase shift $\Delta\varphi$ can cancel in Equation 10.10 and the phase relationship $\Delta\psi_{21}$ can be accurately set to a desired value by the choice of l and n.

At least one of C, n, and l can be a non-negative integer. According to an example, C is a non-negative integer, n is non-negative integer and l is non-negative integer. This can facilitate an implementation of the method 1200.

According to some examples, (n–l–C) is equal or larger than zero (or equal or larger than one).

For example, n may be equal to two or larger than two. l may be equal to one or larger than one. Additionally, l may be smaller than n. Additionally, C may be set such that (n–l–C) is equal to zero or larger than zero (or equal to one or larger than one).

Of course, method 1200 can be extended to the generation of more than two output signals having fixed phase relationships (e.g., equally space phase differences) with respect to each other. For example, additional output signals may be generated from weighted interpolation of additional input signals that are shifted n·Δφ in phase with respect to each other. Additional and/or optional features described in the context of FIGS. 1-11 may optionally be added to the method 1200.

The following examples pertain to further embodiments.

Example 1 is a multiphase signal generator which comprises an input port, a plurality of phase shifters, wherein each phase shifter is configured to provide an identical phase shift, wherein at least one phase shifter is connected to the input port, and a first and at least a second phase interpolator having respective output terminals. Each phase interpolator is configured to weight a phase of a signal at a respective first input terminal of the phase interpolator with a respective first weighting factor $w_{i,1}$ and to weight a phase of another signal at a respective second input terminal of the phase interpolator with a respective second weighting factor $w_{i,2}$ to generate an interpolated phase signal at its respective output terminal. A first subset of the plurality of phase shifters comprises n>1 serially connected phase shifters and is coupled between the first and the second input terminal of the first phase interpolator, wherein a different second subset of the plurality of phase shifters comprises n serially connected phase shifters and is coupled between the first and the second input terminal of the second phase interpolator.

In Example 2, for each phase interpolator a ratio of the first weighting factor $w_{i,1}$ to the second weighting factor $w_{i,2}$ of the respective phase interpolator can correspond to a sum of a non-negative integer constant C and a respective number of $l_i$ serially connected phase shifters coupled between the input port and the first input terminal of the respective phase interpolator divided by (n–$l_i$–C).

In Example 3, for each phase interpolator a different number $l_i$ of serially connected phase shifters can be coupled between the input port and the first input terminal of the respective phase interpolator.

In Example 4, for each phase interpolator a number of ($l_i$+n) serially connected phase shifters can be coupled between the input port and the second input terminal of the respective phase interpolator.

In Example 5, the non-negative integer constant of Example 2 can be equal to one.

In Example 6, the first and the second weighting factor of both the first and the second phase interpolator of any one of the previous Examples can be non-negative.

In Example 7, the first and the second subset of phase shifters of any one of the previous Examples can be connected in series.

In Example 8, the first and the second subset of phase shifters of any one of the previous Examples can comprise at least one common phase shifter.

In Example 9, the first and the second subset of the plurality of phase shifters of any one of the previous Examples can each be configured to provide a phase shift of 360° within a predefined tolerance range.

In Example 10, the predefined tolerance range of any one of the previous Examples can at most be as large as a minimal linear interpolation range of the first and the second phase interpolator.

In Example 11, the phase shifters of any one of the previous Examples can have corresponding circuit schematics.

In Example 12, the input port of the multiphase signal generator of any one of the previous Examples can be configured to receive a periodic signal.

In Example 13, each phase interpolator of any one of the previous Examples can comprise an additional respective third input terminal and an additional respective fourth input terminal. Each phase interpolator can be configured to generate the interpolated phase signal at its respective output terminal by additionally weighting a phase of a signal at its respective third input terminal with a respective third weighting factor $w_{i,3}$ and by additionally weighting a phase of a signal at its respective fourth input terminal with a respective fourth weighting factor $w_{i,4}$. A different third subset of the plurality of phase shifters can comprise n serially connected phase shifters and can be coupled between the third and the fourth input terminal of the first phase interpolator. A different fourth subset of the plurality of phase shifters can comprise n serially connected phase shifters and can be coupled between the third and the fourth input terminal of the second phase interpolator.

In Example 14, the multiphase signal generator of any one of the previous Examples can further optionally comprise a signal splitter coupled between two phase shifters. An input terminal of the signal splitter can be connected to an output terminal of a phase shifter preceding the signal splitter. A first output terminal of the signal splitter can be connected to an input terminal of another phase shifter succeeding the preceding phase shifter. A second output terminal of the signal splitter can be coupled to an output port of the multiphase signal generator.

In Example 15, the phase shifter preceding the signal splitter of Example 14 can be an $(n-C)^{th}$ phase shifter of the plurality of phase shifters counted from the input port.

In Example 16, the multiphase signal generator of any one of Examples 14 or 15 can further optionally comprise a delay circuit coupled between the second output terminal of the signal splitter and the output port. A delay of the delay circuit can correspond to a delay of at least one of the first and the second phase interpolator.

In Example 17, the multiphase signal generator of any one of Examples 14 to 16 can further optionally comprise a third phase interpolator coupled between the signal splitter and the output port. The second output terminal of the signal splitter can be connected to both a first and a second input terminal of the third phase interpolator. An output terminal of the third phase interpolator can be connected to the output port.

In Example 18, the multiphase signal generator of any one of the previous Examples can further optionally comprise a plurality of signal splitters. For each respective subset of phase shifters that is coupled between the first and the second input terminal of a respective phase interpolator, a respective signal splitter can be configured to provide an input signal of a first phase shifter of the respective subset of phase shifters to the first input terminal of the respective phase interpolator.

In Example 19, for at least one subset of phase shifters that is coupled between the first and the second input terminal of a respective phase interpolator, another respective signal splitter of the plurality of signal splitters can be configured to provide an output signal of a last phase shifter of the respective subset of phase shifters to the second input terminal of the respective phase interpolator.

In Example 20, the multiphase signal generator of any one of the previous Examples can comprise a number of (n−1) phase interpolators, wherein n>2. The plurality of phase shifters can comprise a number of (2n−2) phase shifters. For each phase interpolator a different subset of phase shifters comprising n phase shifters can be coupled between the first and the second input terminal of the respective phase interpolator.

In Example 21, the multiphase signal generator of Example 20 can further optionally comprise an $n^{th}$ phase interpolator, wherein both the first and the second input terminal of the $n^{th}$ phase interpolator can be connected to an output terminal of an $(n-C)^{th}$ phase shifter in a series connection of phase shifters counted from the input port.

Example 22 is a multiphase signal generator comprising an input port, a plurality of phase shifters, wherein each phase shifter is configured to provide an identical phase shift, wherein at least one phase shifter is connected to the input port, a phase interpolator configured to weight a phase of a signal at a first input terminal of the phase interpolator with a first weighting factor $w_{1,1}$ and to weight a phase of another signal at a second input terminal of the phase interpolator with a second weighting factor $w_{1,2}$ to generate an interpolated phase signal at an output terminal of the phase interpolator, wherein a subset of the plurality of phase shifters comprises n>1 serially connected phase shifters and is coupled between the first and the second input terminal of the phase interpolator, and a signal splitter coupled between two serially connected phase shifters and configured to provide an output signal of a phase shifter preceding the signal splitter at an output terminal of the signal splitter.

In Example 23, the multiphase signal generator of Example 22 can further optionally comprise a first and a second output port, wherein the first output port is connected to the output terminal of the phase interpolator, wherein the second output port is connected to the output terminal of the signal splitter.

In Example 24, a ratio of the first weighting factor $w_{1,1}$ to the second weighting factor $w_{1,2}$ of the phase interpolator can correspond to a sum of a non-negative integer constant C and a number $l_i$ of phase shifters coupled between the input port and the first input terminal of the phase interpolator divided by $(n-l_1-C)$. The phase shifter preceding the signal splitter can be an $(n-C)^{th}$ phase shifter in a series connection of phase shifters counted from the input port.

In Example 25, the multiphase signal generator of any one of Examples 23 or 24 can further optionally comprise a delay circuit coupled between the output terminal of the signal splitter and the second output port. A delay of the delay circuit can correspond to a delay of the phase interpolator.

In Example 26, the multiphase signal generator of any one of Examples 22 to 25 can further optionally comprise a second phase interpolator, wherein the output terminal of the signal splitter is connected to both a first and a second input terminal of the second phase interpolator.

In Example 27, the second phase interpolator of Example 26 can be configured to weight a phase of a signal at its first input terminal with the same weighting factor as applied by the second phase interpolator for weighting the phase of the signal at its second input terminal to generate a signal at an output terminal of the second phase interpolator.

Example 28 is a frequency multiplier comprising a multiphase signal generator of any one of the Examples 1 to 21. The frequency multiplier also comprises an edge combiner circuit, wherein a first clock input terminal of the edge combiner circuit is connected to the output terminal of the first phase interpolator of the multiphase signal generator. A second clock input terminal of the edge combiner circuit is connected to the output terminal of the second phase interpolator of the multiphase signal generator. An output terminal of the edge combiner circuit corresponds to an output port of the frequency multiplier.

In Example 29, the edge combiner circuit of Example 28 can be configured to transfer a signal from an input terminal of the edge combiner circuit to the output terminal of the edge combiner circuit if a signal level at at least one of the first and the second clock input terminal changes by more than a predefined threshold.

In Example 30, the edge combiner circuit of Example 28 can further optionally comprise an inverter circuit, wherein an input terminal of the inverter circuit is connected to the output terminal of the edge combiner circuit, wherein an output terminal of the inverter circuit is connected to the input terminal of the edge combiner circuit.

Example 31 is a frequency multiplier comprising a multiphase signal generator of any one of the Examples 22 to 27. The frequency multiplier also comprises an edge combiner circuit, wherein a first clock input terminal of the edge combiner circuit is connected to the output terminal of the phase interpolator of the multiphase signal generator, wherein a second clock input terminal of the edge combiner circuit is connected to the output terminal of the signal splitter of the multiphase signal generator, wherein an output terminal of the edge combiner circuit corresponds to an output port of the frequency multiplier.

Example 32 is a mixed signal circuit comprising a multiphase signal generator of any one of the Examples 1 to 21. The mixed signal circuit also comprises a first and at least a second converter subcircuit, wherein each converter subcircuit is configured for at least one of converting a respective analog signal to a respective digital signal and converting a respective digital signal to a respective analog signal, wherein a clock input terminal of the first converter subcircuit is connected to the output terminal of the first phase interpolator, wherein a clock input terminal of the second converter subcircuit is connected to the output terminal of the second phase interpolator.

In Example 33, the mixed signal circuit of Example 32 can comprise a plurality of (n−1)≥2 converter subcircuits, wherein the multiphase signal generator comprises a number of (n−1) phase interpolators, wherein the plurality of phase shifters comprises a number of (2n−2) serially connected phase shifters, wherein for each phase interpolator a different subset of phase shifters comprising n serially connected phase shifters is coupled between the first and the second input terminal of the respective phase interpolator, wherein a respective output terminal of each phase interpolator is connected to a respective clock input terminal of a different converter subcircuit.

In Example 34, the mixed signal circuit of Example 33 can further comprise an $n^{th}$ converter subcircuit, wherein the multiphase signal generator comprises an $n^{th}$ phase interpolator, wherein both a first and a second input terminal of the $n^{th}$ phase interpolator are connected to an output terminal of an $(n-C)^{th}$ phase shifter in a series connection of phase shifters counted from the input port of the multiphase signal generator, wherein an output terminal of the $n^{th}$ phase interpolator is connected to a clock input terminal of the $n^{th}$ converter subcircuit, wherein C is a non-negative integer constant smaller than n.

In Example 35, each converter subcircuit of Examples 32 to 34 can be an analog-to-digital converter.

In Example 36, each converter subcircuit of Examples 32 to 34 can be a digital-to-analog converter.

Example 37 is a mixed signal circuit comprising a multiphase signal generator of any one of the Examples 22 to 27. The mixed signal circuit further comprises a first and at least a second converter subcircuit, wherein each converter subcircuit is configured for at least one of converting a respective analog signal to a respective digital signal and converting a respective digital signal to a respective analog signal, wherein a clock input terminal of the first converter subcircuit is connected to the output terminal of the phase interpolator, wherein a clock input terminal of the second converter subcircuit is connected to the output terminal of the signal splitter.

Example 38 is a method for generating phase shifted signals. The method includes shifting a first input signal n times in phase by the same phase shift $\Delta\varphi$ to generate a second input signal, l times in phase by the phase shift $\Delta\varphi$ to generate a third input signal, and (l+n) times in phase by the phase shift $\Delta\varphi$ to generate a fourth input signal, weighting a phase of the first input signal with a first weighting factor $w_{1,1}$ and a phase of the second input signal with a second weighting factor $w_{1,2}$, wherein a ratio $w_{1,1}/w_{1,2}$ corresponds to a constant C divided by (n−C), generating a first output signal with a phase interpolated from the weighted phase of the first input signal and the weighted phase of the second input signal, weighting a phase of the third input signal with a third weighting factor $w_{2,1}$ and a phase of the fourth input signal with a fourth weighting factor $w_{2,2}$, wherein a ratio $w_{2,1}/w_{2,2}$ corresponds to (C+l)/(n−l−C), and generating a second output signal with a phase interpolated from the weighted phase of the third input signal and the weighted phase of the fourth input signal.

In Example 39, the second input signal can be shifted by 360° in phase within a predefined tolerance range with respect to the first input signal.

In Example 40, the predefined tolerance range of Example 39 can be at most as large as a minimal linear interpolation range of respective phase interpolators employed for generating the first and the second output signal.

In Example 41, at least one of C, n, and l is a non-negative integer.

In Example 42, the expression (n−l−C) is equal to zero or larger than zero.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively.

Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A multiphase signal generator, comprising:
an input port;
a plurality of phase shifters, wherein each phase shifter is configured to provide an identical phase shift, wherein at least one phase shifter is connected to the input port; and
a first and at least a second phase interpolator having respective output terminals,
wherein each phase interpolator is configured to weight a phase of a signal at a respective first input terminal of the phase interpolator with a respective first weighting factor $w_{i,1}$ and to weight a phase of another signal at a respective second input terminal of the phase interpolator with a respective second weighting factor $w_{i,2}$ to generate an interpolated phase signal at its respective output terminal,
wherein a first subset of the plurality of phase shifters comprises n>1 serially connected phase shifters and is coupled between the first and the second input terminal of the first phase interpolator, wherein a different second subset of the plurality of phase shifters comprises n serially connected phase shifters and is coupled between the first and the second input terminal of the second phase interpolator;
wherein for each phase interpolator a ratio of the first weighting factor $w_{i,1}$ to the second weighting factor $w_{i,2}$ of the respective phase interpolator corresponds to a sum of a non-negative integer constant C and a respective number of $l_i$ serially connected phase shifters coupled between the input port and the first input terminal of the respective phase interpolator divided by $(n-l_i-C)$.

2. The multiphase signal generator of claim 1, wherein for each phase interpolator a different number $l_i$ of serially connected phase shifters are coupled between the input port and the first input terminal of the respective phase interpolator.

3. The multiphase signal generator of claim 1, wherein the non-negative integer constant is equal to one.

4. A multiphase signal generator, comprising:
an input port;
a plurality of phase shifters, wherein each phase shifter is configured to provide an identical phase shift, wherein at least one phase shifter is connected to the input port; and
a first and at least a second phase interpolator having respective output terminals,
wherein each phase interpolator is configured to weight a phase of a signal at a respective first input terminal of the phase interpolator with a respective first weighting factor $w_{i,1}$ and to weight a phase of another signal at a respective second input terminal of the phase interpolator with a respective second weighting factor $w_{i,2}$ to generate an interpolated phase signal at its respective output terminal,
wherein a first subset of the plurality of phase shifters comprises n>1 serially connected phase shifters and is coupled between the first and the second input terminal of the first phase interpolator, wherein a different second subset of the plurality of phase shifters comprises n serially connected phase shifters and is coupled between the first and the second input terminal of the second phase interpolator;
wherein the first and the second subset of phase shifters are connected in series.

5. A multiphase signal generator, comprising:
an input port;
a plurality of phase shifters, wherein each phase shifter is configured to provide an identical phase shift, wherein at least one phase shifter is connected to the input port; and
a first and at least a second phase interpolator having respective output terminals,
wherein each phase interpolator is configured to weight a phase of a signal at a respective first input terminal of the phase interpolator with a respective first weighting factor $w_{i,1}$ and to weight a phase of another signal at a respective second input terminal of the phase interpolator with a respective second weighting factor $w_{i,2}$ to generate an interpolated phase signal at its respective output terminal,
wherein a first subset of the plurality of phase shifters comprises n>1 serially connected phase shifters and is coupled between the first and the second input terminal of the first phase interpolator, wherein a different second subset of the plurality of phase shifters comprises n serially connected phase shifters and is coupled between the first and the second input terminal of the second phase interpolator;
wherein the first and the second subset of phase shifters comprise at least one common phase shifter.

6. A multiphase signal generator, comprising:
an input port;
a plurality of phase shifters, wherein each phase shifter is configured to provide an identical phase shift, wherein at least one phase shifter is connected to the input port; and
a first and at least a second phase interpolator having respective output terminals,
wherein each phase interpolator is configured to weight a phase of a signal at a respective first input terminal of the phase interpolator with a respective first weighting factor $w_{i,1}$ and to weight a phase of another signal at a respective second input terminal of the phase interpolator with a respective second weighting factor $w_{i,2}$ to generate an interpolated phase signal at its respective output terminal,
wherein a first subset of the plurality of phase shifters comprises n>1 serially connected phase shifters and is coupled between the first and the second input terminal of the first phase interpolator, wherein a different second subset of the plurality of phase shifters comprises n serially connected phase shifters and is coupled between the first and the second input terminal of the second phase interpolator;

wherein the first and the second subset of the plurality of phase shifters are each configured to provide a phase shift of 360° within a predefined tolerance range.

7. The multiphase signal generator of claim 6, wherein the predefined tolerance range is at most as large as a minimal linear interpolation range of the first and the second phase interpolator.

8. The multiphase signal generator of claim 1, wherein the phase shifters have corresponding circuit schematics.

9. The multiphase signal generator of claim 1, further comprising a signal splitter coupled between two phase shifters, wherein an input terminal of the signal splitter is connected to an output terminal of a phase shifter preceding the signal splitter, wherein a first output terminal of the signal splitter is connected to an input terminal of another phase shifter succeeding the preceding phase shifter, wherein a second output terminal of the signal splitter is coupled to an output port of the multiphase signal generator.

10. The multiphase signal generator of claim 9, wherein the phase shifter preceding the signal splitter is an $(n-C)^{th}$ phase shifter of the plurality of phase shifters counted from the input port.

11. The multiphase signal generator of claim 9, further comprising a delay circuit coupled between the second output terminal of the signal splitter and the output port, wherein a delay of the delay circuit corresponds to a delay of at least one of the first and the second phase interpolator.

12. The multiphase signal generator of claim 9, further comprising a third phase interpolator coupled between the signal splitter and the output port, wherein the second output terminal of the signal splitter is connected to both a first and a second input terminal of the third phase interpolator, wherein an output terminal of the third phase interpolator is connected to the output port.

13. The multiphase signal generator of claim 1, comprising a number of (n−1) phase interpolators, wherein n>2, wherein the plurality of phase shifters comprises a number of (2n−2) phase shifters, wherein for each phase interpolator a different subset of phase shifters comprising n phase shifters is coupled between the first and the second input terminal of the respective phase interpolator.

14. The multiphase signal generator of claim 13, further comprising an $n^{th}$ phase interpolator, wherein both the first and the second input terminal of the $n^{th}$ phase interpolator are connected to an output terminal of an $(n-C)^{th}$ phase shifter in a series connection of phase shifters counted from the input port.

15. A multiphase signal generator, comprising:
an input port;
a plurality of phase shifters, wherein each phase shifter is configured to provide an identical phase shift, wherein at least one phase shifter is connected to the input port;
a phase interpolator configured to weight a phase of a signal at a first input terminal of the phase interpolator with a first weighting factor $w_{1,1}$ and to weight a phase of another signal at a second input terminal of the phase interpolator with a second weighting factor $w_{1,2}$ to generate an interpolated phase signal at an output terminal of the phase interpolator, wherein a subset of the plurality of phase shifters comprises n>1 serially connected phase shifters and is coupled between the first and the second input terminal of the phase interpolator; and
a signal splitter coupled between two serially connected phase shifters and configured to provide an output signal of a phase shifter preceding the signal splitter at an output terminal of the signal splitter.

16. The multiphase signal generator of claim 15, further comprising a first and a second output port, wherein the first output port is connected to the output terminal of the phase interpolator, wherein the second output port is connected to the output terminal of the signal splitter.

17. The multiphase signal generator of claim 15, wherein a ratio of the first weighting factor $w_{1,1}$ to the second weighting factor $w_{1,2}$ of the phase interpolator corresponds to a sum of a non-negative integer constant C and a number $l_1$ of phase shifters coupled between the input port and the first input terminal of the phase interpolator divided by $(n-l_1-C)$,
wherein the phase shifter preceding the signal splitter is an $(n-C)^{th}$ phase shifter in a series connection of phase shifters counted from the input port.

18. The multiphase signal generator of claim 15, further comprising a second phase interpolator, wherein the output terminal of the signal splitter is connected to both a first and a second input terminal of the second phase interpolator.

19. A frequency multiplier, comprising:
a multiphase signal generator comprising
an input port,
a plurality of phase shifters, wherein each phase shifter is configured to provide an identical phase shift, wherein at least one phase shifter is connected to the input port, and
a first and at least a second phase interpolator having respective output terminals,
wherein each phase interpolator is configured to weight a phase of a signal at a respective first input terminal of the phase interpolator with a respective first weighting factor $w_{i,1}$ and to weight a phase of another signal at a respective second input terminal of the phase interpolator with a respective second weighting factor $w_{i,2}$ to generate an interpolated phase signal at its respective output terminal,
wherein a first subset of the plurality of phase shifters comprises n>1 serially connected phase shifters and is coupled between the first and the second input terminal of the first phase interpolator, wherein a different second subset of the plurality of phase shifters comprises n serially connected phase shifters and is coupled between the first and the second input terminal of the second phase interpolator; and
an edge combiner circuit, wherein a first clock input terminal of the edge combiner circuit is connected to the output terminal of the first phase interpolator of the multiphase signal generator, wherein a second clock input terminal of the edge combiner circuit is connected to the output terminal of the second phase interpolator of the multiphase signal generator, wherein an output terminal of the edge combiner circuit corresponds to an output port of the frequency multiplier.

20. The frequency multiplier of claim 19, wherein the edge combiner circuit is configured to transfer a signal from an input terminal of the edge combiner circuit to the output terminal of the edge combiner circuit if a signal level at an least one of the first and the second clock input terminal changes by more than a predefined threshold.

21. The frequency multiplier of claim 20, further comprising an inverter circuit, wherein an input terminal of the inverter circuit is connected to the output terminal of the edge combiner circuit, wherein an output terminal of the inverter circuit is connected to the input terminal of the edge combiner circuit.

22. A method for generating phase shifted signals, the method comprising:

shifting a first input signal n times in phase by the same phase shift $\Delta\varphi$ to generate a second input signal, l times in phase by the phase shift $\Delta\varphi$ to generate a third input signal, and (l+n) times in phase by the phase shift $\Delta\varphi$ to generate a fourth input signal;

weighting a phase of the first input signal with a first weighting factor $w_{1,1}$ and a phase of the second input signal with a second weighting factor $w_{1,2}$, wherein a ratio $w_{1,1}/w_{1,2}$ corresponds to a constant C divided by (n−C);

generating a first output signal with a phase interpolated from the weighted phase of the first input signal and the weighted phase of the second input signal;

weighting a phase of the third input signal with a third weighting factor $w_{2,1}$ and a phase of the fourth input signal with a fourth weighting factor $w_{2,2}$, wherein a ratio $w_{2,1}/w_{2,2}$ corresponds to (C+l)/(n−l−C); and generating a second output signal with a phase interpolated from the weighted phase of the third input signal and the weighted phase of the fourth input signal.

23. The method of claim 22, wherein the second input signal is shifted by 360° in phase within a predefined tolerance range with respect to the first input signal.

24. The method of claim 23, wherein (n−l−C) is equal to zero or larger than zero.

\* \* \* \* \*